US010672472B2

(12) United States Patent
Terada

(10) Patent No.: US 10,672,472 B2
(45) Date of Patent: Jun. 2, 2020

(54) MEMORY CONTROLLER AND MEMORY SYSTEM FOR SUPPRESSION OF FLUCTUATION OF VOLTAGE DROP

(71) Applicant: SONY CORPORATION, Tokyo (JP)

(72) Inventor: Haruhiko Terada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/072,789

(22) PCT Filed: Dec. 1, 2016

(86) PCT No.: PCT/JP2016/085739
§ 371 (c)(1),
(2) Date: Jul. 25, 2018

(87) PCT Pub. No.: WO2017/138234
PCT Pub. Date: Aug. 17, 2017

(65) Prior Publication Data
US 2019/0035460 A1  Jan. 31, 2019

(30) Foreign Application Priority Data
Feb. 8, 2016  (JP) ................................. 2016-021812

(51) Int. Cl.
*G11C 13/00* (2006.01)
*G11C 7/24* (2006.01)
(Continued)

(52) U.S. Cl.
CPC ............ *G11C 13/0069* (2013.01); *G11C 7/20* (2013.01); *G11C 7/24* (2013.01); *G11C 13/004* (2013.01);
(Continued)

(58) Field of Classification Search
CPC .............. G11C 13/0069; G11C 13/004; G11C 13/0004; G11C 11/56; G11C 2213/70; G11C 2213/77
See application file for complete search history.

(56) References Cited

U.S. PATENT DOCUMENTS 9,711,237 B2 * 7/2017 Chung ................. G11C 29/027
2007/0133269 A1 * 6/2007 Lee ..................... G11C 11/5678
365/163
(Continued)

FOREIGN PATENT DOCUMENTS

JP  2007-164971 A  6/2007
JP  2007-226884 A  9/2007
(Continued)

OTHER PUBLICATIONS

International Search Report and Written Opinion of PCT Application No. PCT/JP2016/085739, dated Jan. 10, 2017, 12 pages of ISRWO.

*Primary Examiner* — David Lam
(74) *Attorney, Agent, or Firm* — Chip Law Group

(57) ABSTRACT

Provided is an initialization control unit that causes a resistance value of a variable resistive element in an access restriction region to be changed to an initial value larger than a predetermined value. The resistance value is changed in a read only mode among the read only mode in which writing to the access restriction region is prohibited and a writable mode in which the writing to the access restriction region is permitted. The access restriction region is in a memory cell array in which the variable resistive elements are arranged, and the initialization control unit transitions to the writable mode. In addition, a write control unit causes a resistance value of an element corresponding to write data among the variable resistive elements in the access restriction region to (Continued)

be changed to a value smaller than the initial value in the writable mode, and transitions to the read only mode.

20 Claims, 48 Drawing Sheets

(51) Int. Cl.
*G11C 17/14* (2006.01)
*G11C 7/20* (2006.01)
*G11C 11/56* (2006.01)

(52) U.S. Cl.
CPC ...... *G11C 13/0026* (2013.01); *G11C 13/0028* (2013.01); *G11C 17/14* (2013.01); *G11C 11/56* (2013.01); *G11C 2213/70* (2013.01); *G11C 2213/72* (2013.01); *G11C 2213/77* (2013.01)

(56) References Cited

U.S. PATENT DOCUMENTS

2007/0195590 A1* 8/2007 Sugita ................ G11C 13/0007
   365/163
2013/0282993 A1* 10/2013 Nakanishi ............. G06F 9/3004
   711/155

FOREIGN PATENT DOCUMENTS

| JP | 4398945 | B2 | 1/2010 |
| JP | 2013-228767 | A | 11/2013 |

* cited by examiner

FIG. 35

| | A REGION | B REGION | C REGION | D REGION |
|---|---|---|---|---|
| REWRITE ORDER RESTRICTION | NO (RANDOM) | NO (RANDOM) | NO (RANDOM) | YES (SEQUENTIALLY) |
| ERASING BEFORE REWRITING IN A AND B REGIONS | UNNECESSARY | UNNECESSARY | UNNECESSARY | UNNECESSARY |
| ERASING BEFORE REWRITING IN C REGION | UNNECESSARY | NECESSARY | UNNECESSARY | NECESSARY |
| ERASING BEFORE REWRITING IN D REGION | UNNECESSARY | NECESSARY | UNNECESSARY | UNNECESSARY |
| REWRITE PROHIBITION WHEN REWRITING IS PERFORMED IN A REGION | UNNECESSARY | UNNECESSARY | UNNECESSARY | UNNECESSARY |
| REWRITE PROHIBITION WHEN REWRITING IS PERFORMED IN B, C, OR D REGION | UNNECESSARY | UNNECESSARY | NECESSARY | NECESSARY |

MEMORY CONTROLLER AND MEMORY SYSTEM FOR SUPPRESSION OF FLUCTUATION OF VOLTAGE DROP

CROSS REFERENCE TO RELATED APPLICATIONS

This application is a U.S. National Phase of International Patent Application No. PCT/JP2016/085739 filed on Dec. 1, 2016, which claims priority benefit of Japanese Patent Application No. JP 2016-021812 filed in the Japan Patent Office on Feb. 8, 2016. Each of the above-referenced applications is hereby incorporated herein by reference in its entirety.

TECHNICAL FIELD

The present technology relates to a memory controller, a memory system, and a control method of a memory controller. More particularly, the present technology relates to a memory controller, a memory system, and a control method of a memory controller which are capable of controlling a non-volatile memory including a variable resistive element installed therein.

BACKGROUND ART

Non-volatile memories (NVMs) have been used as auxiliary storage devices or storages in recent information processing systems. Non-volatile memories are broadly divided into flash memories for data access in units of large data sizes and non-volatile random access memories (Non-volatile RAMs) to which high-speed random access is possible in units of smaller data sizes. Here, NAND flash memories are exemplified as a representative example of flash memories. On the other hand, resistive RAMs (ReRAMs), phase-change RAMs (PCRAMs), magnetoresistive RAMs (MRAMs), and the like are exemplified as examples of non-volatile random access flash memories. Among these memories, ReRAMs have attracted attention due to high access speed and the like.

Generally, in ReRAMs, a memory cell including a variable resistive element is disposed at each of intersection points of column lines and row lines which are wired in a two-dimensional lattice pattern. A driver selects a memory cell of a rewrite target on the basis of write data and applies a voltage between the column line and the row line to cause a resistance value of the selected memory cell to be changed. If a leakage current occurs in an unselected memory cell, the leakage current flows into the selected memory cell via the column line or the row line, and a voltage drop (IR drop) equal to a product of the leakage current and a wiring resistance of the row line or the column line occurs. As the IR drop increases, a writing time to the memory cell increases. Further, if the IR drop differs for each memory cell, there occurs a variation in the writing time of each memory cell. Further, in a case in which a certain margin is given to a power supply voltage so that a value after the drop does not fall below a certain minimum operation voltage even when the power supply voltage drops due to the IR drop, the margin decreases as the variation of the IR drop increases.

In this regard, a memory controller that performs rewriting to a high resistance state in order from a memory cell in which a wiring distance of the row line or the column line is small in a write process in order to suppress a fluctuation of the IR drop has been proposed (see, for example, Patent Literature 1). As the resistance value of the memory cell increases, the leakage current decreases, and as the wiring distance increases, the wiring resistance increases, and thus it is possible to suppress the variation of the IR drop to some extent by rewriting to the high resistance state in order from the memory cell having the small wiring distance.

CITATION LIST

Patent Literature

Patent Literature 1: JP 4398945B

DISCLOSURE OF INVENTION

Technical Problem

However, in the related art described above, there are cases in which the fluctuation of the IR drop is unable to be sufficiently suppressed. For example, a case in which a logic value "1" is assigned to the low resistance state of the memory cell, and a logic value "0" is assigned to the high resistance state. In general, the leakage current occurs in the memory cells with the low resistance value, and thus as the number of memory cells of "1" (the low resistance state) increases, a sum of the leakage current increases, and the IR drop increases. For example, in a case in which the non-volatile memory in which "11110000" of a binary number is written is rewritten to "00001111," the driver first performs rewriting to "11111111" through a set process. Then, the driver performs rewriting to "11110000" through a reset process. In a state after the set process, since the number of memory cells of "1" (the low resistance state) is larger than before the set process or after the reset process, the sum of the leakage current increases, and the IR drop increases. As described above, there is a problem in that as the number of memory cells to be rewritten increases, the voltage drop (IR drop) fluctuates greatly.

The present technology was made in light of the foregoing, and it is desirable to suppress the fluctuation of the voltage drop in the non-volatile memories including the variable resistive element installed therein.

Solution to Problem

The present technology has been made to solve the above problem. According to a first aspect of the present technology, there is provided a memory controller including: an initialization control unit configured to cause a resistance value of a variable resistive element in an access restriction region to be changed to an initial value larger than a predetermined value in a read only mode among the read only mode in which writing to the access restriction region in a memory cell array in which the variable resistive elements are arranged is prohibited and a writable mode in which the writing to the access restriction region is permitted, and configured to transition to the writable mode; and a write control unit configured to cause a resistance value of an element corresponding to write data among the variable resistive elements in the access restriction region to be changed to a value smaller than the initial value in the writable mode, and configured to transition to the read only mode. The first aspect also includes a method for controlling the controller. Accordingly, an effect that the resistance value of the variable resistive element is controlled to the initial value when transition from the read only mode to the writable mode is performed is obtained.

In addition, according to the first aspect, the access restriction region may be a part of a region of the memory cell array. Accordingly, an effect that the resistance values of a part of the memory cell array are controlled to the initial value is obtained.

In addition, according to the first aspect, the memory cell array may have the access restriction region and an unrestricted region in which the writing is permitted in the read only mode, the access restriction region may have a first access restriction region and a second access restriction region farther from a driver than the first access restriction region, the unrestricted region may have a first unrestricted region and a second unrestricted region farther from the driver than the first unrestricted region, and the initialization control unit may cause resistance values of the variable resistive elements in the second unrestricted region and the second access restriction region to be changed to the initial value and transition to the writable mode. Accordingly, an effect that the resistance values of the second unrestricted region and the second access restriction region are controlled to the initial value when transition from the read only mode to the writable mode is performed is obtained.

In addition, according to the first aspect, in a case in which the resistance values of the variable resistive elements in the second unrestricted region and the second access restriction region are the initial value, the write control unit may cause the resistance value of the element corresponding to the write data among the variable resistive elements in the first access restriction region to be changed to a value smaller than the initial value. Accordingly, an effect that rewriting is performed in the first access restriction region in a case in which the resistance values of the second unrestricted region and the second access restriction region are an initial value is obtained.

In addition, according to the first aspect, in a case in which the resistance values of the variable resistive elements in the second unrestricted region are the initial value, the write control unit may cause the resistance value of the element corresponding to the write data among the variable resistive elements in the second access restriction region to be changed to a value smaller than the initial value. Accordingly, an effect that rewriting is performed in the second access restriction region in a case in which the resistance value of the second unrestricted region is an initial value is obtained.

In addition, according to the first aspect, the write control unit may transition to the read only mode in a case in which the resistance value of the element corresponding to the write data among the variable resistive elements in any of the second unrestricted region, the first access restriction region, and the second access restriction region in the writable mode is changed to a value smaller than the initial value. Accordingly, an effect that transition to the read only mode is performed when rewriting is performed in one of the second unrestricted region, the first access restriction region, and the second access restriction region is obtained.

In addition, according to the first aspect, the initialization control unit may cause a resistance value of a variable resistive element closer to a driver than the variable resistive element corresponding to one of a maximum value and a minimum value of a write address to be changed to the initial value. Accordingly, an effect that the resistance value of the variable resistive element closer to the driver than the variable resistive element corresponding to one of the maximum value and the minimum value of the write address is controlled to the initial value is obtained.

In addition, according to the first aspect, if a predetermined range of at least a part of the access restriction region is designated as an access range, the initialization control unit may cause resistance values of the variable resistive element in the access range and the variable resistive element having a shorter wiring distance than the access range to be changed to a value smaller than the initial value. Accordingly, an effect that the resistance values of the variable resistive element in the access range and the variable resistive element whose wiring distance is smaller than the access range is controlled to a value smaller than the initial value is obtained.

In addition, according to the first aspect, the initialization control unit may cause the resistance values of all the variable resistive elements in the access restriction region to be changed to the initial value. Accordingly, an effect that the resistance values of all variable resistive elements in the access restriction region are controlled to the initial value is obtained.

In addition, according to the first aspect, the initialization control unit may cause the resistance values of a part of the variable resistive elements in the access restriction region to be changed to the initial value. Accordingly, an effect that the resistance values of some variable resistive elements in the access restriction region are controlled to the initial value is obtained.

In addition, according to the first aspect, the initialization control unit may cause the resistance values to be changed to the initial value in order from the variable resistive element having a shorter wiring distance to a driver. Accordingly, an effect that the resistance value is controlled to the initial value in order from the variable resistive element whose wiring distance to the driver is small is obtained.

In addition, according to the first aspect, an address of a number corresponding to the wiring distance may be allocated to each of the variable resistive elements, and the initialization control unit may select the addresses in a predetermined order and cause the resistance values of the variable resistive elements corresponding to the selected addresses to be changed to the initial value. Accordingly, an effect that the addresses are sequentially selected in a predetermined order, and the resistance value of the variable resistive element corresponding to the address is controlled to the initial value is obtained.

In addition, according to the first aspect, the write control unit may cause the resistance values to be changed to values smaller than the initial value in order from the variable resistive element having a longer wiring distance to the driver. Accordingly, an effect that resistance value is controlled to the initial value in order from the variable resistive element whose wiring distance to the driver is large is obtained.

In addition, according to the first aspect, the write control unit may select the addresses in order opposite to the predetermined order and cause the resistance values of the variable resistive elements corresponding to the selected addresses to be changed to a value smaller than the initial value. Accordingly, an effect that addresses are sequentially selected in an order opposite to the predetermined order, and the resistance value of the variable resistive element corresponding to the address is controlled to a value smaller than the initial value is obtained.

In addition, according to a second aspect of the present technology, there is provided a memory system including: a memory cell array in which variable resistive elements are arranged; a driver configured to drive the memory cell array; an initialization control unit configured to cause a resistance value of a variable resistive element in an access restriction region to be changed to an initial value larger than a predetermined value under the control of the driver in a read only mode among the read only mode in which writing to the access restriction region in the memory cell array is prohibited and a writable mode in which the writing to the access restriction region is permitted, and configured to transition to the writable mode; and a write control unit configured to cause a resistance value of an element corresponding to write data among the variable resistive elements in the access restriction region to be changed to a value smaller than the initial value under the control of the driver in the writable mode, and configured to transition to the read only mode. Accordingly, an effect that when transition from the read only mode to the writable mode is performed, the resistance value of the variable resistive element of the memory cell array is changed to the initial value under the control of the driver is obtained.

In addition, according to the second aspect, the initialization control unit may cause the resistance value of the variable resistive element in the access restriction region to be changed to the initial value in accordance with a command for instructing to perform initialization. Accordingly, an effect that the resistance value of the variable resistive element in the access restriction region is controlled to the initial value in accordance with the command for instructing the initialization is obtained.

In addition, according to the second aspect, the memory system may further include a power supply circuit configured to detect power interruption of a main power source and perform switching from the main power source to a standby power source, the initialization control unit may cause the resistance value of the variable resistive element in the access restriction region to be changed to the initial value if the power interruption is detected. Accordingly, an effect that if the power interruption is detected, the resistance value of the variable resistive element in the access restriction region is controlled to the initial value is obtained.

In addition, according to the second aspect, the driver includes a row driver configured to drive a row including the variable resistive elements arranged in a predetermined direction in the memory cell array, and a column driver configured to drive a column including the variable resistive elements arranged in a direction perpendicular to the predetermined direction in the memory cell. An address of a number corresponding to a distance from the row driver and the column driver to each of the variable resistive element may be allocated to each of the variable resistive elements, the initialization control unit may select the addresses in a predetermined order, and cause the resistance values of the variable resistive elements corresponding to the selected addresses to be changed to values smaller than the initial value, and the write control unit may select the addresses in order opposite to the predetermined order and cause the resistance values of the variable resistive elements corresponding to the selected addresses to be changed to values smaller than the initial value. Accordingly, an effect that the resistance value is controlled to the initial value in order from the variable resistive element whose wiring distance to the driver is small, and the resistance value is controlled to the initial value in order from the variable resistive element whose wiring distance to the driver is large is obtained.

In addition, according to the second aspect, the row driver may include an odd-numbered row driver configured to drive odd-numbered rows, and an even-numbered row driver configured to drive even-numbered rows, and the column driver may include an odd-numbered column driver configured to drive odd-numbered columns, and an even numbered column driver configured to drive even-numbered columns. Accordingly, an effect that the resistance value is controlled to the initial value in order from the variable resistive element whose wiring distance up to the odd-numbered row driver and the even-numbered row driver and the odd-numbered column driver and the even-numbered column driver is small, and the resistance value is controlled to the initial value in order from the variable resistive element whose wiring distance up to the drivers is large is obtained.

Advantageous Effects of Invention

According to the present technology, it is possible to obtain an excellent effect in that it is possible to suppress the fluctuation of the voltage drop in non-volatile memories including a variable resistive element installed therein. Note that effects described herein are not necessarily limitative, and any effect that is desired to be described in the present disclosure may be admitted.

BRIEF DESCRIPTION OF DRAWINGS

FIG. 35 is a diagram for describing characteristics of respective regions in the second embodiment of the present technology.

MODE(S) FOR CARRYING OUT THE INVENTION

Hereinafter, modes for carrying out the present technology (hereinafter referred to as "embodiments") will be described. The description will proceed in the following order.
1. First embodiment (example of initializing all memory cells before write process)
2. Second embodiment (example of initializing all memory cells in part of memory cell array before write process)
3. Third embodiment (example of initializing all memory cells at time of power interruption before write process)

1. First Embodiment

Configuration Example of Memory System

Figure 1:
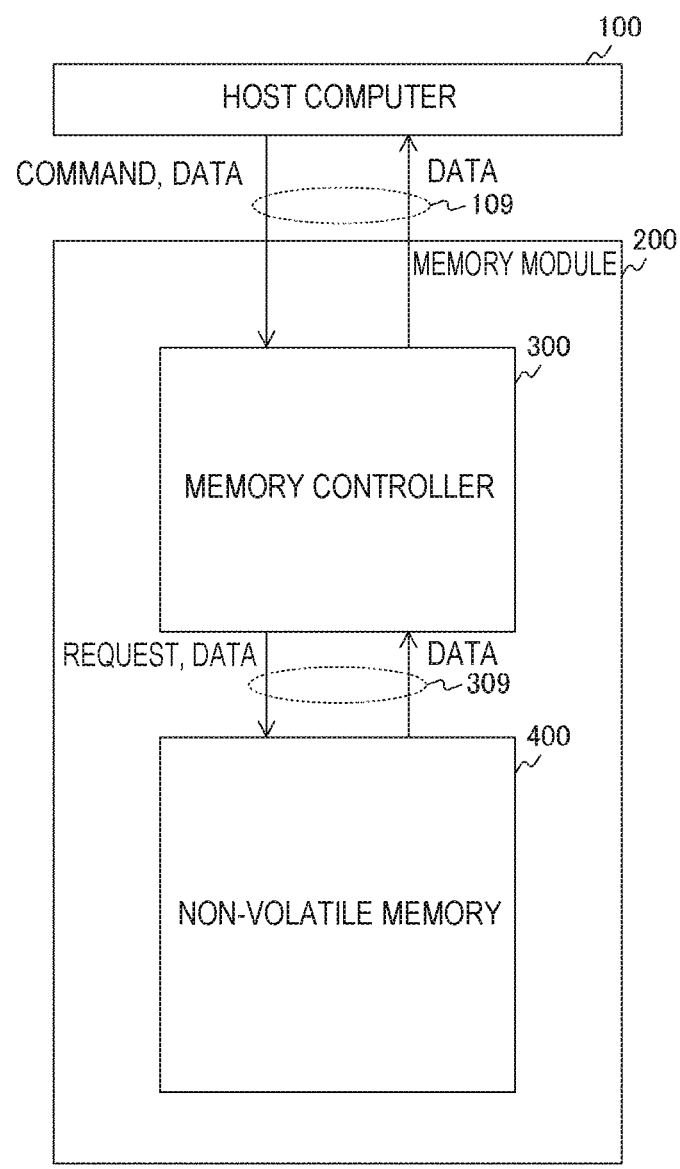
FIG. 1 is an overall diagram illustrating an example of a configuration of a memory system according to a first embodiment of the present technology.

FIG. 1 is an overall view illustrating a configuration example of a memory system in a first embodiment. This memory system includes a host computer 100 and a memory module 200. The memory module 200 includes a memory controller 300 and a non-volatile memory 400.

The host computer 100 controls the whole memory system. The host computer 100 generates a command and write data and supplies the command and the write data to the memory module 200 via a signal line 109. Further, the host computer 100 receives read data and a status which are read from the memory module 200 via the signal line 109. Here, the command is for controlling the memory module 200, and includes, for example, a write command for instructing writing of data and a read command for instructing reading of data. The status indicates a status of the memory module 200 and includes error information and the like.

The memory controller 300 controls the non-volatile memory 400. The memory controller 300 interprets the command from the host computer 100, generates a request, and supplies the request to the non-volatile memory 400. Further, the memory controller 300 supplies the write data to the non-volatile memory 400 together with a write request and receives the read data from the non-volatile memory 400 after supplying a read request.

The non-volatile memory 400 stores data under the control of the memory controller 300. For example, a ReRAM is used as the non-volatile memory 400.

Further, the status of the memory module 200 is classified into a read only mode in which only reading is permitted and a writable mode in which writing and reading are permitted. Transition from one mode of these modes to the other mode is performed when a predetermined condition is satisfied. A transition condition from the read only mode to the writable mode is initialization of the non-volatile memory 400. On the other hand, a transition condition from the writable mode to the read only mode is completion of a data write process.

As described above, if data is written, the memory module 200 transitions to the read only mode and should be initialized to transition from the read only mode to the writable mode. Therefore, when data is written twice or more, it is necessary for the host computer 100 to give an initialization instruction each time. For example, a case in which the host computer 100 writes data D1 and then writes data D2 is assumed. In this case, it is necessary for the host computer 100 to write the data D1 after performing initialization and then write data D2 after performing initializing again.

Further, the rewriting of the non-volatile memory 400 is performed in accordance with a certain rewrite order (that is, sequentially). In the initialization, for example, the memory system selects addresses one by one in an ascending order. Further, in the writing, it is necessary for the memory system to select addresses one by one in an order opposite to that at the time of initialization (for example, a descending order). In a case in which the addresses are not in the descending order, an address error indicating that the addresses are wrong is generated.

Configuration Example of Host Computer

Figure 2:
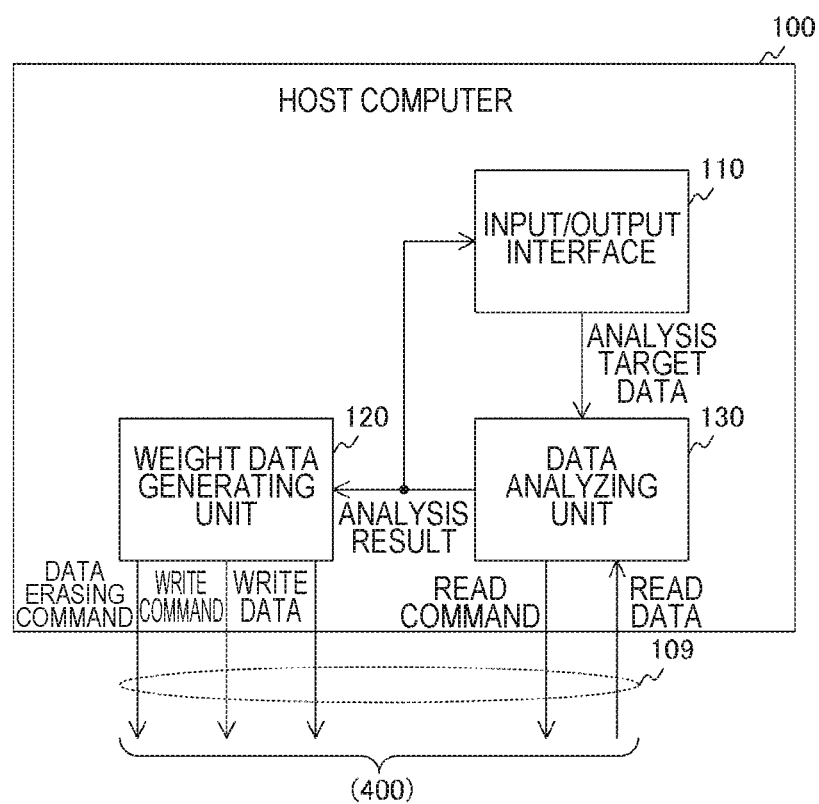
FIG. 2 is a block diagram illustrating a configuration example of a host computer in a first embodiment of the present technology.

FIG. 2 is a block diagram illustrating a configuration example of the host computer 100 in the first embodiment. The host computer 100 includes an input/output interface 110, a weight data generating unit 120, and a data analyzing unit 130.

The input/output interface 110 performs transmission and reception of data with the outside of the memory system. The input/output interface 110 receives analysis target data from the outside, supplies the analysis target data to the data analyzing unit 130, receives an analysis result from the data analyzing unit 130, and transmits the analysis result to the outside.

The data analyzing unit 130 analyzes the analysis target data. Examples of the analysis target data include image data, moving image data, audio data, and text data. For example, a neural network model is used in the analysis. In the neural network model, signals are propagated among a plurality of nodes. Further, a strength of coupling between nodes is indicated by a parameter called a "weight." Data indicating the weight is written in the non-volatile memory 400. The data analyzing unit 130 transmits a read command to the memory controller 300 and acquires read data indicating the weight. Then, the data analyzing unit 130 analyzes the analysis target data using the read weight and supplies the analysis result to the weight data generating unit 120 and the input/output interface 110.

The weight data generating unit 120 generates the weight. The weight data generating unit 120 generates the weight in which an initial value is set in accordance with a user's manipulation or the like. Then, the weight data generating unit 120 issues a data erasing command and supplies the data erasing command to the memory controller 300. The data erasing command is a command for instructing execution of an initialization process for erasing data in the non-volatile memory 400. Then, the weight data generating unit 120 issues a write command and supplies the write command to the memory controller 300 together with write data indicating a weight.

Further, the weight data generating unit 120 determines whether or not it is necessary to update the weight. For example, the weight is updated in order to improve the analysis accuracy or correct defects. Alternatively, the weight is updated in a case in which refreshing to compensate for aged deterioration of the memory cell is performed. In a case in which it is necessary to update the weight, the weight data generating unit 120 issues the data erasing command again and supplies the data erasing command to the memory controller 300. Then, the weight data generating unit 120 issues the write command and supplies the write command to the memory controller 300 together with write data indicating the updated weight.

Here, in the writing data, a certain address range including one or more addresses is designated by one write command. For example, if a minimum value of an address which can be designated in the non-volatile memory 400 is indicated by ADDmin, and a maximum value is indicated by ADDmax, the host computer 100 can designate a constant address range starting from ADDmin. In this case, the host computer 100 designates any one address of ADDmin to ADDmax as a last address ADDend. Then, the memory controller 300 selects the addresses from ADDmin to ADDend one by one in the descending order, and writes the write data at the address.

Further, the host computer 100 may designate a logical address, the memory controller 300 may convert a logical address into a physical address, or the host computer 100 may directly designate a physical address.

Figure 3:
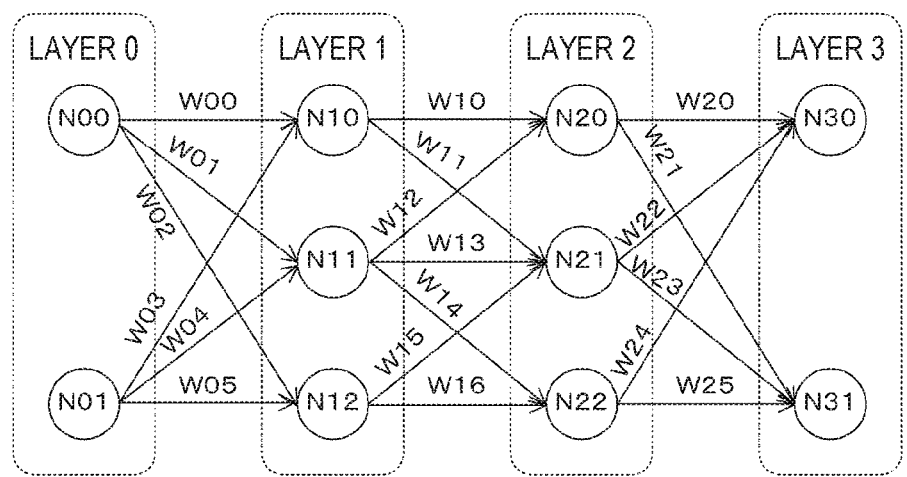
FIG. 3 is a schematic diagram of a neural network model used by the host computer in the first embodiment of the present technology.

FIG. 3 is a schematic diagram of the neural network model used by the host computer 100 in the first embodiment. In the neural network model, generally, a plurality of layers are disposed, and one or more nodes are disposed for each layer. A signal output from a node of a certain layer is multiplied by a weight and input to a node of another layer. For example, it is assumed that a node N00 is disposed in a layer L0, a node N10 is disposed in the layer L1, and a weight between the nodes is W00. In this case, a signal obtained by multiplying a signal output from the node N00 by the weight W00 is input to the node N10.

In a case in which signal propagation between the nodes is performed in a certain order, a weight corresponding to the signal is read out in that order. As described above, a process using the neural network model is suitable for memory systems that performs sequential access.

Example of Configuration of Memory Controller

Figure 4:
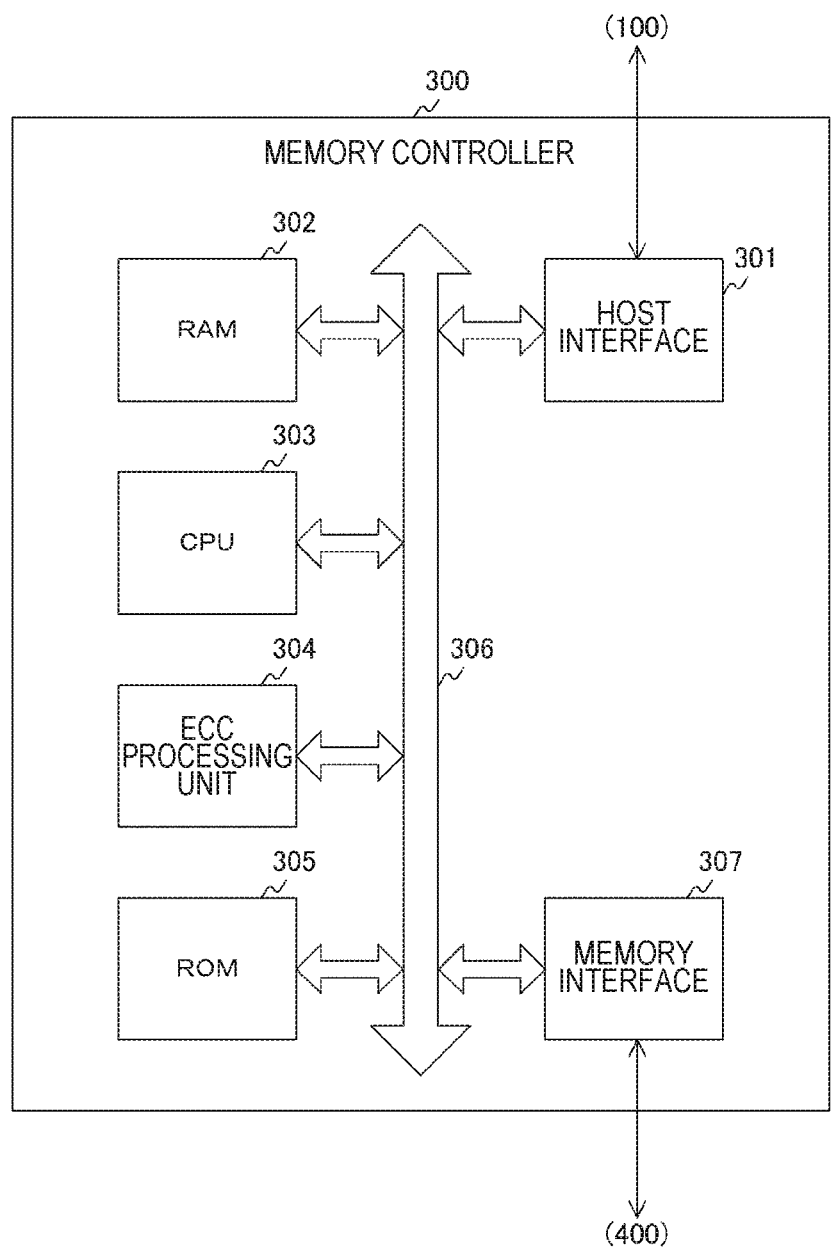
FIG. 4 is a block diagram illustrating an example of a configuration of a memory controller according to the first embodiment of the present technology.

FIG. 4 is a block diagram illustrating an example of a configuration of the memory controller 300 according to the first embodiment. The memory controller 300 includes a host interface 301, a random access memory (RAM) 302, a central processing unit (CPU) 303, and an ECC processing unit 304. In addition, the memory controller 300 includes a read only memory (ROM) 305, a bus 306, and a memory interface 307.

The host interface 301 is for exchanging data and commands with the host computer 100. The RAM 302 temporarily holds data necessary for processes executed by the CPU 303. The CPU 303 entirely controls the memory controller 300. The ROM 305 stores programs executed by the CPU 303 and the like. The bus 306 is a shared path for exchanging data between the RAM 302, the CPU 303, the ECC processing unit 304, the ROM 305, the host interface 301, and the memory interface 307. The memory interface 307 is for exchanging data and commands with the non-volatile memory 400. The ECC processing unit 304 performs encoding or decoding of data.

Figure 5:
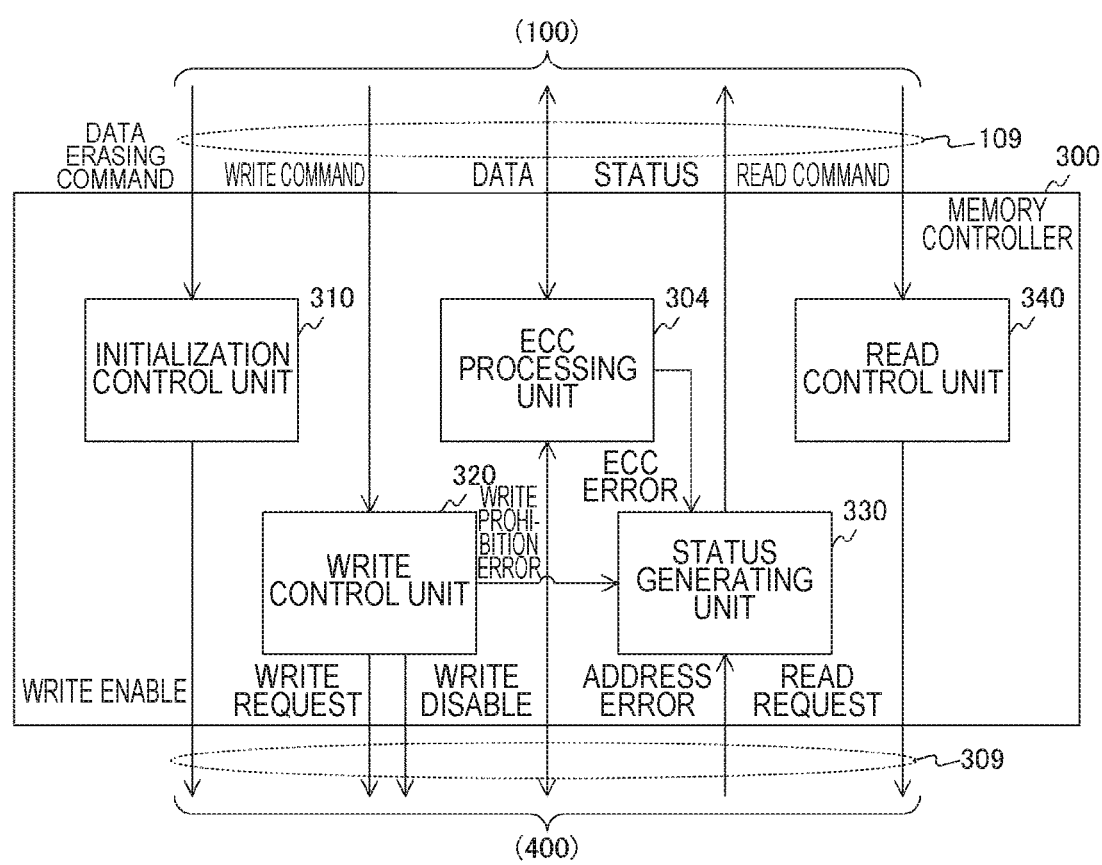
FIG. 5 is a block diagram illustrating an example of a functional configuration of the memory controller according to the first embodiment of the present technology.

FIG. 5 is a block diagram illustrating a functional configuration example of the memory controller 300 in the first embodiment. The memory controller 300 includes an initialization control unit 310, a write control unit 320, an ECC processing unit 304, a status generating unit 330, and a read control unit 340. Each of the initialization control unit 310, the write control unit 320, the status generating unit 330, and the read control unit 340 is implemented by the RAM 302, the CPU 303, the ROM 305, and the bus 306 in FIG. 4.

The initialization control unit 310 initializes the non-volatile memory 400 in accordance with the data erasing command. The initialization control unit 310 decodes the data erasing command in the read only mode, generates a write enable request and supplies the write enable request to the non-volatile memory 400. The non-volatile memory 400 is initialized in accordance with the write enable request. Further, the initialization control unit 310 causes the memory module 200 to transition to the writable mode when the non-volatile memory 400 is initialized.

The write control unit 320 writes data in the non-volatile memory 400 in accordance with the write command. The write control unit 320 decodes the write command and generates a write request. The write control unit 320 selects the addresses from the last address ADDend to the address ADDmin designated by the write command in the descending order. Then, each time the addresses is selected, the write control unit 320 generates a write request designating the selected address and supplies the write request to the non-volatile memory 400. Then, the write control unit 320 transmits a write request designating the address ADDmin, and if writing at that address is completed, the write control unit 320 generates a write disable request and supplies the write disable request to the non-volatile memory 400. Further, the write control unit 320 causes the memory module 200 to transition to the read only mode when the writing is completed.

Further, in a case in which the write command is issued although it is in the read only mode, the write control unit 320 generates a write prohibition error indicating that the access is wrong and supplies the write prohibition error to the status generating unit 330.

The status generating unit 330 generates the status. The status generating unit 330 receives an ECC error from the ECC processing unit 304 and receives an access prohibition error from the write control unit 320. Further, the status generating unit 330 receives an address error from the non-volatile memory 400. The status generating unit 330 generates a status describing these errors and supplies the status to the host computer 100.

The read control unit 340 reads the read data from the non-volatile memory 400 in accordance with the read command. The read control unit 340 decodes the read command, generates the read request, and supplies the read request to the non-volatile memory 400.

Configuration Example of Non-Volatile Memory

Figure 6:
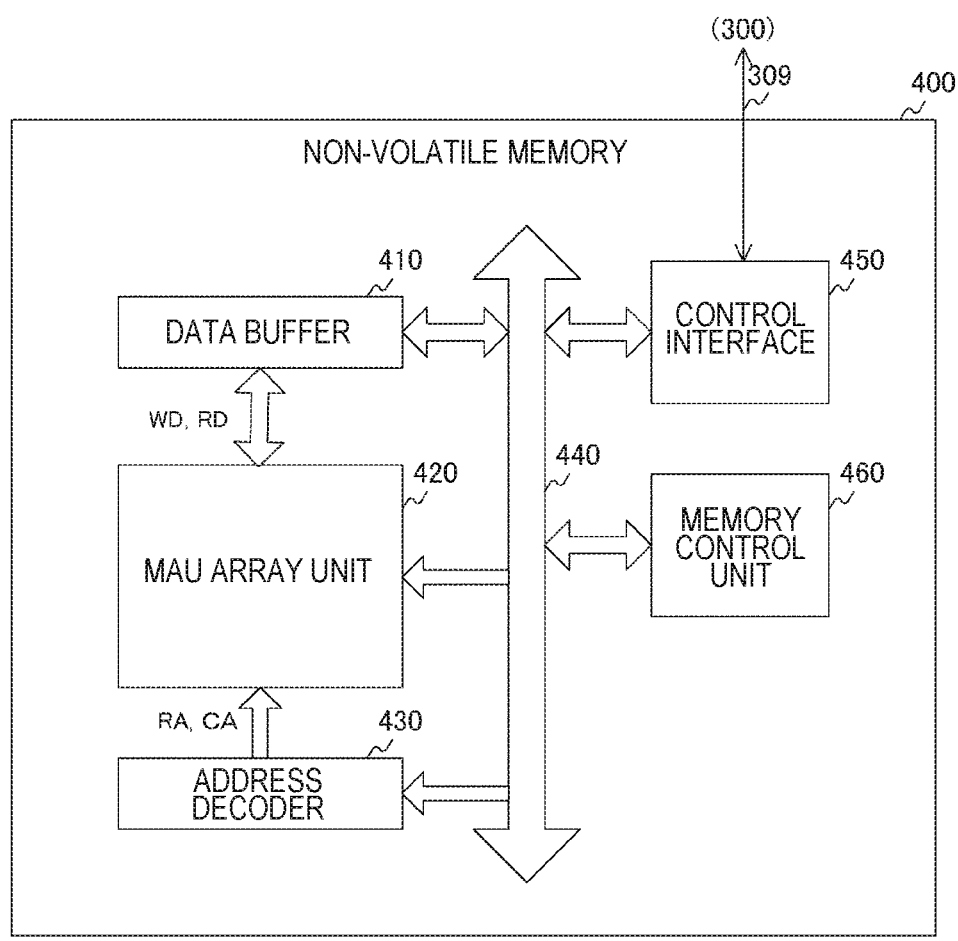
FIG. 6 is a block diagram illustrating an example of a configuration of a non-volatile memory according to the first embodiment of the present technology.

FIG. 6 is a block diagram illustrating a configuration example of the non-volatile memory 400 in the first embodiment. The non-volatile memory 400 includes a data buffer 410, an MAU array unit 420, an address decoder 430, a bus 440, a control interface 450, and a memory control unit 460.

The data buffer 410 holds the write data and the read data under the control of the memory control unit 460.

The MAU array unit 420 includes a plurality of memory array units disposed therein. A memory cell array and a driver are disposed in each of the memory array units.

The address decoder 430 decodes an address designated by the request. The address decoder 430 generates a row address RA and a column address CA by decoding the address and supplies the row address RA and the column address CA to the MAU array unit 420. The row address RA and the column address CA will be described later.

The bus 440 is a common path in which the data buffer 410, the MAU array unit 420, the address decoder 430, the control interface 450, and the memory control unit 460 exchange data with one another. The control interface 450 is an interface for the memory controller 300 and the non-volatile memory 400 to exchange data and commands with each other.

The memory control unit 460 controls the memory array unit such that data is written or read.

Figure 7:
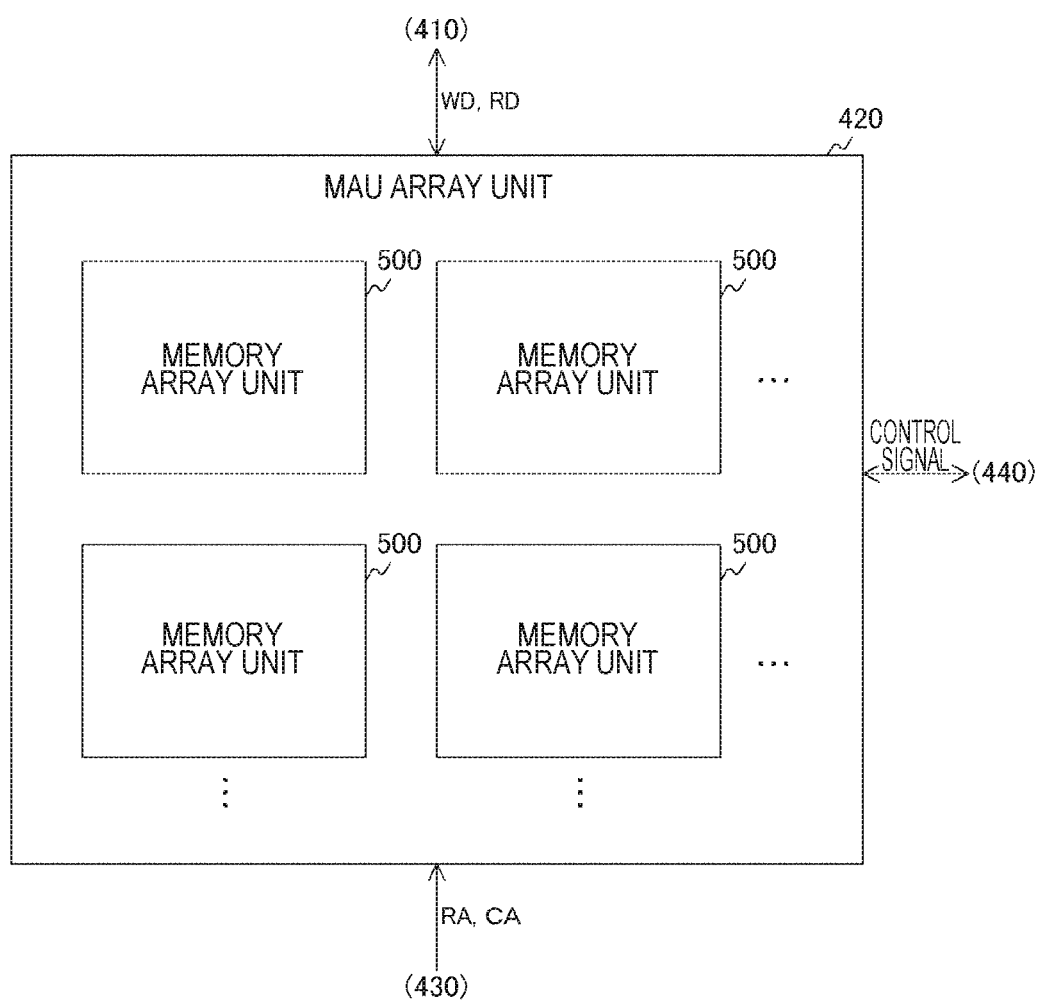
FIG. 7 is a diagram illustrating a configuration example of a memory array unit (MAU) array unit in the first embodiment of the present technology.

FIG. 7 is a diagram illustrating a configuration example of the MAU array unit 420 in the first embodiment. A plurality of memory array units 500 are arranged in the MAU array unit 420.

Figure 8:
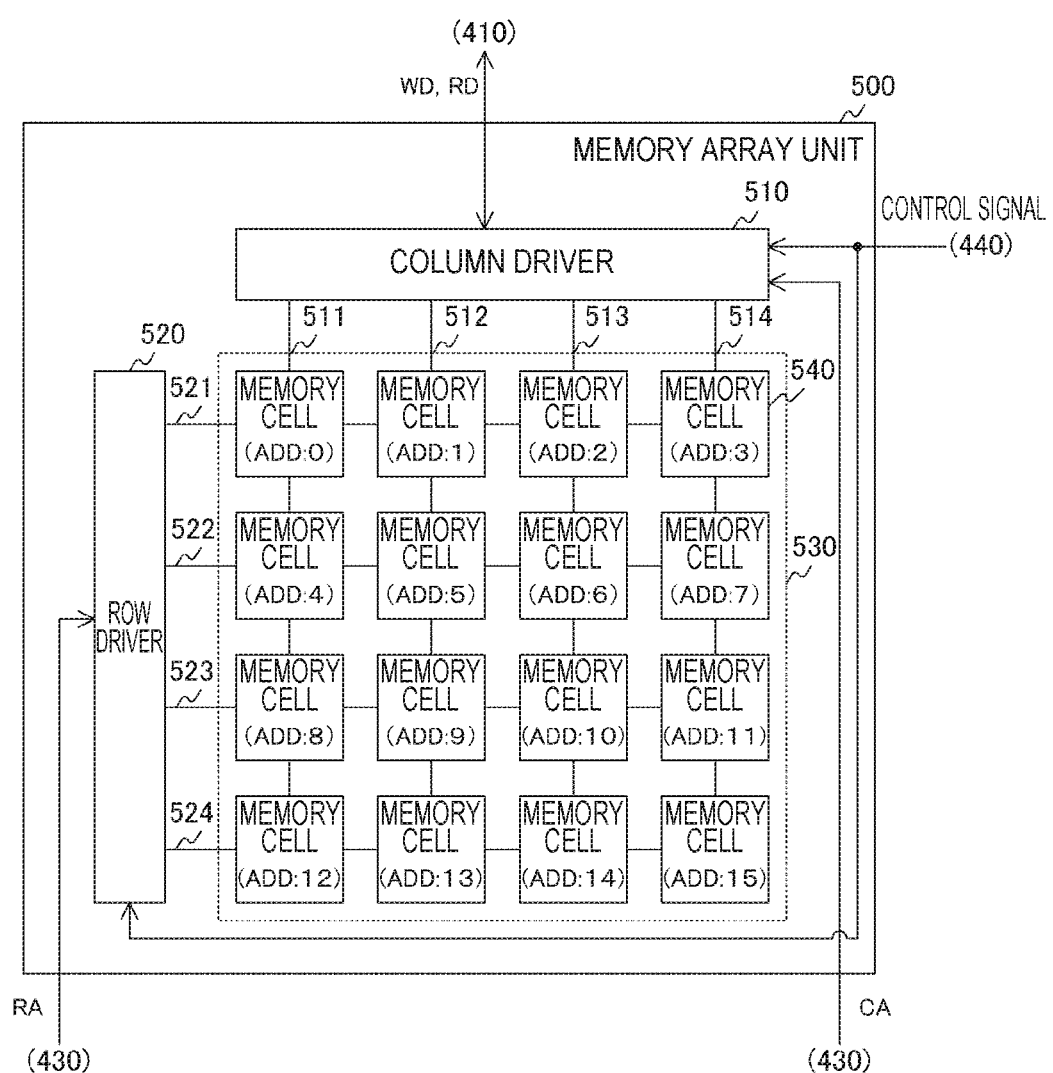
FIG. 8 is a block diagram illustrating a configuration example of a memory array unit in the first embodiment of the present technology.

FIG. 8 is a block diagram illustrating a configuration example of the memory array unit 500 in the first embodiment. The memory array unit 500 includes a column driver 510, a row driver 520, and a memory cell array 530. The memory cell array 530 includes a plurality of memory cells 540 which are arranged in a two-dimensional lattice pattern. Hereinafter, a set of memory cells 540 arranged in a predetermined direction are referred to as a "row," and a set of memory cells 540 arranged in a direction perpendicular to the direction is referred to as a "column."

The memory cell 540 stores data. Each memory cell 540 is connected to a column line wired in a column direction and a row line wired in a row direction. For example, a total of 16 (=4×4) memory cells 540 are disposed. Further, each of the memory cells 540 belonging to an m-th row (m is an integer of 1 to 4) is connected to the row driver 520 via a row line 52$m$. Further, each of the memory cells 540 belonging to an n-th column (n is an integer of 1 to 4) is connected to the column driver 510 via a column line 51$m$. Further, the number of memory cells 540 is not limited to 16.

Further, an address of a number corresponding to a wiring distance between the row line and the column line up to the memory cell 540 is allocated to each of the memory cells 540. For example, numbers are allocated to memory cells connected to the same row line such that smaller numbers are allocated to memory cells closer to the row driver 520. Further, numbers are allocated to memory cells connected to the same column line such that smaller numbers are allocated to memory cells closer to the column driver 510.

For example, a case in which addresses of "0" to "15" of decimal numbers are allocated to the 16 (=4×4) memory cells 540. In FIG. 8, the uppermost memory cell 540 in FIG. 8 has the shortest wiring distance and is allocated an address "0." Addresses "1," "2" and "3" are allocated to the remaining three memory cells 540 belonging to the same row as the address "0" in the ascending order of the distances from the row driver 520. Further, addresses "4," "8," and "12" are allocated to the remaining three memory cells 540 belonging to the same column as the address "0" in the ascending order of the distances from the column driver 510.

Further, an address of a larger number is allocated as the wiring distance is longer, but conversely, a configuration in which an address of a smaller number is allocated as the wiring distance is longer may be employed.

The row driver 520 drives the rows in accordance with the row address RA from the address decoder 430 and the control signal from the memory control unit 460. Here, the row address RA indicates a position of a row to be accessed. Further, the control signal is a set signal, a reset signal, or a sense signal. A driving method will be described later in detail.

The column driver 510 drives the rows on the basis of the column address CA from the address decoder 430, the control signal (the set signal or the reset signal), and write data WD. Here, the column address CA indicates a position of a column to be accessed. A driving method will be described later in detail. Further, the column driver 510 reads read data RD in accordance with the sense signal and causes the read data RD to be held in in the data buffer 410.

Figure 9:
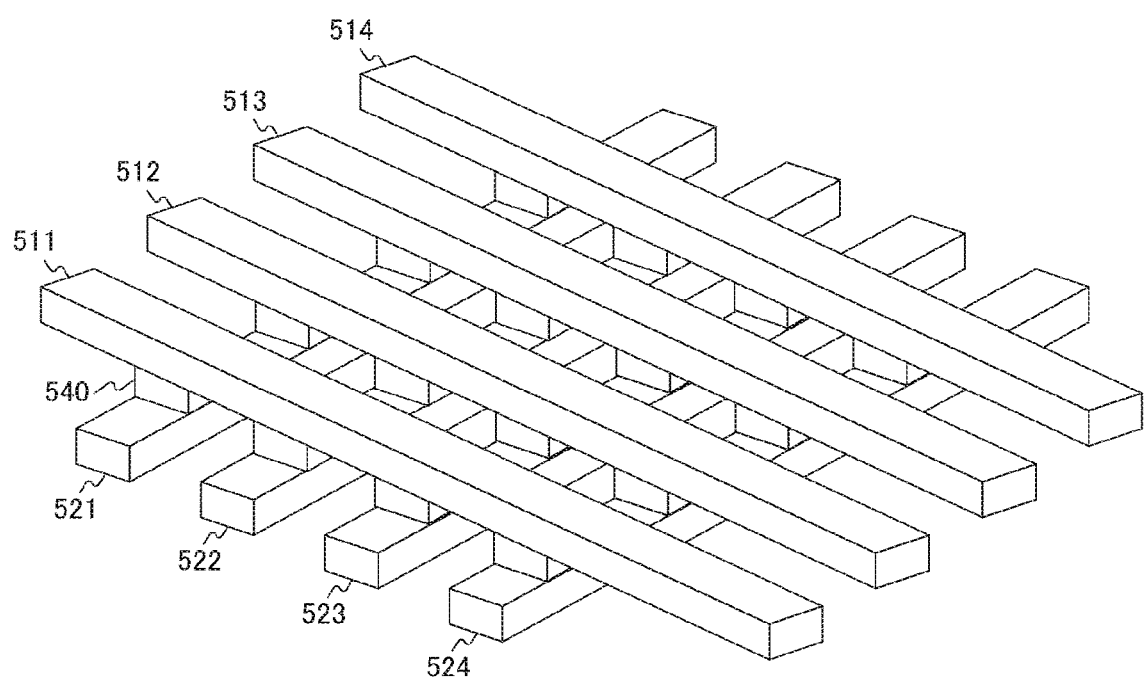
FIG. 9 is a perspective view of a memory cell array in the first embodiment of the present technology.

FIG. 9 is a perspective view of the memory cell array 530 in the first embodiment. In the memory cell array 530, a wiring layer in which column lines 511 to 514 and the like are disposed and a wiring layer in which row lines 521 to 524 and the like are disposed are stacked on a semiconductor substrate. Further, at the intersection points of the row lines and the column lines, the memory cells 540 are arranged at positions interposed between the column line and the row lines. Such a non-volatile memory is called a cross point type memory.

Configuration Example of Memory Cell

Figure 10:
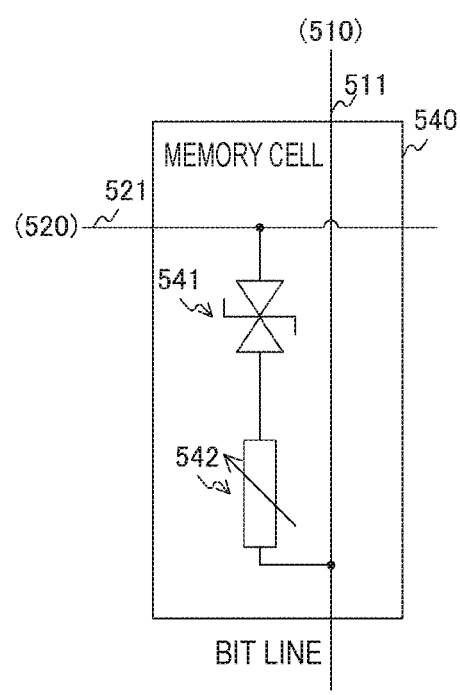
FIG. 10 is a circuit diagram illustrating a configuration example of a memory cell in the first embodiment of the present technology.

FIG. 10 is a circuit diagram illustrating a configuration example of the memory cell 540 in the first embodiment. The memory cell 540 includes a bidirectional diode 541 and a variable resistive element 542. One end of the bidirectional diode 541 is connected to the row line 521, and the other end is connected to the variable resistive element 542. One end of the variable resistive element 542 is connected to the bidirectional diode 541, and the other end is connected to the column line 511.

The bidirectional diode 541 supplies an electric current according to a line voltage between the column line and the bit line. For example, in a case in which the line voltage exceeds a predetermined value, the bidirectional diode 541 transitions to a conduction state and causes an electric current exceeding a predetermined current threshold I-th to flow to the variable resistive element 542. On the other hand, in a case in which the line voltage is equal to or less than a predetermined value, the bidirectional diode 541 transitions to a non-conduction state and causes an electric current equal to or less than the current threshold I-th to flow to the variable resistive element 542. The variable resistive element 542 is an element whose resistance value varies in accordance with a direction of an electric current. Further, an element other than the bidirectional diode 541 (such as a transistor) may be disposed instead of the bidirectional diode 541 as long as it is a selection element that transitions from one of the conduction state and the non-conduction state to the other in accordance with the line voltage.

Figure 11:
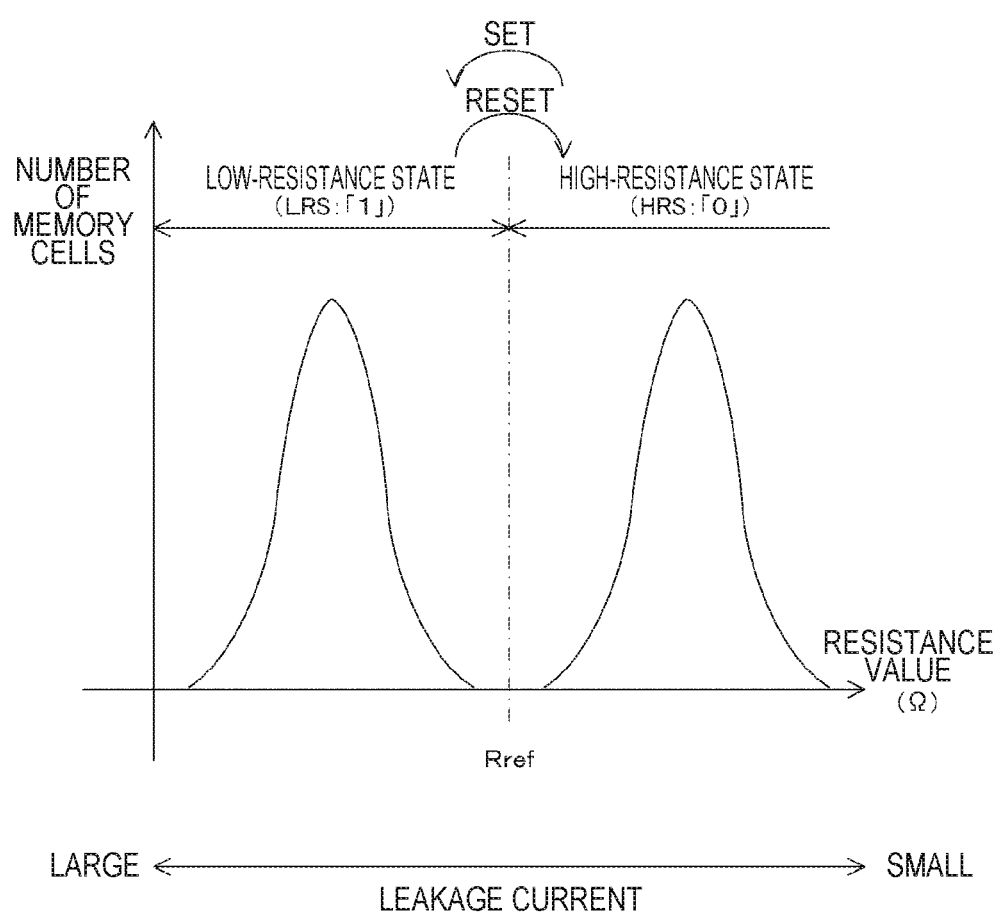
FIG. 11 is a diagram illustrating an example of a resistance distribution of a variable resistive element in the first embodiment of the present technology.

FIG. 11 is a diagram illustrating an example of a resistance distribution of the variable resistive element 542 in the first embodiment. In FIG. 11, a vertical axis indicates the number of cells of the memory cell 540, and a horizontal axis indicates a resistance value. In the memory cell 540, the resistance distribution thereof is divided into two by a resistance threshold $R_{ref}$. The distributions are called a low-resistance state (LRS) and a high-resistance state (HRS). For example, a logic value of "1" is allocated to the LRS, and "0" is allocated to the HRS. Further, a process of causing the memory cell 540 of the LRS to transition to the HRS is hereinafter referred to as "reset," and a process of causing the memory cell 540 of the HRS to transition to the LRS is hereinafter referred to as "set." Further, reading a value held in the memory cell 540 is referred to as "sense."

Here, the leakage current flowing in the memory cell 540 generally increases as the resistance value of the variable resistive element 542 in the memory cell 540 decreases. In other words, the leakage current of the memory cell 540 of the LRS is larger than that of the HRS.

In this regard, from a viewpoint for minimizing the leakage current of the memory cell 540, in the non-volatile memory 400, at least a part of the memory cell 540 is reset in the initialization, and it is rewritten to "0" (HRS) in which the leakage current is smaller. Further, in the initialization, it is most desirable that all the memory cells 540 be reset. Hereinafter, in the initialization, all the memory cells 540 are assumed to be reset.

Further, "1" is allocated to the LRS, and "0" is allocated to the HRS, but, conversely, "0" may be allocated to the LRS, and "1" may be allocated to the HRS. In this case, the memory cell 540 is initialized to "1."

Further, the memory system uses a memory of a binary storage scheme in which each memory cell holds 1 bit as the non-volatile memory 400, but a memory of a multi-value storage scheme in which each memory cell holds two or more bits may be used. In the multi-value storage system, each memory cell is initialized to a state with the highest resistance value among three or more states.

Figure 12A:
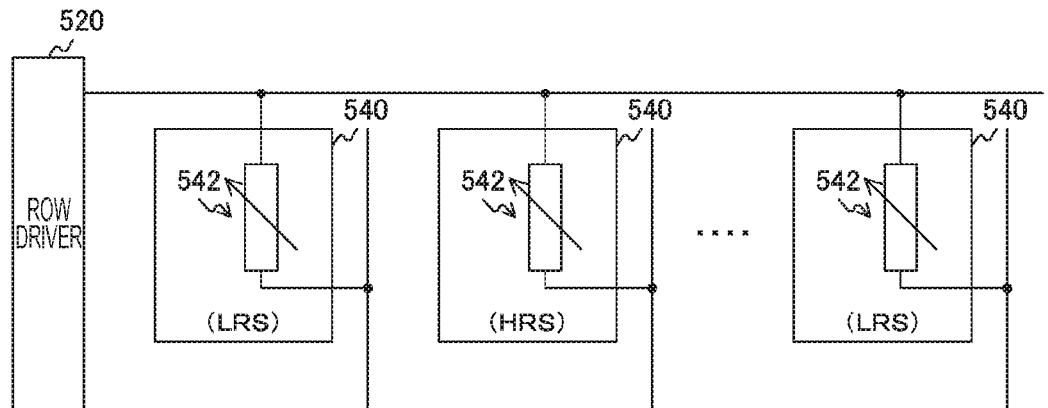
FIGS. 12A, 12B, and 12C are diagrams illustrating an example of a rewrite order of a memory cell at an initial stage in the first embodiment of the present technology.
Figure 12B:
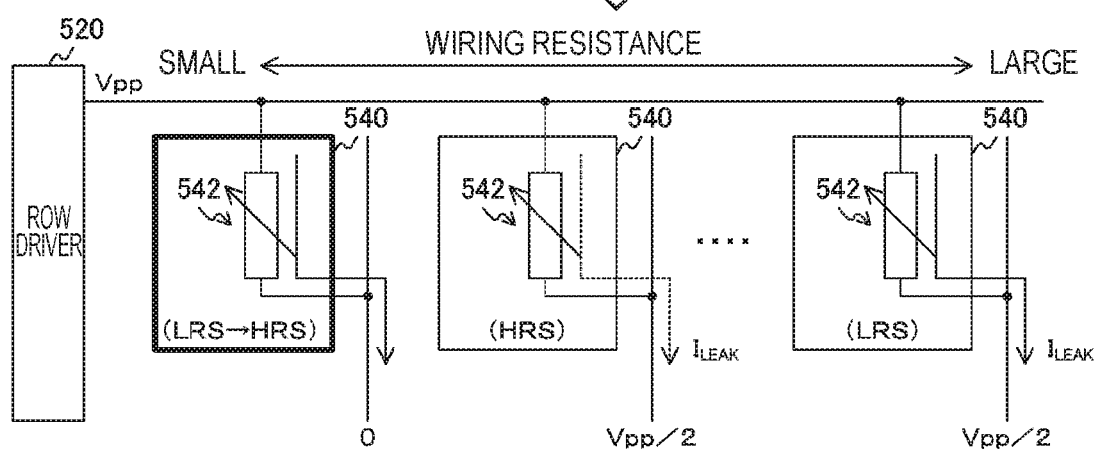
Figure 12C:
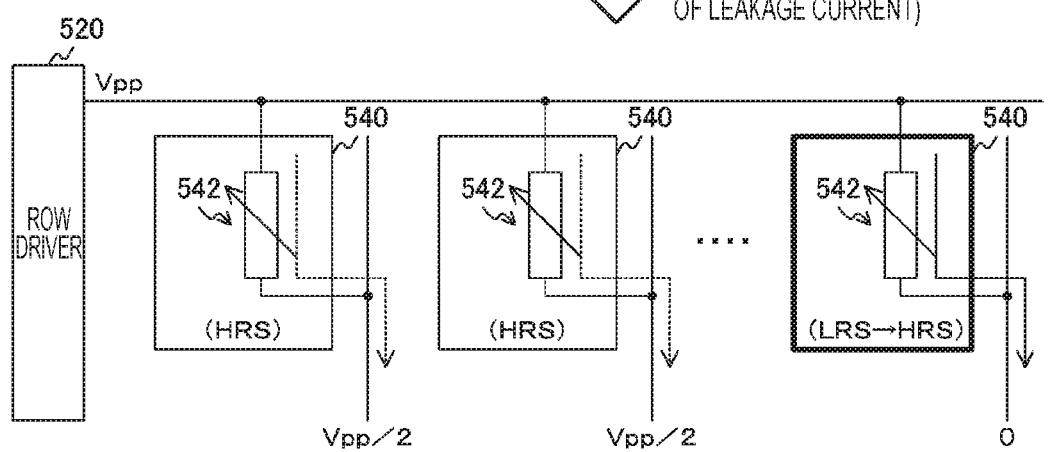

FIGS. 12A, 12B, and 12C are diagrams illustrating an example of the rewrite order of the memory cell 540 at the initial stage in the first embodiment. The row driver 520 applies a selected row voltage to a row selected on the basis of the row address RA and applies an unselected row voltage to the other rows. Further, the column driver 510 applies a selected column voltage to a column selected on the basis of the column address CA, and applies an unselected column voltage to the other columns.

Here, the memory cell 540 belonging to both a selected row and a selected column is hereinafter referred to as a "selected cell." Further, the memory cell 540 belonging to a selected row and an unselected column is referred to as a "half-selected cell." The memory cell 540 belonging to an unselected row and an unselected column is referred to as an "unselected cell."

A line voltage of the difference between the selected row voltage and the selected column voltage is applied to both ends of the selected cell. It is possible to set, reset, or sense the selected cell by controlling a size and a polarity of this line voltage. Hereinafter, the line voltage at the time of setting is referred to as a "set voltage," the line voltage at the time of resetting is referred to as a "reset voltage," and the line voltage at the time of sensing is referred to as a "sense voltage."

FIG. 12A illustrates an example of the status of the memory cell array before the initialization. The status of each of the memory cells 540 is a state corresponding to the written data (the LRS or the HRS).

FIG. 12B is a diagram illustrating the status of the memory cell array when the memory cell 540 closest to the row driver 520 is reset. For example, Vpp is applied as the selected row voltage, "0" volt is applied as the selected column voltage, and Vpp/2 is applied as the unselected column voltage. As a result, the set voltage Vpp is applied to the selected cell, and the selected cell is rewritten to "0" (HRS). On the other hand, the statuses of the half-selected cell and the unselected cell do not change. However, the leakage current ILEAK occurs in the half-selected cell of the LRS as described above. The leakage current ILEAK and the IR drop corresponding to the wiring resistance of the cell closer to the row driver than the selected cell among the half-selected cells of the LRS and the wiring resistance of the selected cell occur at a row side terminal of the selected cell, and an operation margin is influenced.

When only the memory cell 540 closest to the row driver 520 is reset, since the number of memory cells 540 of the LRS is large, a sum of the leakage currents is relatively large. On the other hand, since the wiring distance to the selected cell is the smallest in the row, an increase in the IR drop is suppressed.

The row driver 520 selects the memory cells 540 one by one from the memory cell 540 having the short wiring distance and resets the selected memory cells 540. Further, as the number of memory cells reset to the HRS increases, the sum of the leakage current decreases, and the electric current coming around to the selected cell decreases.

FIG. 12C illustrates the status of the memory cell array when the memory cell 540 farthest from the row driver 520 is reset. In this state, all the half-selected cells closer to the row driver 520 than the selected cell are reset to the HRS. For this reason, the leakage current becomes smaller as compared with FIGS. 12A and 12B. Since the wiring distance of the selected cell is largest within the row, the wiring resistance is also maximum, but since the leakage current is reduced, the increase in the IR drop is suppressed.

As described above, if the memory cells 540 are reset to the HRS in order from the memory cell 540 having a small wiring distance, the wiring resistance of the wiring up to the selected cell increases as the number of reset memory cells increases, while the leakage current decreases, and thus it is possible to suppress the fluctuation of the IR drop.

Here, since the number of the address to be allocated increases as the wiring distance increases as described above, it is possible to reset the memory cells 540 in order from the memory cells 540 having the small wiring distance by designating the addresses in the ascending order by the memory controller 300. Further, in a case in which the number of the address to be allocated decreases as the wiring distance increases, it is preferable that the memory controller 300 designate the addresses in the descending order and reset the memory cells.

Further, in a case in which the write data is written in the memory cell 540, the memory controller 300 sets only the memory cell corresponding to the write data to the LRS in order from the memory cell 540 having the large wiring distance. For example, when data of "0101" of a binary number is written, the memory controller 300 sets a 4-th bit from the left and then sets a 2-nd bit. At the time of writing, the leakage current increases with the increase in the number of set memory cells, but the wiring resistance of the wiring to the selected cell decreases, and thus the fluctuation of the IR drop can be suppressed, similarly to the time of reset.

Figure 13:
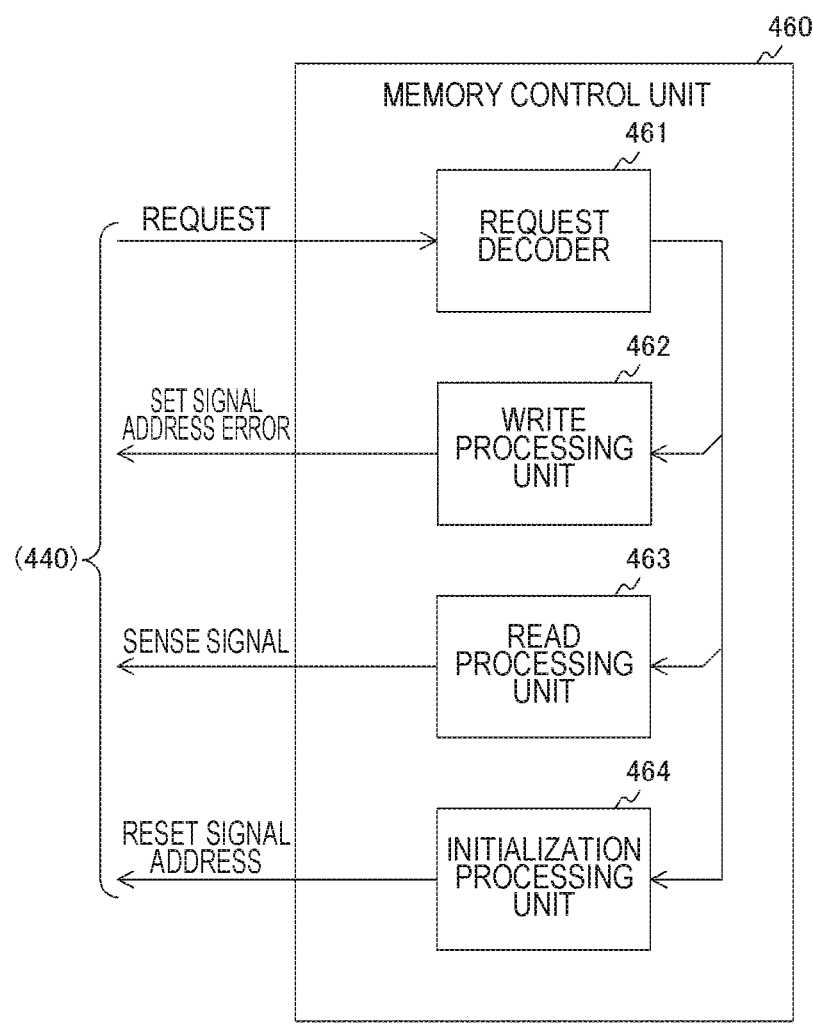
FIG. 13 is a block diagram illustrating a configuration example of a memory control unit in the first embodiment of the present technology.

FIG. 13 is a block diagram illustrating a configuration example of the memory control unit 460 in the first embodiment. The memory control unit 460 includes a request decoder 461, a write processing unit 462, a read processing unit 463, a read processing unit 463, and an initialization processing unit 464.

The request decoder 461 decodes the request from the memory controller 300. The request decoder 461 supplies a decoding result to the write processing unit 462, the read processing unit 463, and the initialization processing unit 464.

The write processing unit 462 writes the write data. In response to the write request, the write processing unit 462 writes data at the designated address in accordance with the set signal. However, if the addresses are designated in the descending order, the write processing unit 462 returns an address error to the memory controller 300.

The read processing unit 463 reads data from the memory cell 540. In response to the read request, the read processing unit 463 reads out the read data from the designated address in accordance with the sense signal.

The initialization processing unit 464 initializes the memory cell 540. In response to the write enable request, the initialization processing unit 464 generates the addresses one by one in the ascending order, supplies the addresses to the address decoder 430, and initializes the addresses in accordance with the reset signal.

Figure 14:
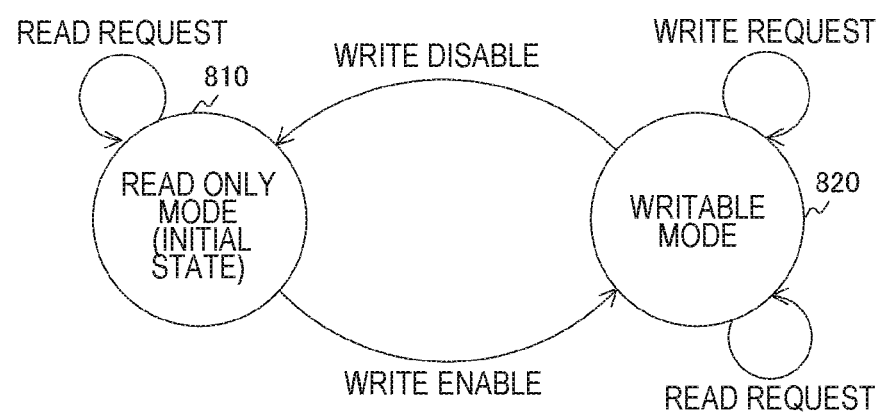
FIG. 14 is a diagram illustrating an example of a state transition diagram of a memory module in the first embodiment of the present technology.

FIG. 14 is a diagram illustrating an example of a state transition diagram of the memory module 200 in the first embodiment. The status of the memory module 200 includes a read only mode 810 and a writable mode 820. An initial state such as the time of activation is set in, for example, the read only mode 810.

In the read only mode 810, if the data erasing command is issued by the host computer 100, the memory controller 300 initializes the non-volatile memory 400 in accordance with the write enable request. Then, the memory controller 300 causes the state to transition to the writable mode 820.

Further, in the writable mode 820, if the write command is issued by the host computer 100, the memory controller 300 selects the addresses in the descending order and writes the write data in accordance with the write request. If the writing at the address ADDmin is completed, the memory controller 300 generates the write disable request and causes the state to transition to the read only mode 810.

Further, in both the read only mode 810 and the writable mode 820, if the read command is issued by the host computer 100, the memory controller 300 reads read data in accordance with the read request.

Figure 15:
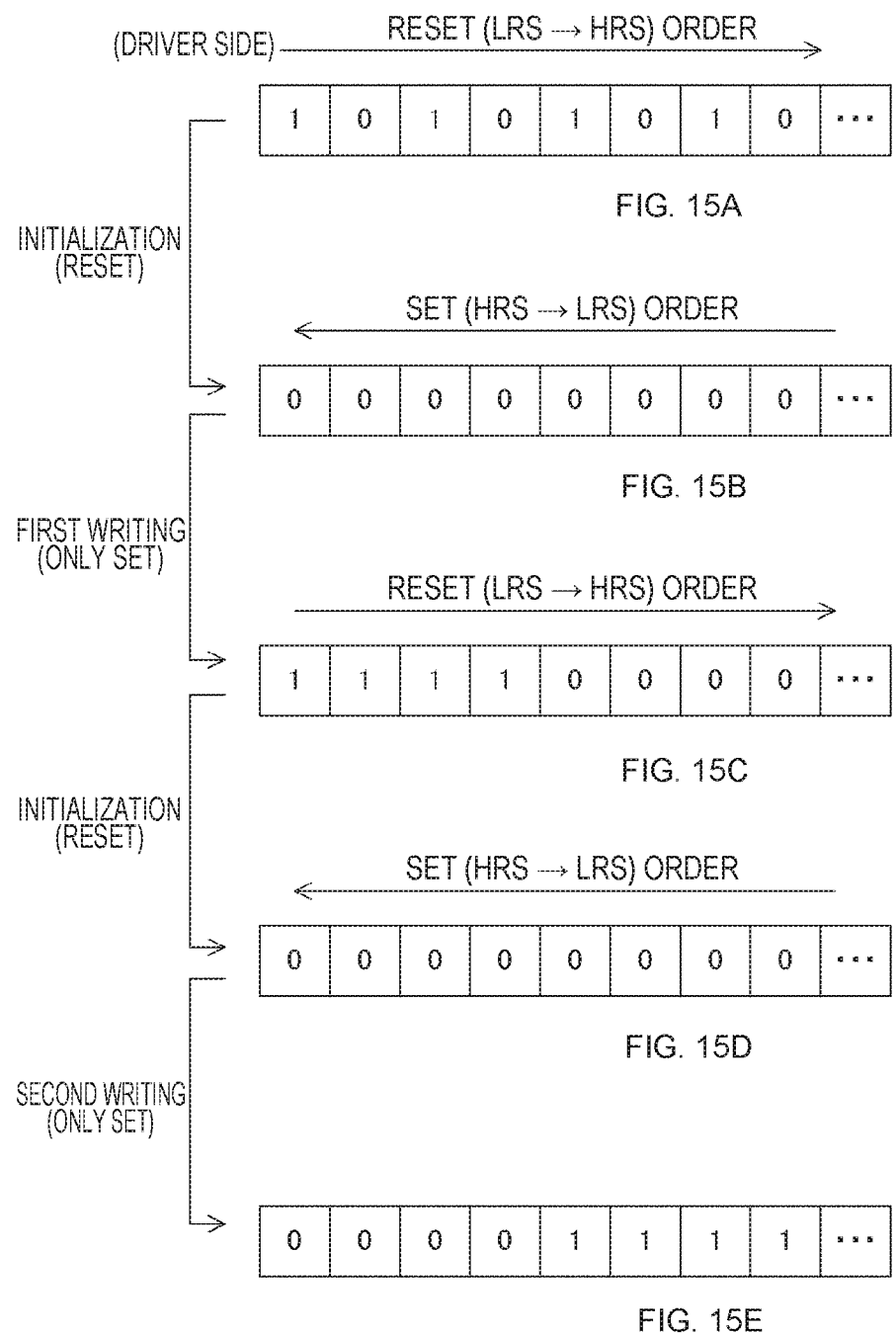
FIGS. 15A, 15B, 15C, 15D, and 15E is a are diagrams for describing a rewrite order of a non-volatile memory in the first embodiment of the present technology.

FIGS. 15A, 15B, 15C, 15D, and 15E are diagrams for describing a rewrite order of the non-volatile memory in the first embodiment. FIG. 15A is a diagram illustrating an example of a status of the memory cell array before the initialization. Data of "1" (LRS) or "0" (HRS) is written in each of the memory cells 540. If the write enable request is generated by the memory controller 300, the non-volatile memory 400 resets the memory cells 540 to "0" (HRS) in order from the memory cell 540 closer to the driver.

FIG. 15B is a diagram illustrating an example of a status of the memory cell array after the initialization. "0" (HRS) is held in all of the memory cells 540. If the write request is generated by the memory controller 300, the non-volatile memory 400 sets the selected cell corresponding to the write data to "1" (LRS) in order from the memory cell 540 farther from the driver.

FIG. 15C illustrates an example of a status of the memory cell array after first writing. For example, write data of "11110000" is held. Then, when data of "00001111" is newly written, the host computer 100 issues the data erasing command again before writing the data. The memory controller 300 generates the write enable request, and the non-volatile memory 400 resets the memory cells to "0" (HRS) in order from the memory cell 540 closer to the driver. If the memory controller 300 generates the write request after the initialization is performed as illustrated in FIG. 15D, the non-volatile memory 400 sets the selected cells corresponding to the write data to "1" (LRS) in order from the memory cell 540 farther from the driver.

FIG. 15E illustrates an example of a status of the memory cell array after second writing. Through the second writing, write data of "00001111" is held.

Figure 16:
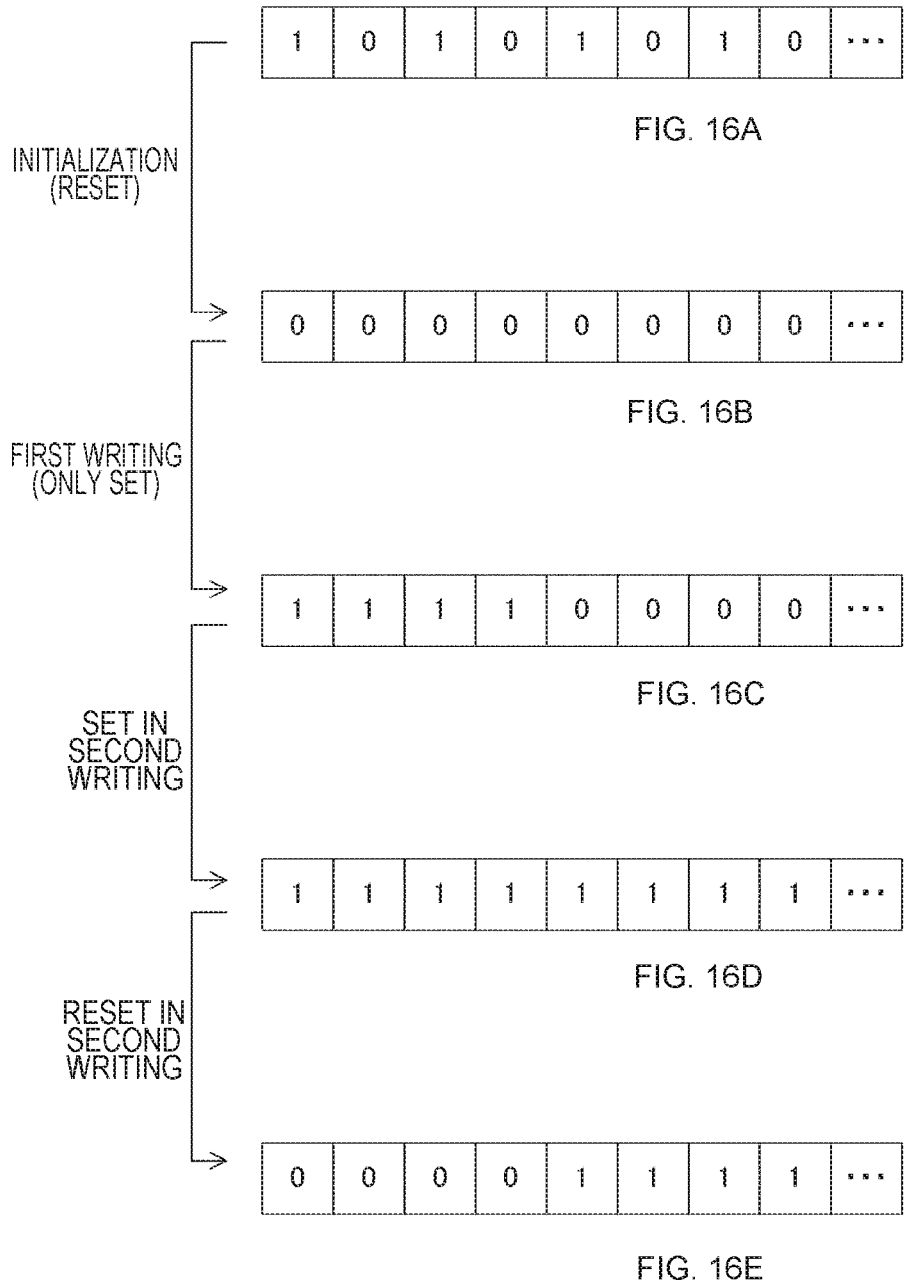
FIGS. 16A, 16B, 16C, 16D, and 16E are diagrams for describing a rewrite order of a non-volatile memory in a comparative example.

FIGS. 16A, 16B, 16C, 16D, and 16E are diagrams for describing a rewrite order of a non-volatile memory in a comparative example. In the comparative example, the memory controller 300 is assumed to read preread data before writing and perform setting and resetting in order on the basis of a comparison result of the preread data and the write data. FIG. 16A illustrates a status of the memory cell array before the initialization, and FIG. 16B illustrates a status of the memory cell array after the initialization. All the memory cells of the memory cell array are initialized to, for example, "0" (LRS).

"11110000" and "00001111" are assumed to be sequentially written in the memory cell array. FIG. 16C illustrates an example of a status of the memory cell array after first writing. Since all the memory cells are initialized to "0," only 4 bits from the head are set to "1," and the resetting is not performed.

FIG. 16D illustrates an example of a status of the memory cell array after the setting in the second writing is performed. Since the preread data is "11110000," and the write data is "00001111," the memory cells after a 5-th bit from the head are set to "1." As a result, "11111111" is held.

FIG. 16E illustrates an example of a status of the memory cell array after the resetting in the second writing. Since the preread data is "11110000," and the write data is "00001111," the memory cells from a 1-st bit to a 4-th bit are reset to "0." As a result, "00001111" is written.

As illustrated in FIGS. 16A, 16B, 16C, 16D, and 16E, in the comparative example in which the initialization is not performed just before the writing each time the writing is performed, the number of bits of "1" (LRS) increases as the number of bits to be rewritten increases as illustrated by FIG. 16D. Therefore, the leakage current becomes relatively large, and the fluctuation of the IR drop increases.

On the other hand, if the initialization is performed just before the writing each time the writing is performed, the number of bits of "1" becomes smaller than in FIG. 16D at any time point in FIGS. 15A, 15B, 15C, 15D, and 15E. For this reason, the leakage current becomes relatively small, and the fluctuation of the IR drop can be suppressed.

Operation Example of Memory System

Figure 17:
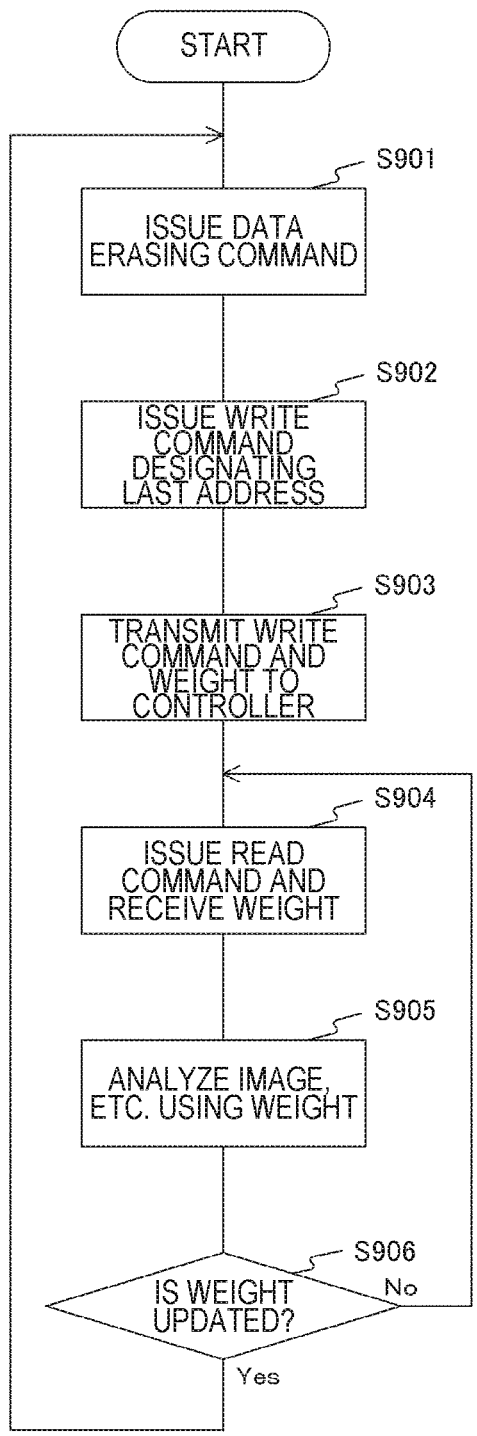
FIG. 17 is a flowchart illustrating an example of an operation of the host computer in the first embodiment of the present technology.

FIG. 17 is a flowchart illustrating an example of an operation of the host computer 100 in the first embodiment. This operation is started, for example, when the memory system is powered on.

The host computer 100 issues the data erasing command and supplies the data erasing command to the memory controller 300 (step S901). Then, the host computer 100 issues the write command designating the last address (step S902). Further, the host computer generates the weight, and transmits the write command and the weight to the memory controller 300 (step S903).

Then, the host computer 100 issues the read command, supplies the read command to the memory controller 300, and receives the read weight from the memory controller 300 (step S904). The host computer 100 analyzes an image or the like using the weight (step S905). Then, the host computer 100 determines whether or not the weight is updated (step S906).

In a case in which the weight is not updated (No in step S906), the host computer 100 repeatedly executes step S904 and subsequent steps. On the other hand, in a case in which the weight is updated (Yes in step S906), the host computer 100 repeatedly executes step S901 and subsequent steps.

Figure 18:
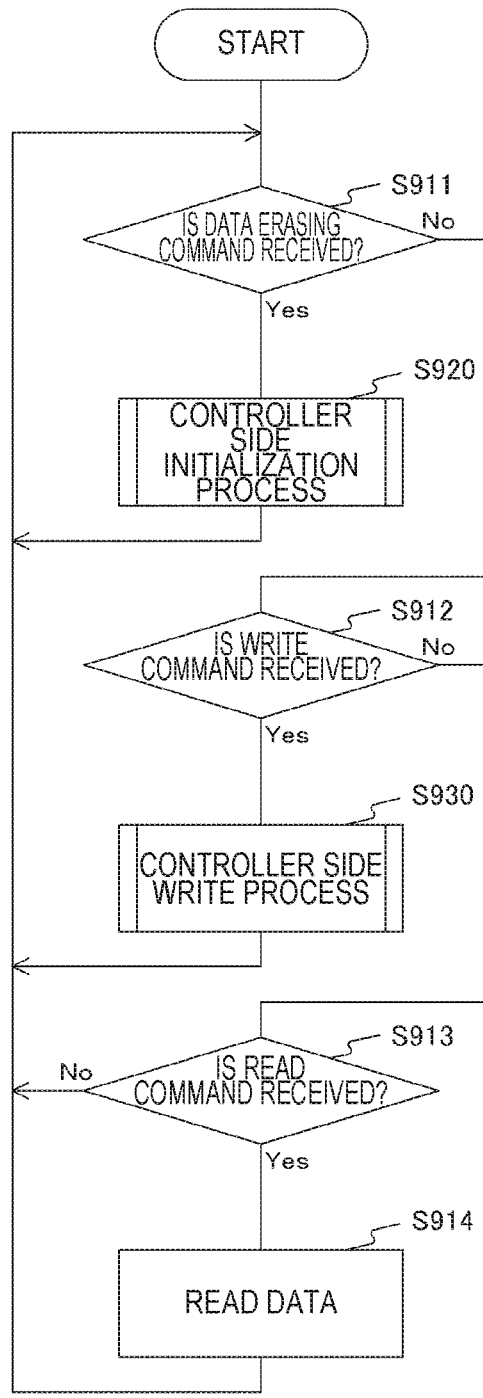
FIG. 18 is a flowchart illustrating an example of an operation of a memory controller in the first embodiment of the present technology.

FIG. 18 is a flowchart illustrating an example of an operation of the memory controller 300 in the first embodiment. This operation is started, for example, when the memory system is powered on.

The memory controller 300 determines whether or not the data erasing command is received from the host computer 100 (step S911). In a case in which the data erasing command is received (Yes in step S911), the memory controller 300 executes a controller side initialization process for initializing the non-volatile memory 400 (step S920).

On the other hand, in a case in which the data erasing command is not received (No in step S911), the memory controller 300 determines whether or not the write command is received (step S912). In a case in which the write command is received (Yes in step S912), the memory controller 300 executes a controller side write process for writing data in the non-volatile memory 400 (step S930).

On the other hand, in a case in which the write command is not received (No in step S912), the memory controller 300 determines whether or not the read command is received (step S913). In a case in which the read command is received (Yes in step S913), the memory controller 300 reads the read data from the non-volatile memory 400 (step S914).

In a case in which the read command is not received (No in step S913) or after step S920, step S930, or step S914, the memory controller 300 repeatedly executes step S911 and subsequent steps.

Figure 19:
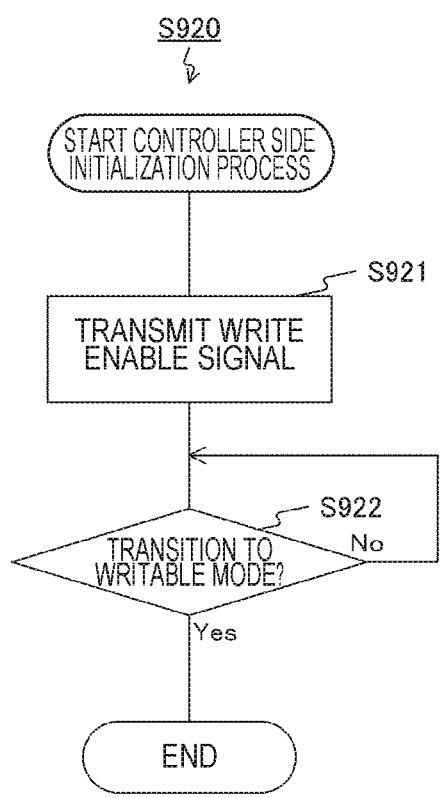
FIG. 19 is a flowchart illustrating an example of a controller side initialization process in the first embodiment of the present technology.

FIG. 19 is a flowchart illustrating an example of the controller side initialization process in the first embodiment. The memory controller 300 transmits the write enable request to the non-volatile memory 400 (step S921). Then, the memory controller 300 determines whether or not it transitions to the writable mode upon the completion of the initialization of the non-volatile memory 400 (step S922). In a case in which it does not transition to the writable mode (No in step S922), the memory controller 300 repeats step S922, and in a case in which it transitions to the writable mode (Yes in step S922), the memory controller 300 ends the controller side initialization process.

Figure 20:
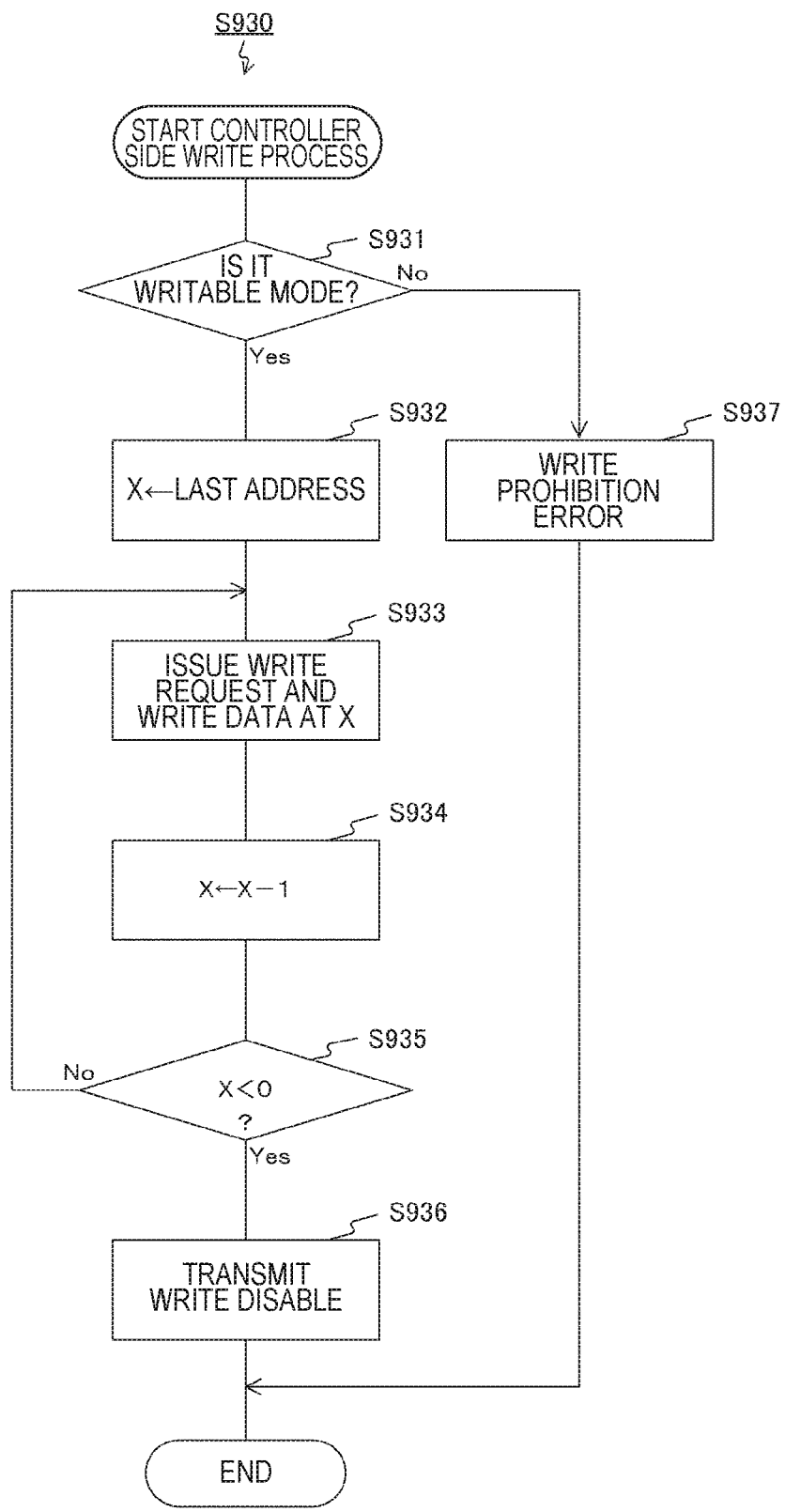
FIG. 20 is a flowchart illustrating an example of a controller side write process in the first embodiment of the present technology.

FIG. 20 is a flowchart illustrating an example of the controller side write process in the first embodiment. The memory controller 300 determines whether or not the memory module 200 is in the writable mode (step S931). In a case in which the memory module 200 is in the writable mode (Yes in step S931), the memory controller 300 stores the last address designated by the host computer 100 in a variable X (step S932).

Further, the memory controller 300 issues the write request, writes data at the write address (X) (step S933), and decrements the variable X (step S934). The memory controller 300 determines whether or not the variable X is smaller than "0" (step S935). In a case in which the variable X is equal to or larger than "0" (No in step S935), the memory controller 300 repeatedly executes step S933 and subsequent steps.

On the other hand, in a case in which the variable X is smaller than "0" (step Yes in S935), the memory controller 300 transmits the write disable request to the non-volatile memory 400 (step S936).

Further, if the memory module 200 is not in the writable mode (No in step S931), the memory controller 300 transmits the write prohibit error to the host computer 100 (step S937). After step S936 or S937, the memory controller 300 ends the controller side write process.

Figure 21:
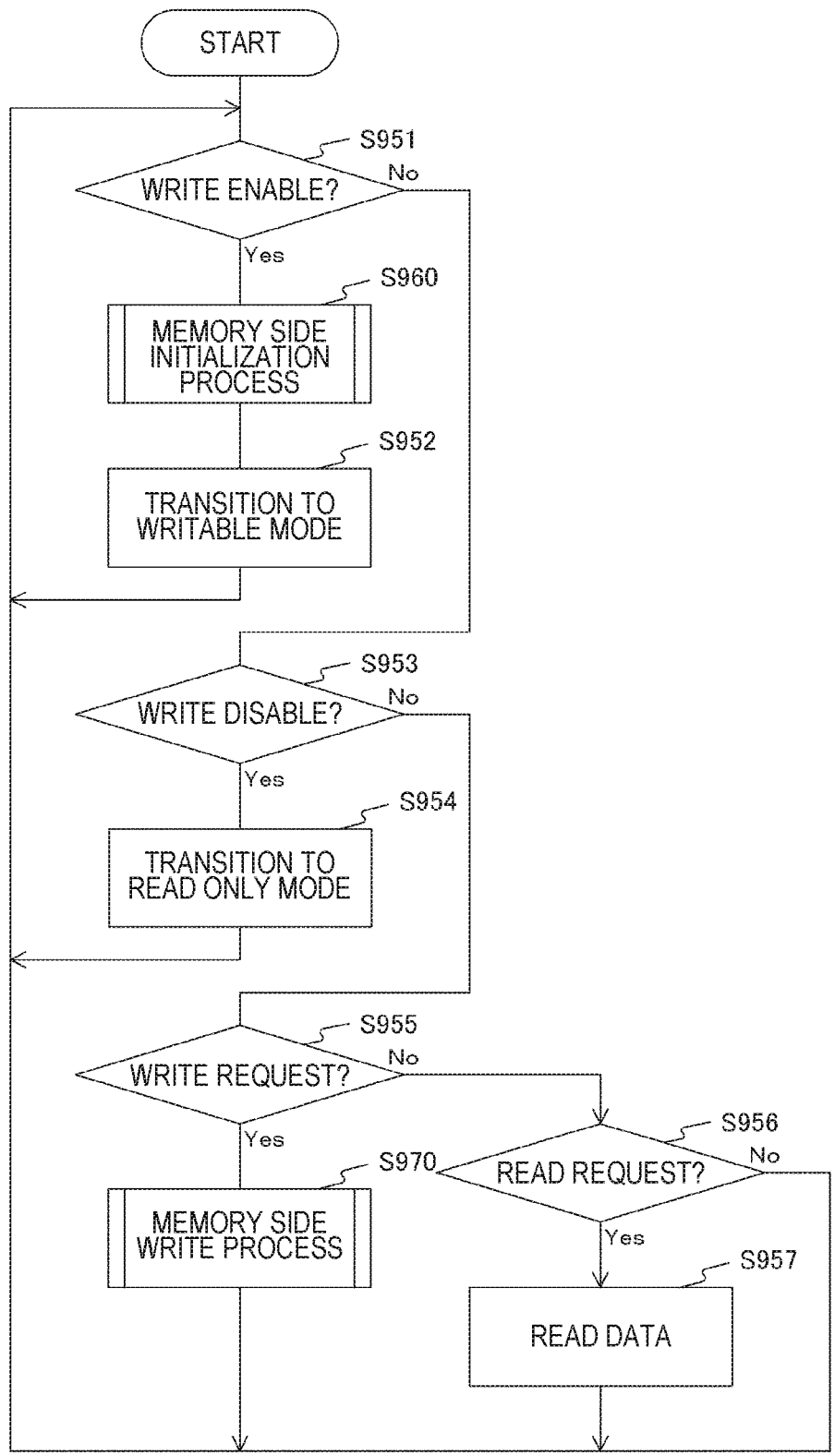
FIG. 21 is a flowchart illustrating an example of an operation of a non-volatile memory in the first embodiment of the present technology.

FIG. 21 is a flowchart illustrating an example of the operation of the non-volatile memory 400 in the first embodiment. This operation is started, for example, when the memory system is powered on.

The non-volatile memory 400 determines whether or not the write enable request is received from the memory controller 300 (step S951). In a case in which the write enable request is received (Yes in step S951), the non-volatile memory 400 executes the memory side initialization process for the initialization (step S960) and transitions to the writable mode (step S952).

On the other hand, in a case in which the write enable request is not received (No in step S951), the non-volatile memory 400 determines whether or not the write disable request is received (step S953). In a case in which the write disable request is received (Yes in step S953), the non-volatile memory 400 transitions to the read only mode (step S954).

Further, in a case in which the write disable request is not received (No in step S953), the non-volatile memory 400 determines whether or not the write request is received (step S955). In a case in which the write request is received (Yes in step S955), the non-volatile memory 400 executes the memory side write process for writing data (step S970).

In a case in which the write request is not received (No in step S955), the non-volatile memory 400 determines whether or not the read request is received (step S956). In a case in which the read request is received (Yes in step S956), the non-volatile memory 400 reads the read data (step S957).

In a case in which the read request is not received (No in step S956) or after step S952, S954, S970, or step S957, the non-volatile memory 400 repeatedly executes step S951 and subsequent steps.

Figure 22:
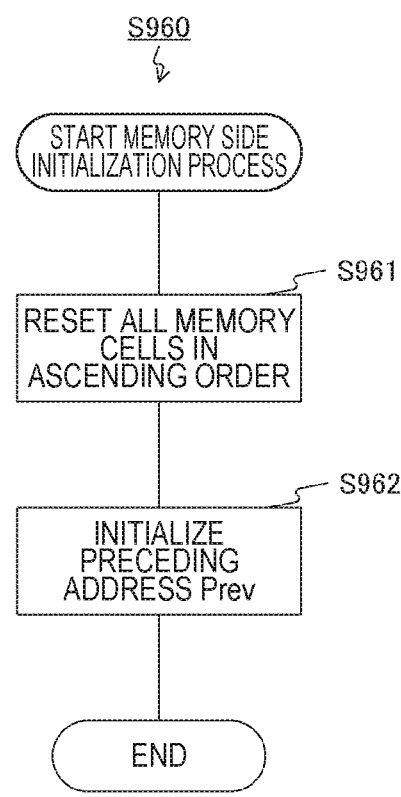
FIG. 22 is a flowchart illustrating an example of a memory side initialization process in the first embodiment of the present technology.

FIG. 22 is a flowchart illustrating an example of the memory side initialization process in the first embodiment. The non-volatile memory 400 selects the addresses in the ascending order and resets all the memory cells 540 (step S961). Then, the non-volatile memory 400 initializes a preceding address Prev to the address ADDmax (step S962) and ends the memory side initialization process. The preceding address Prev indicates that the address having a larger number than the preceding address Prev is prohibited from being set.

Figure 23:
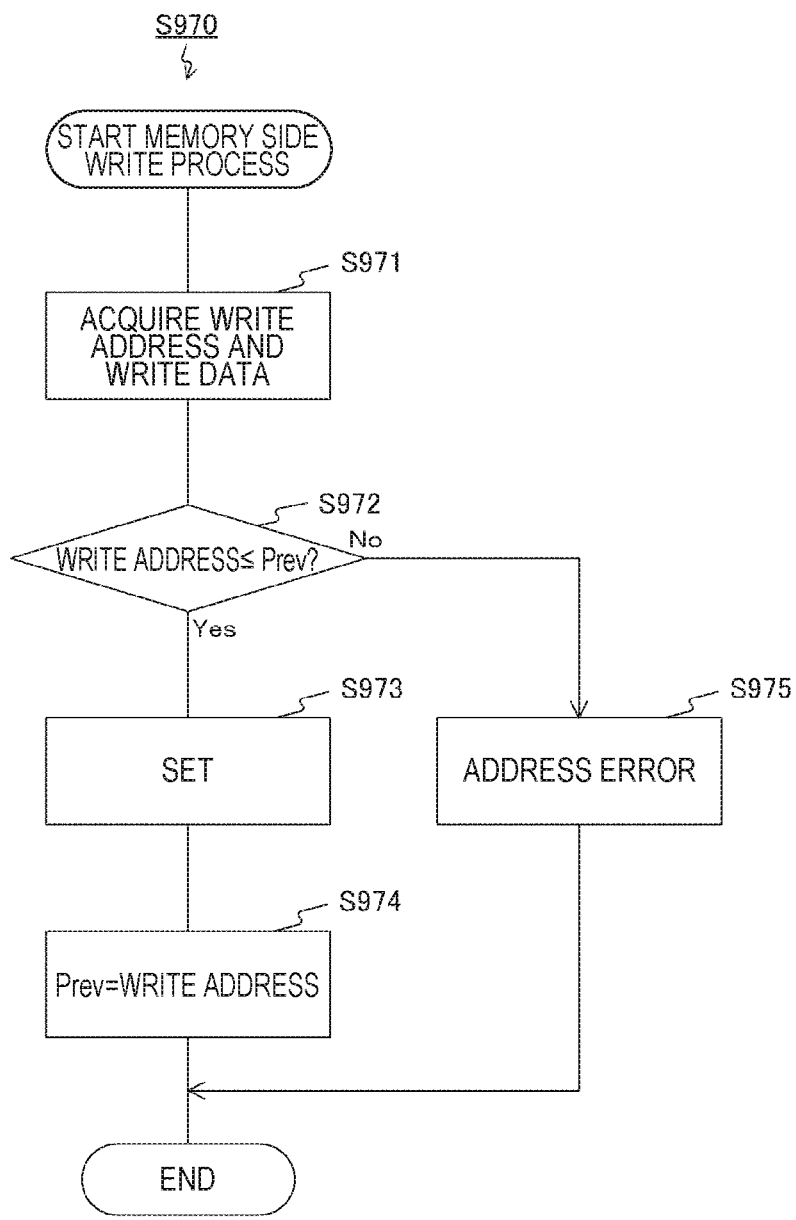
FIG. 23 is a flowchart illustrating an example of a memory side write process in the first embodiment of the present technology.

FIG. 23 is a flowchart illustrating an example of the memory side write process in the first embodiment. The non-volatile memory 400 acquires the write address and the write data from the memory controller 300 (step S971). Then, the non-volatile memory 400 determines whether or not the write address is equal to or less than the preceding address Prev (step S972). In a case in which the write address is equal to or less than the preceding address Prev (Yes in step S972), the non-volatile memory 400 sets the memory cell 540 on the basis of the write data (step S973). Then, the non-volatile memory 400 updates the preceding address Prev with the write address (step S974).

On the other hand, in a case in which the write address is larger than the preceding address Prev (No in step S972), the non-volatile memory 400 generates the address error and transmits the address error to the memory controller 300 (step S975). After step S974 or step S975, the non-volatile memory 400 ends the memory side write process.

Figure 24:
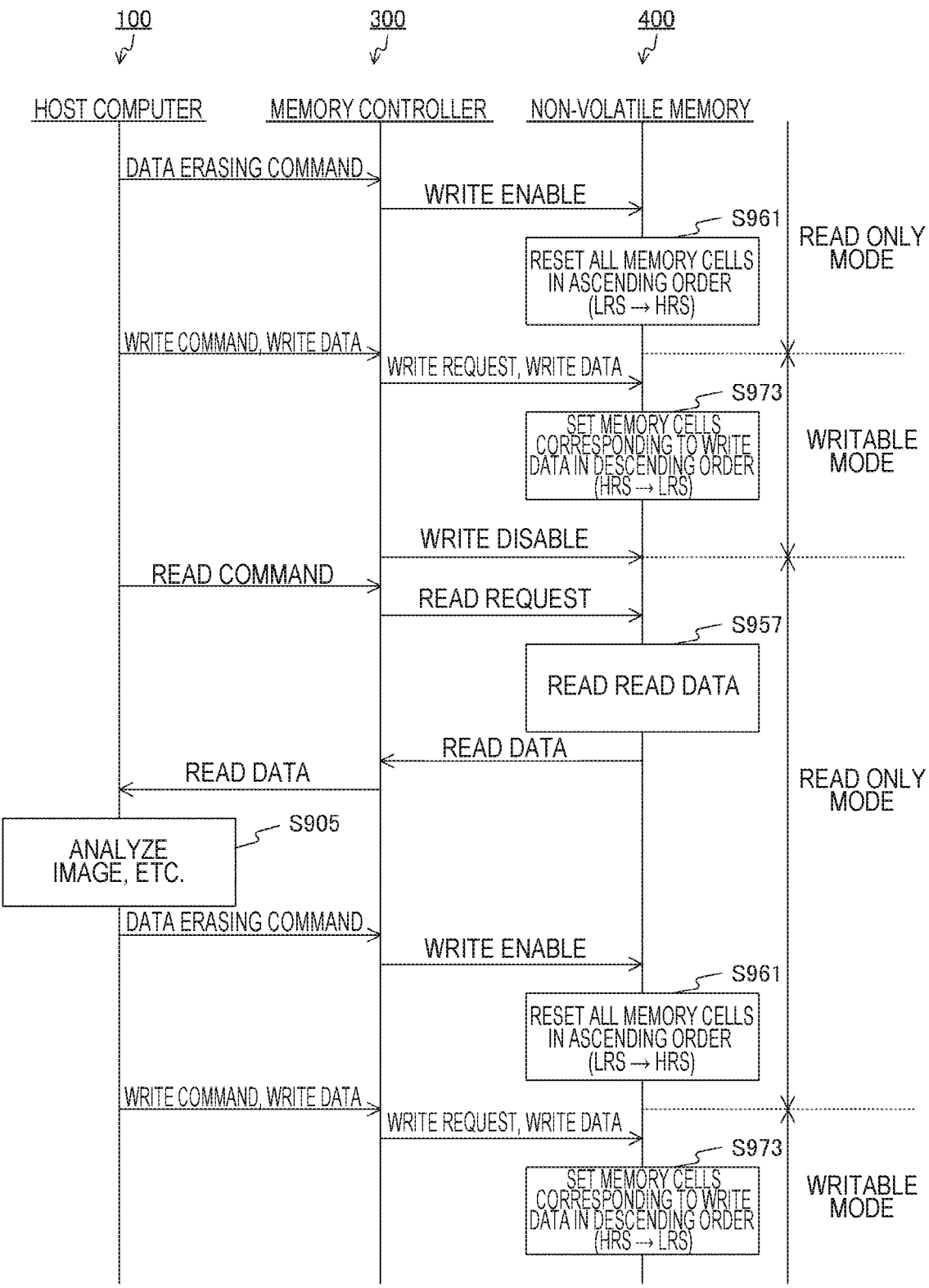
FIG. 24 is a sequence diagram illustrating an example of an operation of a memory system in the first embodiment of the present technology.

FIG. 24 is a sequence diagram illustrating an example of an operation of the memory system in the first embodiment. If the host computer 100 transmits the data erasing command, the memory controller 300 transmits the write enable request to the non-volatile memory 400 in accordance with the command.

The non-volatile memory 400 resets (initializes) all the memory cells 540 to the HRS in the ascending order (step S961). Accordingly, the memory module 200 transitions from the read only mode to the writable mode.

If the host computer 100 transmits the write command and the write data in the writable mode, the memory controller 300 transmits the write request and the write data to the non-volatile memory 400 in accordance with the command. The non-volatile memory 400 sets the memory cells corresponding to the write data to the LRS in the descending order (step S973). If the writing for all the write data is completed, the memory module 200 transitions from the writable mode to the read only mode.

If the host computer 100 transmits the read command in the read only mode, the memory controller 300 transmits the read request to the non-volatile memory 400 in accordance with the command. The non-volatile memory 400 reads the read data in accordance with the request (step S957).

The host computer 100 receives the read data via the memory controller 300 and analyzes an image or the like on the basis of the data (step S905). Then, when the weight is updated, the host computer 100 transmits the data erasing command again, and the non-volatile memory 400 is initialized again in step S961. Accordingly, the memory module 200 transitions from the read only mode to the writable mode.

If the host computer 100 transmits the write command and the write data in the writable mode, the non-volatile memory 400 sets the memory cell corresponding to the write data (step S973).

As described above, the host computer 100 initializes the non-volatile memory 400 by issuing the data erasing command just before writing the write data each time the write data is written.

Figure 25:
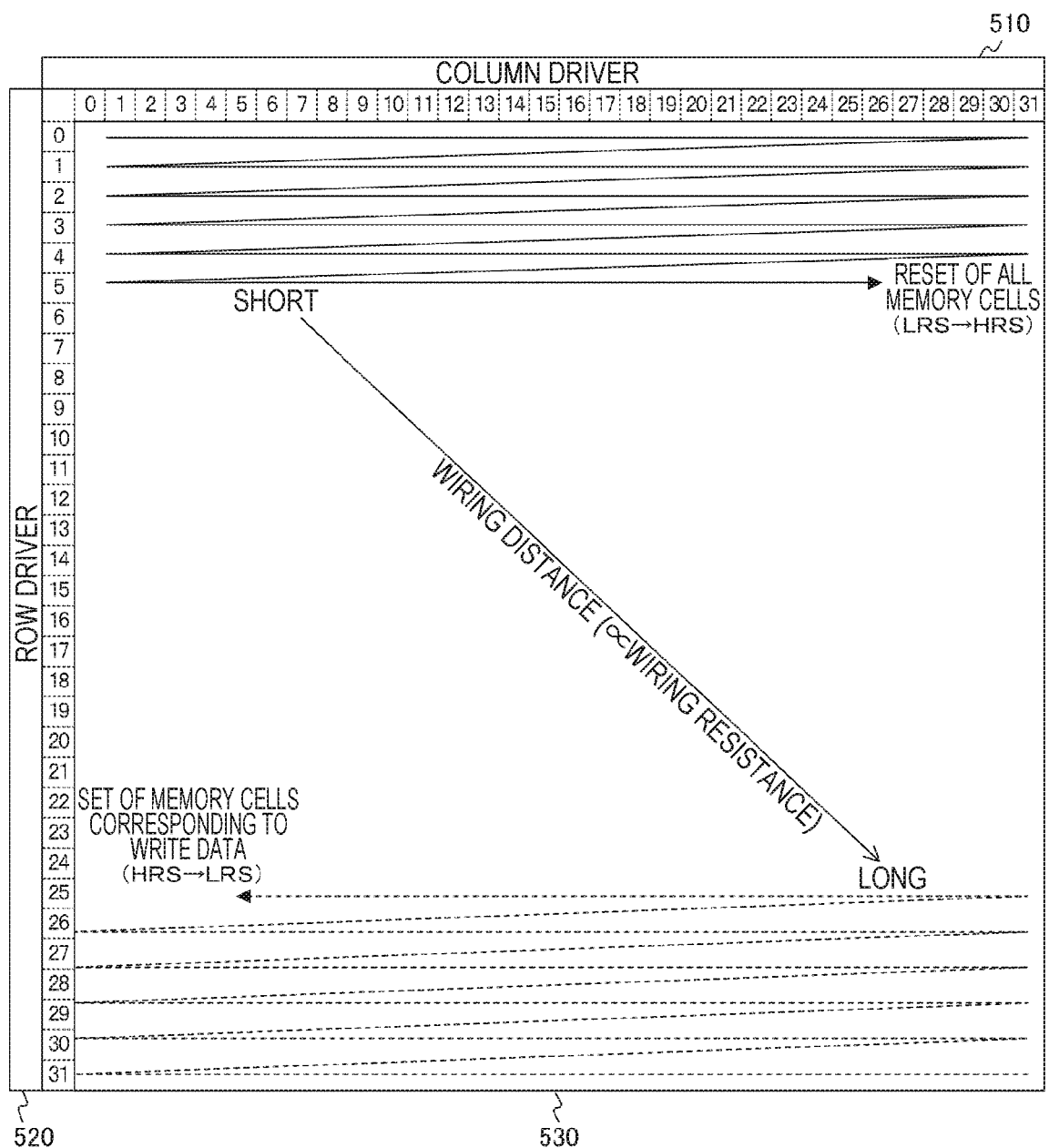
FIG. 25 is a diagram illustrating an example of a rewrite order of a non-volatile memory in the first embodiment of the present technology.

FIG. 25 is a diagram illustrating an example of the rewrite order of the non-volatile memory 400 in the first embodiment. The wiring distance to the column driver 510 or the row driver 520 is smallest at an upper left corner and largest at a lower right corner. In this case, in the initialization, the column driver 510 or the row driver 520 selects the memory cells 540 in order from the upper left to the lower right (that is, in the ascending order of the wiring distances) and resets the memory cells 540 to the HRS. Accordingly, as the number of reset memory cells increases, the wiring resistance increases, while the leakage current decreases, and thus the fluctuation of the IR drop can be suppressed.

Further, in the writing, the column driver 510 or the row driver 520 selects the memory cells 540 corresponding to the write data in order from the lower right to the upper left (that is, in the descending order of the wiring distances) and sets the memory cells 540 to the LRS. Accordingly, the leakage current increases with the increase in the number of set memory cells, but the wiring resistance decreases, and thus the fluctuation of the IR drop can be suppressed.

Since the fluctuation of the IR drop is suppressed, the variations in the writing time can be suppressed. Further, the margin of the power source can be increased.

As described above, according to the first embodiment of the present technology, if all the memory cells are initialized to the HRS, the memory cells transition to the writable mode, and if the write process is completed, the memory cells transition to the read only mode, and thus it is possible to reduce the leakage current through the initialization before the write process. Accordingly, it is possible to minimize the fluctuation of the IR drop in the write process.

First Modified Example

In the first embodiment described above, one row driver and one column driver are disposed, but in this configuration, an inter-line distance between adjacent column lines or adjacent row lines is reduced with the increase in the density of non-volatile memories, and thus it may be difficult to implement. A memory array unit 500 of the first modified example in this first embodiment differs from the first embodiment in that the inter-line distance between the column lines or the row lines is increased.

Figure 26:
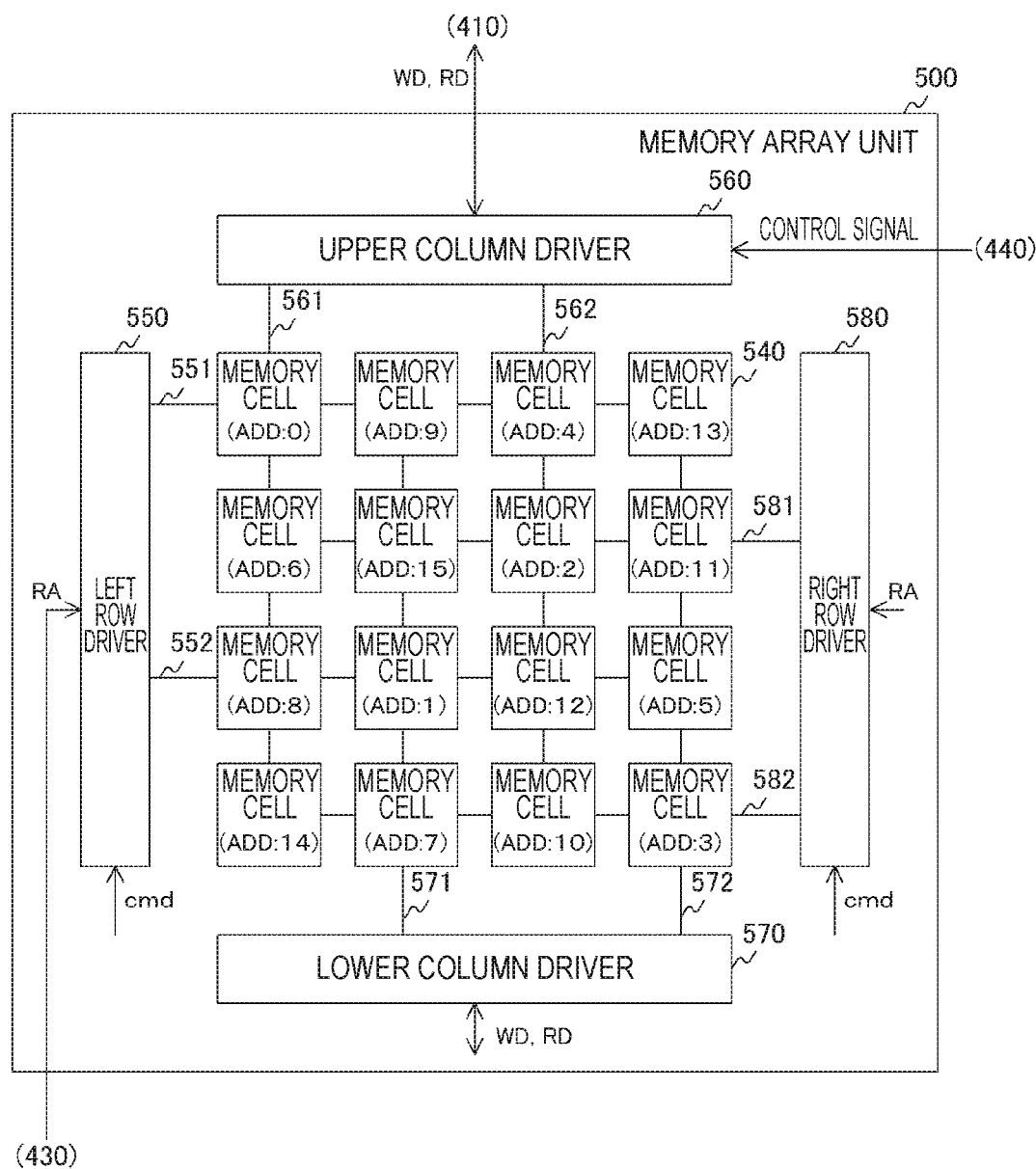
FIG. 26 is a block diagram illustrating a configuration example of a memory array unit in a first modified example of the first embodiment of the present technology.

FIG. 26 is a block diagram illustrating a configuration example of the memory array unit 500 in the first modified example of the first embodiment. The memory array unit 500 of the first modified example differs from the first embodiment in that two column drivers and two row drivers are disposed. For example, instead of the column driver 510 and the row driver 520, a left row driver 550, an upper column driver 560, a lower column driver 570, and a right row driver 580 are disposed.

The upper column driver 560 drives odd-numbered columns, and the lower column driver 570 drives even-numbered columns. Further, the left row driver 550 drives odd-numbered rows, and the right row driver 580 drives even-numbered rows. Since the two column drivers and the two row drivers are disposed as described above, the number of columns per driver and the number of rows per driver are reduced as compared with the case in which one column driver and one row driver are disposed, and thus the inter-line distance between the column lines and the row lines can be increased. Accordingly, the density of the non-volatile memory can be increased. Alternatively, it becomes easy to implement.

Further, the left row driver 550 is an example of an odd-numbered row driver described in claims set forth below, and the right row driver 580 is an example of an even-numbered row driver described in claims set forth below. Further, the upper column driver 560 is an example of an odd-numbered column driver described in claims set forth below, and the lower column driver 570 is an example of an even-numbered column driver described in claims set forth below.

In this first modified example, an address of a number corresponding to the wiring distance from the driver is allocated to each of the memory cells 540. For example, numbers are allocated to the memory cells 540 which are connected to the same odd-numbered row line and connected to the odd-numbered column line such that smaller numbers are allocated to the memory cells 540 closer to the left row driver 550. The same applies to the memory cells 540 which are connected to the same odd-numbered row line and connected to the even-numbered column line. Further, numbers are allocated to the memory cells 540 which are connected to the same even-numbered row line and connected to the odd-numbered column line such that smaller numbers are allocated to the memory cells 540 closer to the right row driver 580. The same applies to the memory cell 540 which are connected to the same odd-numbered row line and connected to the even-numbered column line.

Further, in the first modified example, a larger number is allocated as the wiring distance is longer, but a smaller number may be allocated as the wiring distance is longer. In this case, the memory system may designate the addresses in the descending order in the initialization and designate the addresses in the ascending order in the write process. Further, although the two column drivers and the two row drivers are disposed, one of the number of column drivers and the number of row drivers may be two, and the other may be one.

As described above, according to the first modified example of the first embodiment of the present technology, since the two column drivers and the two row drivers are disposed, it is possible to increase the inter-line distance between the column lines and the row lines as compared with the case in which one column driver and one row driver are disposed.

Second Modified Example

In the first embodiment described above, the memory system performs control such that all the memory cells become the HRS in the initialization, but as the number of memory cells increases, a time required for the initialization and power consumption increase. From a viewpoint for reducing the initialization time and the power consumption, it is desirable to reduce the number of memory cells to be initialized to HRS to some extent. For example, since the memory cells less than the last address (the maximum value) of the write address to be rewritten to the LRS have little influence on the voltage margin even in a case in which they are not initialized to the HRS, it is possible to exclude the memory cells corresponding to the address equal to or larger than the maximum value from the initialization target. The memory system of the second modified example of the first embodiment differs from the first embodiment in that the number of memory cells to be initialized is reduced.

Figure 27:
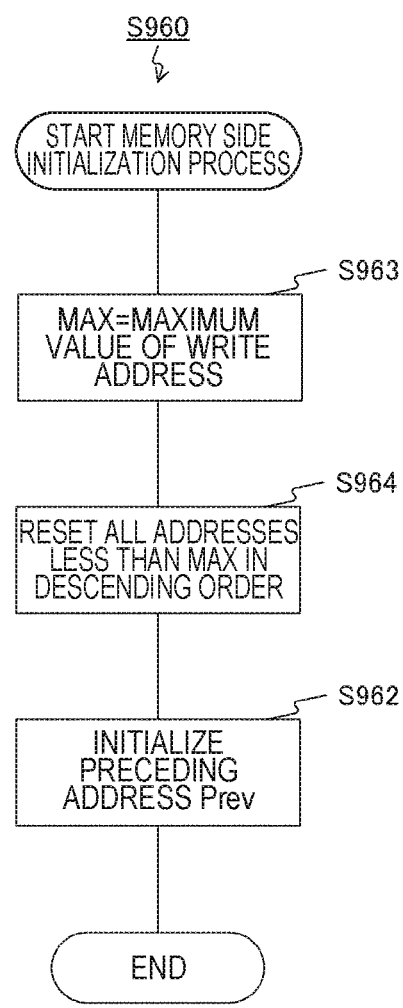
FIG. 27 is a flowchart illustrating an example of a memory side initialization process in a second modified example of the first embodiment of the present technology.

FIG. 27 is a flowchart illustrating an example of a memory side initialization process in a second modified example of the first embodiment. The memory side initialization process in this second modified example differs from the first embodiment in that the non-volatile memory 400 executes steps S963 and S964 instead of step S961.

The non-volatile memory 400 receives the maximum value of the write address from the memory controller 300, and updates the variable MAX in accordance with the maximum value (step S963). The non-volatile memory 400 designates all the addresses less than MAX in the descending order and resets the addresses to the HRS (step S964). Then, the non-volatile memory 400 initializes the preceding address Prev (step S962).

Further, an address of a larger number is allocated as the wiring distance is longer, but conversely, a configuration in which an address of a smaller number is allocated as the wiring distance is longer may be employed. In this case, the memory cells equal to or less than the minimum value of the write address are excluded from the initialization target.

As described above, according to the second modified example of the first embodiment of the present technology, since only the memory cells corresponding to the addresses less than the maximum value of the write address are initialized, it is possible to reduce the number of memory cells to be initialized as compared with the case in which all the memory cells are initialized.

Third Modified Example

In the first modified example, since only the memory cells corresponding to the addresses less than the maximum value of the write address are initialized, the number of memory cells to be initialized is reduced, but it is possible to further reduce the number of memory cells. For example, a case in which an address range from the start address (minimum value) to the last address (maximum value) of the write address is designated is considered. In this case, it is preferable that the non-volatile memory 400 initialize the memory cells in the address range and the memory cells in a region closer to the driver than the range in the ascending order. The memory system of the third modified example of this first embodiment differs from the second modified example in that the number of memory cells to be initialized is further reduced.

Figure 28:
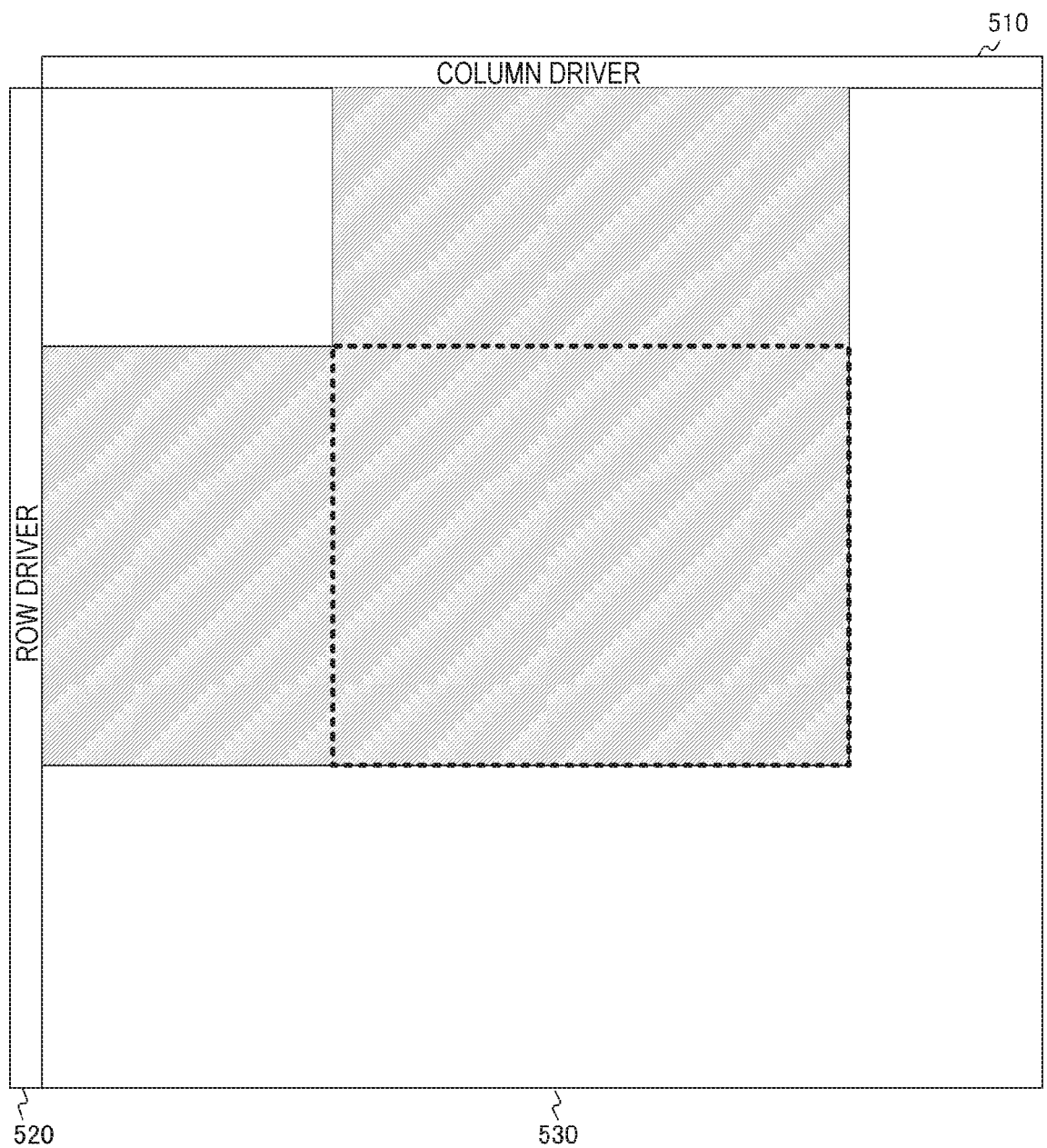
FIG. 28 is a diagram illustrating an example of an initialization range in a third modified example of the first embodiment of the present technology.

FIG. 28 is a diagram illustrating an example of an initialization range in the third modified example of the first embodiment. In FIG. 28, a region surrounded by a dotted line indicates the address range from the minimum value to the maximum value of the write address. Further, a hatched region indicates the initialization range including the memory cells to be initialized. As illustrated in FIG. 28, the memory cells in the address range and the memory cells in the region closer to the driver than the address range are initialized in the ascending order.

Figure 29:
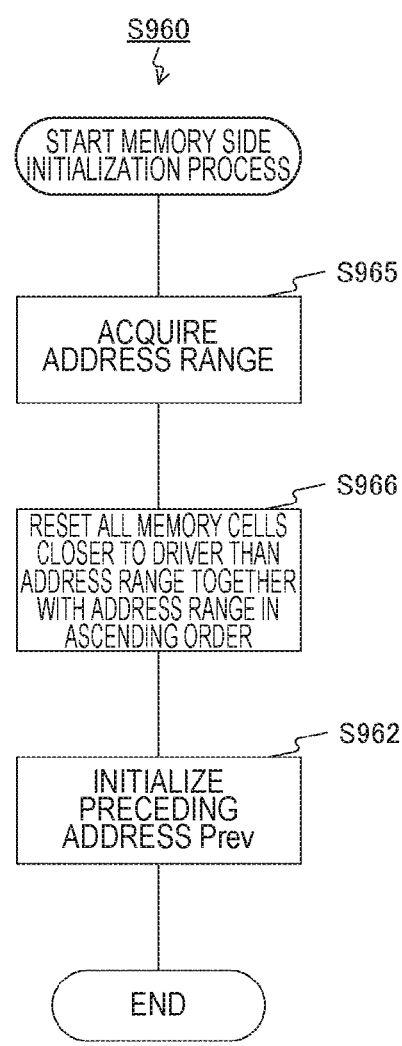
FIG. 29 is a flowchart illustrating an example of a memory side initialization process in the third modified example of the first embodiment of the present technology.

FIG. 29 is a flowchart illustrating an example of a memory side initialization process in a third modified example of the first embodiment. The memory side initialization process in the third modified example differs from the first embodiment in that the non-volatile memory 400 executes steps S965 and S966 instead of steps S963 and S964.

The non-volatile memory 400 acquires the addresses from the memory controller 300 (step S965), and resets all the memory cells closer to the driver than the address range to the HRS together with the address range in the ascending order (step S966). Then, the non-volatile memory 400 initializes the preceding address Prev (step S962).

As described above, according to the third modified example of the first embodiment of the present technology, only the memory cells in the address range and the memory cells closer to the driver than the range are initialized, and thus it is possible to further reduce the number of memory cells to be initialized.

Fourth Modified Example

In the first embodiment described above, the memory system performs control such that all the memory cells becomes the HRS in the initialization, but from the viewpoint of reducing the time required for the initialization and the power consumption, it is desirable to reduce the number of memory cells to be initialized to the HRS to some extent. For example, the memory cells around the driver are relatively small in the wiring distance, and the wiring resistance is small. Therefore, even if such memory cells are not initialized to the HRS, there is little influence on the voltage margin. A non-volatile memory 400 of a fourth modified example in the first embodiment differs from the first embodiment in that the number of memory cells to be initialized is reduced.

Figure 30:
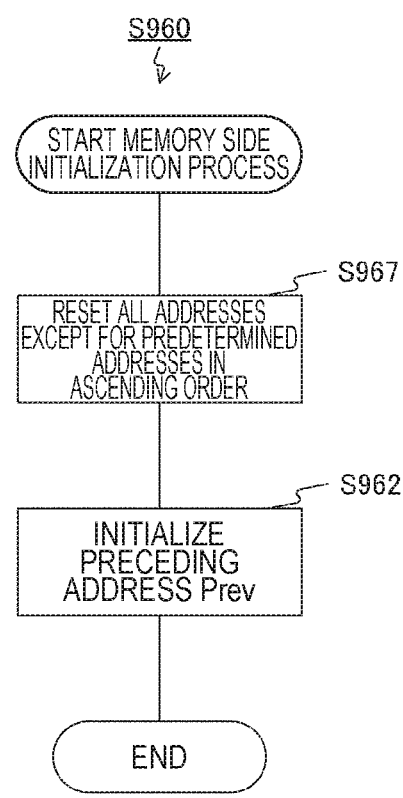
FIG. 30 is a flowchart illustrating an example of a memory side initialization process in a fourth modified example of the first embodiment of the present technology.

FIG. 30 is a flowchart illustrating an example of the memory side initialization process in the fourth modified example of the first embodiment. The memory side initialization process in the fourth modified example differs from the first embodiment in that the non-volatile memory 400 executes step S967 instead of step S961.

The non-volatile memory 400 designates all the addresses in the ascending order and resets the memory cells to the HRS except for predetermined addresses corresponding to memory cells whose wiring distance to the driver is equal to or less than a predetermined distance. In other words, only the memory cells whose wiring distance to the driver is larger than the predetermined distance are initialized (step S967). For example, all addresses excluding "0," "1," and "4" among the addresses "0" to "15" in FIG. 8 are designated in the ascending order. Then, the non-volatile memory 400 initializes the preceding address Prev (step S962).

As described above, according to the fourth modified example of the first embodiment of the present technology, since only the memory cells whose wiring distance to the driver is larger than a predetermined distance are initialized, it is possible to reduce the number of memory cells to be initialized as compared with the case in which all the memory cells are initialized.

Fifth Modified Example

In the first embodiment described above, the memory controller 300 controls the cross point type non-volatile memory in which the wiring layer of the column line and the wiring layer of the row line are stacked, but the non-volatile memory to be controlled is not limited to the cross point type. For example, a vertical 3 dimension (V3D) type may be controlled. A non-volatile memory 400 of a fifth modified example in this first embodiment differs from the first embodiment in that the non-volatile memory to be controlled is a V3D type.

Figure 31:
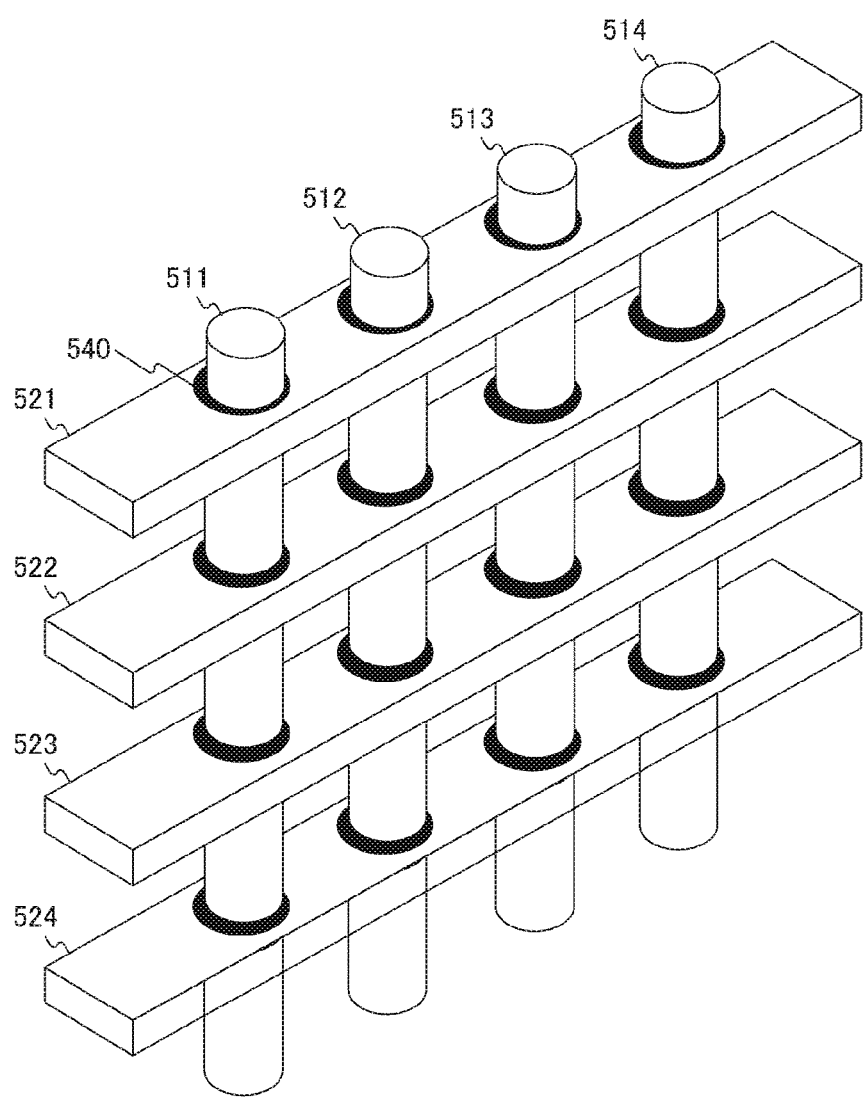
FIG. 31 is a perspective view of a memory cell array in a fifth modified example of the first embodiment of the present technology.

FIG. 31 is a perspective view of a memory cell array 530 in the fifth modified example of the first embodiment. Row lines 521 to 524 are stacked on a semiconductor substrate, and column lines 511 to 514 penetrate the row lines in a stack direction. Further, the memory cell 540 is formed at a position interposed between an inner surface of a through hole on the row line passing the column line and a side surface of the column line.

As described above, according to the fifth modified example of the first embodiment of the present technology, since the V3D type non-volatile memory 400 is controlled, it is possible to suppress the fluctuation of the IR drop in the V3D type non-volatile memory 400.

Sixth Modified Example

In the first embodiment described above, the plurality of memory array units 500 share the data buffer 410 and the address decoder 430, but the data buffer 410 and the address decoder 430 may not be shared, and the data buffer 410 and the address decoder 430 may be disposed for each memory array unit. A non-volatile memory 400 of a sixth modified example in this first embodiment differs from the first embodiment in that a data buffer and an address decoder are disposed for each memory array unit.

Figure 32:
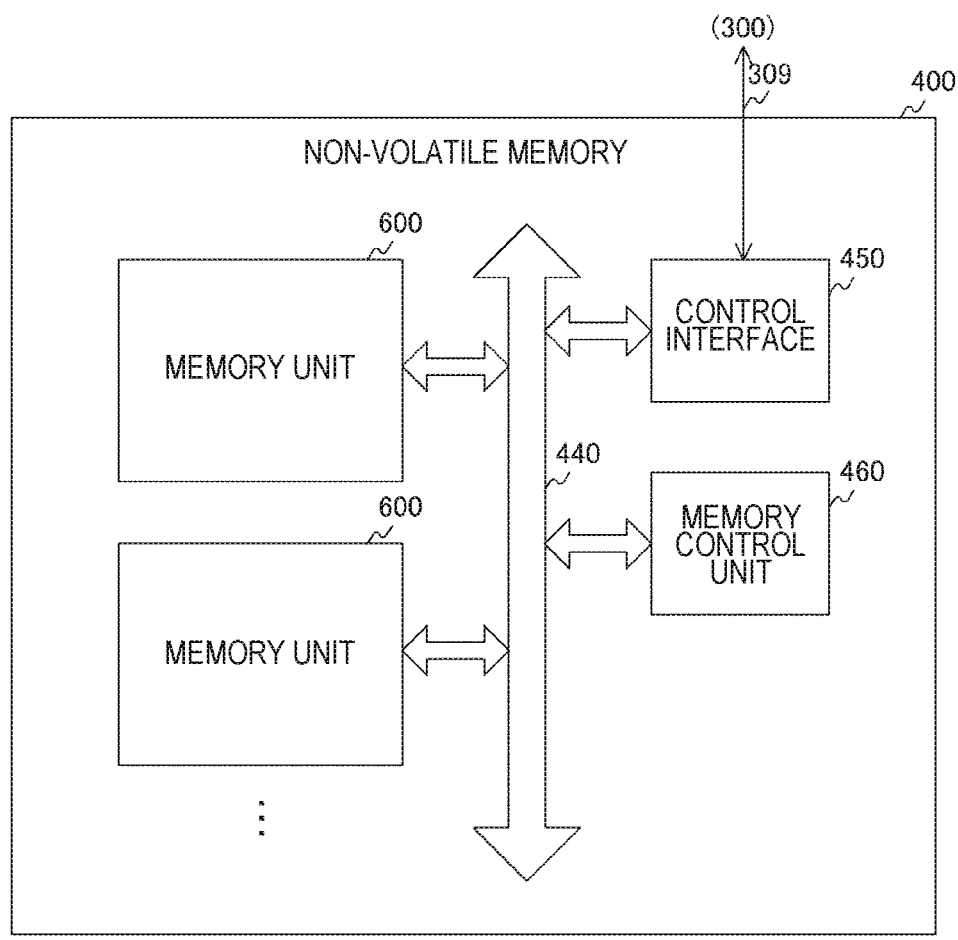
FIG. 32 is a block diagram illustrating a configuration example of a non-volatile memory in a sixth modified example of the first embodiment of the present technology.

FIG. 32 is a block diagram illustrating a configuration example of the non-volatile memory 400 in the sixth modified example of the first embodiment. A configuration of the non-volatile memory 400 of the sixth modified example differs from that of the first embodiment in that a plurality of memory units 600 are disposed instead of the MAU array unit 420, the data buffer 410 and the address decoder 430.

Figure 33:
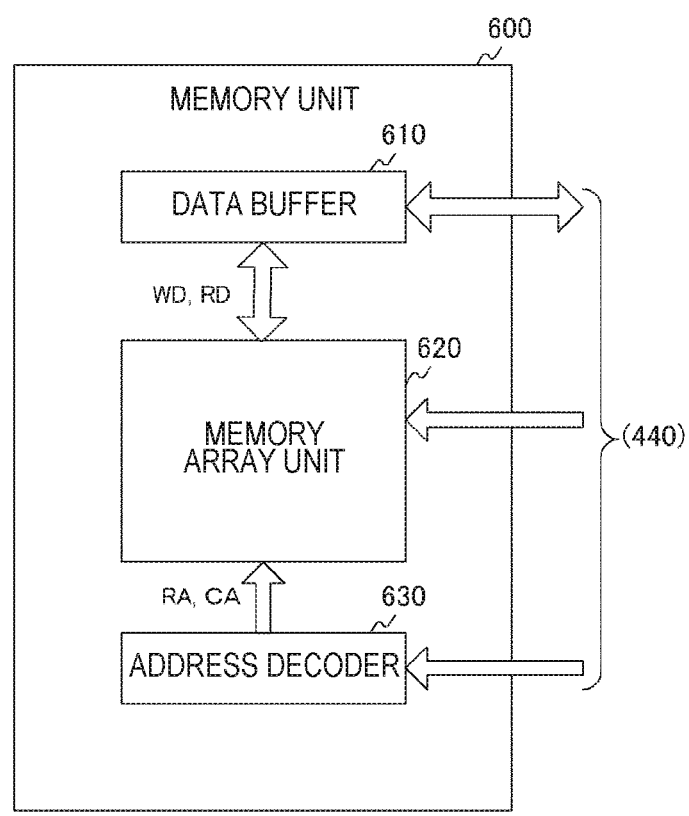
FIG. 33 is a block diagram illustrating a configuration example of a memory unit in a sixth modified example of the first embodiment of the present technology.

FIG. 33 is a block diagram illustrating a configuration example of a memory unit 600 in the sixth modified example of the first embodiment. The memory unit 600 includes a data buffer 610, a memory array unit 620, and an address decoder 630. Since the data buffer 610 and the address decoder 630 are disposed for each memory array unit 620, it is possible to execute data buffering and an address decoding process in parallel and improve the access speed.

As described above, in the non-volatile memory 400 of the sixth modified example in the first embodiment of the present technology, since the data buffer 610 and the address decoder 630 are disposed for each memory array unit 620, the access speed can be improved.

2. Second Embodiment

In the first embodiment described above, access is restricted by setting all the regions of the memory cell array 530 to the read only mode after the write process, but it is not necessary to restrict access to the regions near the driver. A memory system in a second embodiment differs from the first embodiment in that a region in which access is restricted and a region in which access is not restricted are disposed in the memory cell array 530.

Figure 34:
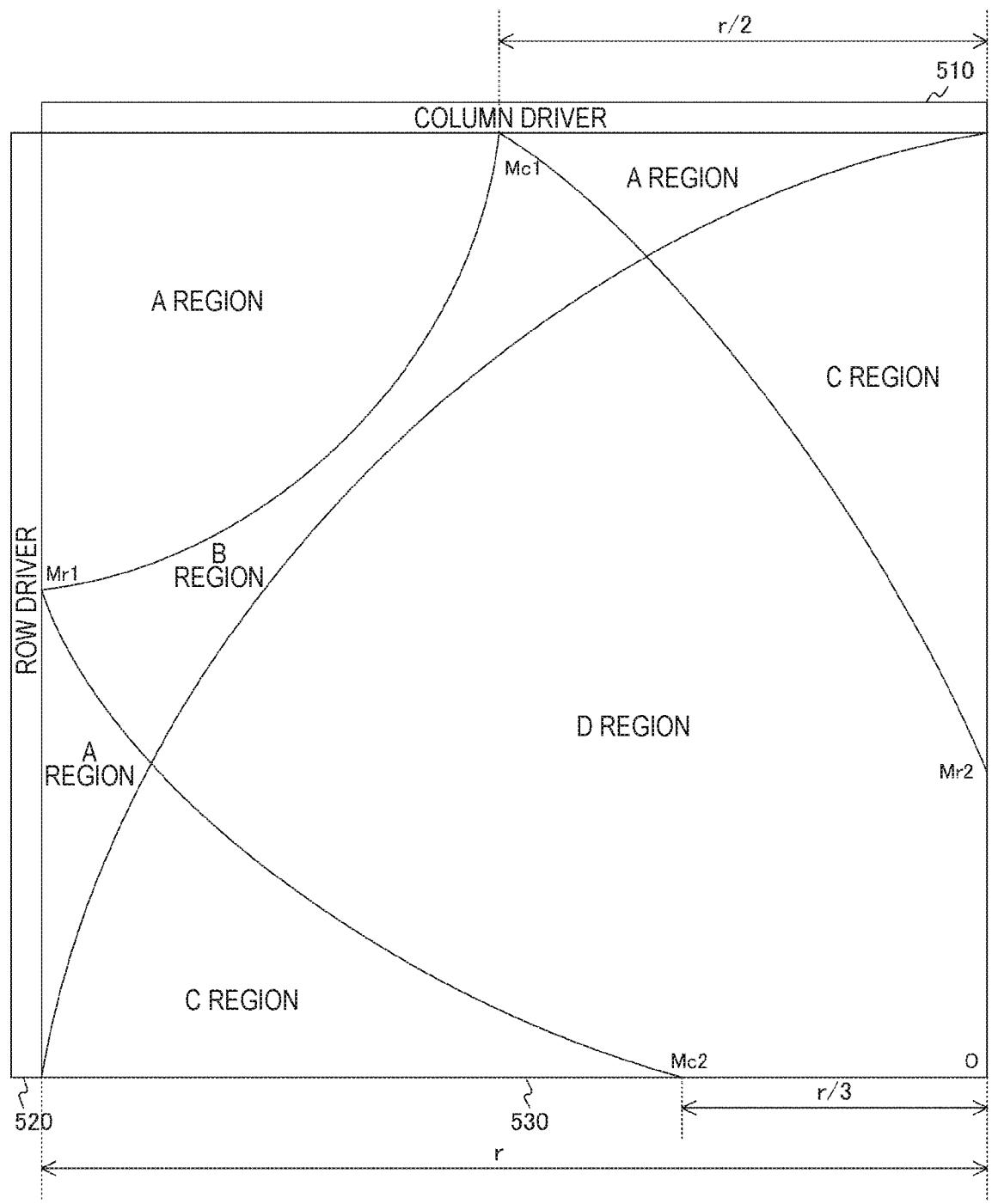
FIG. 34 is a diagram illustrating an example of a region in a memory cell array in a second embodiment of the present technology.

FIG. 34 is a diagram illustrating an example of regions in the memory cell array 530 in the second embodiment. The memory cell array 530 of the second embodiment differs from the first embodiment in that four regions A, B, C and D are disposed.

In the memory cell array 530, a point at which both the distance from the column driver 510 and the distance from the row driver 520 are r is referred to as an origin O. With this origin O as the center, the memory cell array 530 is divided into two regions by an arc with a radius r and a central angle of 45°. Each of the two regions is further divided into two, and a total of four regions are hereinafter referred to as A, B, C and D regions. Further, the memory cell array 530 may further have regions other than the A, B, C and D regions. For example, a non-accessible region including a defective cell may be further disposed.

A midpoint on the row driver 520 is indicated by $M_{r1}$, and a midpoint on the column driver 510 is indicated by $M_{c1}$. Further, a point which passes through the origin O and is at a distance of r/3 from the origin O on a vertical line perpendicular to the row driver 520 is indicated by $M_{c2}$. A point which passes through the origin O and is at a distance r/3 from the origin O on a vertical line perpendicular to the column driver 510 is indicated by $M_{r2}$.

If the arc having the radius r is used as the boundary, the region on the origin O side is divided into three by a curved line connecting $M_{r1}$ with $M_{c2}$ and a curved line connecting $M_{r2}$ with $M_{c1}$. A middle region is assumed to be the D region, and all the remaining two regions are assumed to be the C regions. Further, if the arc having the radius r is used as the boundary, the region on the driver side is divided into four regions by a curved line connecting $M_{r1}$ with $M_{c1}$, a curved line connecting $M_{r1}$ with $M_{c2}$, and a curved line connecting $M_{r2}$ with $M_{c1}$. A central region among the regions is assumed to be the B region, and all the remaining three regions are assumed to be the A region.

The A and B regions are closer to the driver than the C and D regions, and the fluctuation of the IR drop is relatively small. Therefore, access to the A and B regions are not restricted. On the other hand, similarly to the first embodiment, the C and D regions transition to the read only mode after the write process, and rewriting is restricted.

Further, the row passing through the C region also passes through the A region or the D region, and it is preferable to initialize the D region having the larger IR drop before the rewriting of the C region. Further, the row passing through the D region also passes through the A region or the B region, and it is preferable to initialize the B region having the larger IR drop before the rewriting of the D region. For these reasons, it is preferable to initialize the B and D regions when the rewriting is performed in the C or D region. For example, when the C region or the D region is caused to transition from the read only mode to the writable mode, the B and D regions are initialized.

Further, the A region is an example of a first unrestricted region described in claims set forth below, and the B region is an example of a second unrestricted region described in claims set forth below. Further, the C region is an example of a first access restriction region described in claims set forth below, and the D region is an example of a second access restriction region described in claims set forth below.

FIG. 35 is a diagram for describing characteristics of the respective regions in the second embodiment. In the A, B, and C regions, the rewrite order is not restricted. On the other hand, similarly to the first embodiment, it is necessary to designate the addresses in the descending order (that is, sequentially) and perform the rewriting for the D region. This is because the D region is farther from the driver than all of the A, B, and C regions and largest in the IR drop.

Further, it is not necessary to performs erasing any region before the rewriting is performed in the A or B region. On the other hand, it is necessary to perform the erasing in the B and the D regions before the rewriting is performed in the C region. Further, it is necessary to perform the erasing in the B region before the rewriting is performed in the D region.

Further, when the rewriting is performed in the A region, the rewriting is not prohibited from being performed in all the regions. On the other hand, in a case in which the rewriting is performed in one of the B, C and the D regions, the C and the D regions transition to the read only mode, and the rewriting is prohibited.

Figure 36:
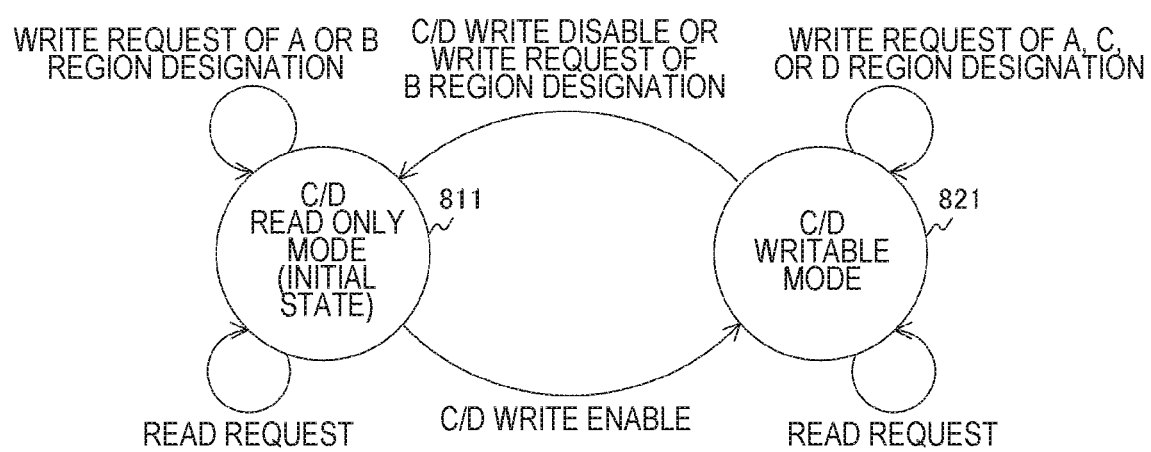
FIG. 36 is a diagram illustrating an example of a state transition diagram of a memory module in the second embodiment of the present technology.

FIG. 36 is a diagram illustrating an example of a state transition diagram of the memory module 200 in the second embodiment. The status of the memory module 200 includes a C/D read only mode 811 and a C/D writable mode 821. A C/D read only mode 811 is a mode in which the rewriting in the C and D regions is prohibited, and a C/D writable mode 821 is a mode in which the rewriting in these regions is permitted. An initial state such as the time of activation is set in, for example, the C/D read only mode 811.

In the C/D read only mode 811, if the C/D data erasing command is issued by the host computer 100, the memory controller 300 initializes the B and D regions in accordance with the write enable request. Then, the memory controller 300 causes the state to transition to the C/D writable mode 821.

Further, in the C/D writable mode 820, if the write command is issued by the host computer 100, the memory controller 300 writes the write data in accordance with the write request. If the writing in the A, C, or D region is completed, the memory controller 300 generates the write disable request and causes the state to transition to the C/D read only mode 811.

Further, even when the write command for the B region is issued, the memory controller 300 causes the state to transition to the C/D read only mode 811 after the writing is completed.

Here, in the C/D writable mode, data can be consecutively written over a plurality of regions among the A, B, C, and the D regions. Here, there is a restriction that it is necessary to perform the erasing in the B and D regions before the rewriting is performed in the C region as described above with reference to FIG. 35, and it is necessary to perform the erasing in the B region before the rewriting is performed in the D region. In accordance with this restriction, it is possible to perform the rewriting in the B and D regions successively in the order of the C region and the D region after the erasing is performed in the B and D regions. On the other hand, in accordance with this restriction, the rewriting is unable to be performed consecutively in the order of the D region and the C region after the erasing is performed in the B and D regions. In the implementation, as will be described later, the rewriting is controlled in accordance with, for example, a D write flag indicating whether or not the rewriting is performed in the D region.

Further, if the read command is issued by the host computer 100 in both the C/D read only mode 811 and the C/D writable mode 821, the memory controller 300 reads the read data in response to the read request.

Figure 37:
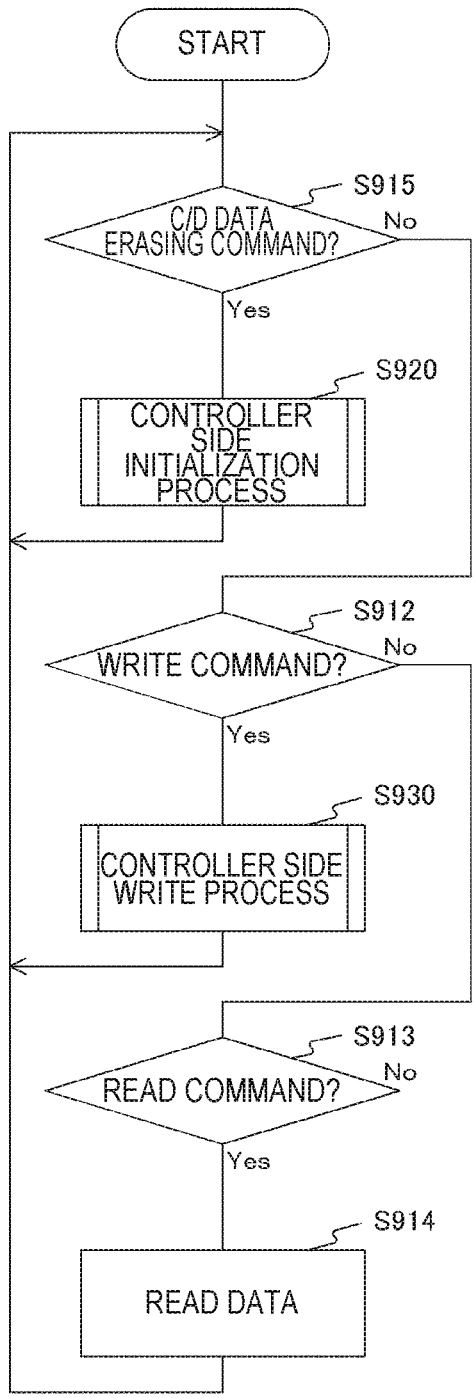
FIG. 37 is a flowchart illustrating an example of an operation of a memory controller in the second embodiment of the present technology.

FIG. 37 is a flowchart illustrating an example of an operation of the memory controller 300 in the second embodiment. The operation of the memory controller 300 of the second embodiment differs from the first embodiment in that step S915 is executed instead of step S913.

The memory controller 300 determines whether or not the C/D data erasing command is received from the host computer 100 (step S915). In a case in which the C/D data erasing command is received (Yes in step S915), the memory controller 300 executes a controller side initialization process for initializing the non-volatile memory 400 (step S920). On the other hand, in a case in which the C/D data erasing command is not received (No in step S915), the memory controller 300 executes step S912 and subsequent steps.

Figure 38:
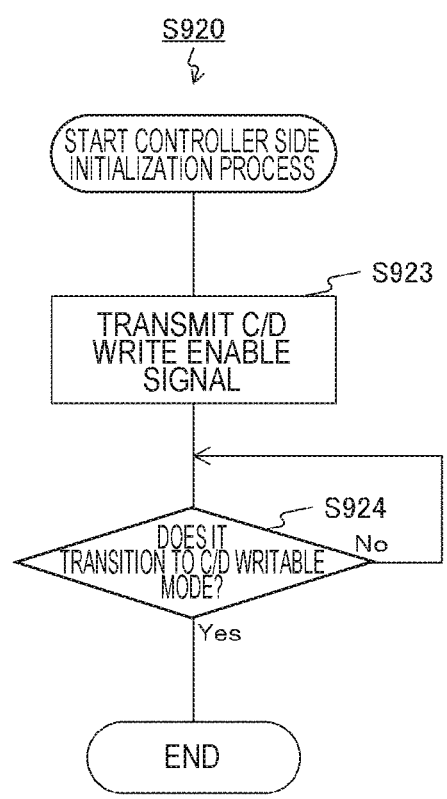
FIG. 38 is a flowchart illustrating an example of a controller side initialization process in the second embodiment of the present technology.

FIG. 38 is a flowchart illustrating an example of the controller side initialization process in the second embodiment. The memory controller 300 transmits the C/D write enable request to the non-volatile memory 400 (step S923). Then, the memory controller 300 determines whether or not it transitions to the C/D writable mode upon the completion of the initialization of the C/D regions (step S924). In a case in which it does not transition to the C/D writable mode (No in step S924), the memory controller 300 repeats step S924, and in a case in which it transitions to the C/D writable mode (Yes in step S924), the memory controller 300 ends the controller side initialization process.

Figure 39:
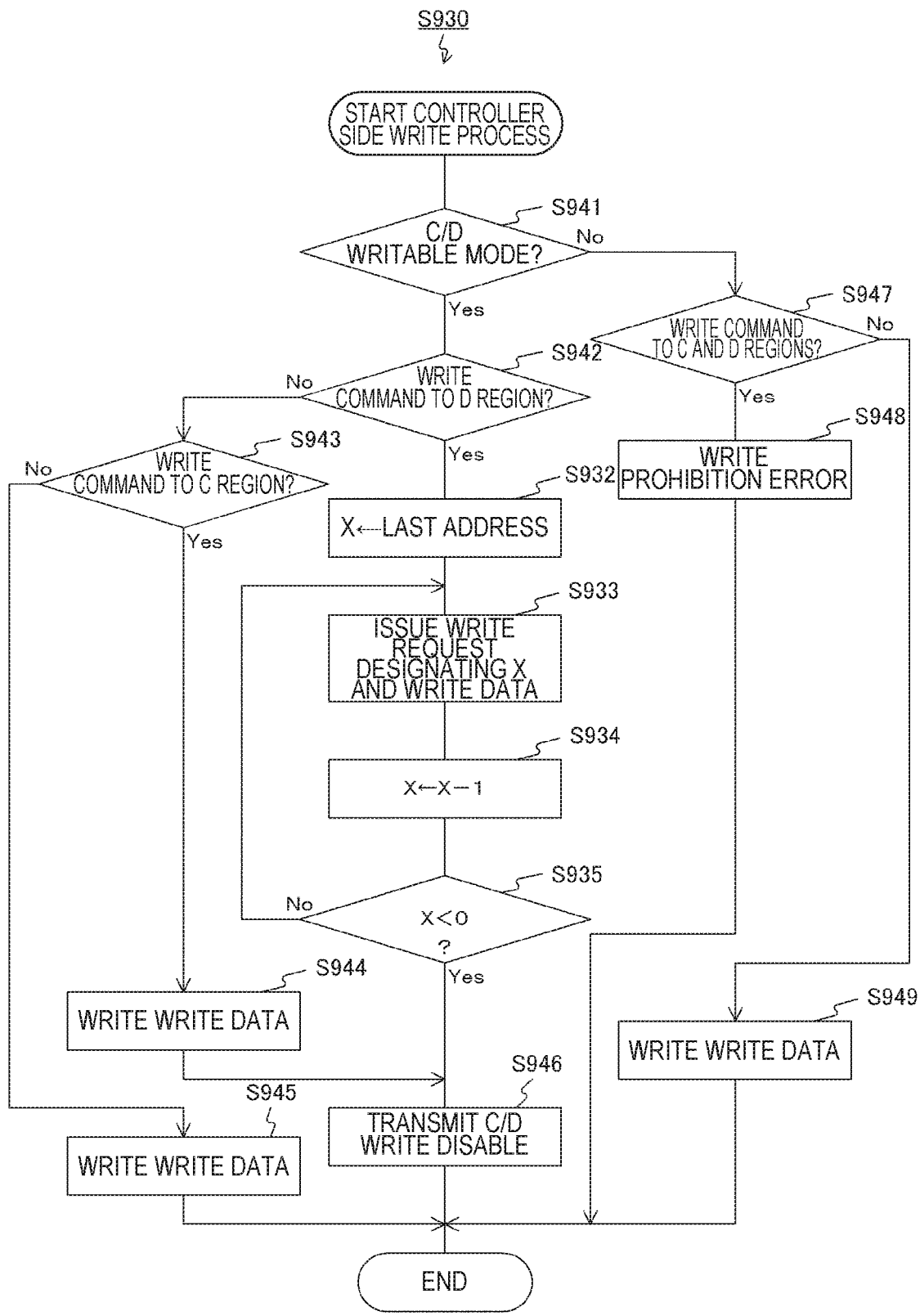
FIG. 39 is a flowchart illustrating an example of a controller side write process in the second embodiment of the present technology.

FIG. 39 is a flowchart illustrating an example of the operation of the memory controller 300 in the second embodiment. The memory controller 300 determines whether or not the current state is the C/D writable mode (step S941). In a case in which the current state is the C/D writable mode (Yes in step S941), the memory controller 300 determines whether or not it is the write command to the D region (step S942). In a case in which it is the write command to the D region (Yes in step S942), the memory controller 300 executes steps S932 to S935. On the other hand, in a case in which it is not the write command to the D region (No in step S942), the memory controller 300 determines whether or not it is the write command to the C region (step S943).

In a case in which it is the write command to the C region (Yes in step S943), the memory controller 300 writes the write data to the C region (step S944). Further, in a case in which it is the write command to the D region (No in step S943), the memory controller 300 writes the write data in the D region (step S945).

In a case in which the variable X is smaller than "0" (Yes in step S935) or after step S944, the memory controller 300 transmits a C/D write disable request to the non-volatile memory 400 (step S946). After step S945 or S946, the memory controller 300 transitions to the C/D read only mode and ends the write process.

In a case in which it is not the C/D writable mode (No in step S941), the memory controller 300 determines whether or not it is the write command to the C or D region (step S947). In a case in which it is the write command to the C or D region (Yes in step S947), the memory controller 300 generates the access prohibition error (step S948). On the other hand, in a case in which it is not the write command to the C or D region (No in step S947), the memory controller 300 writes the write data to the region (step S949). After step S948 or S949, the memory controller 300 ends the write process.

Figure 40:
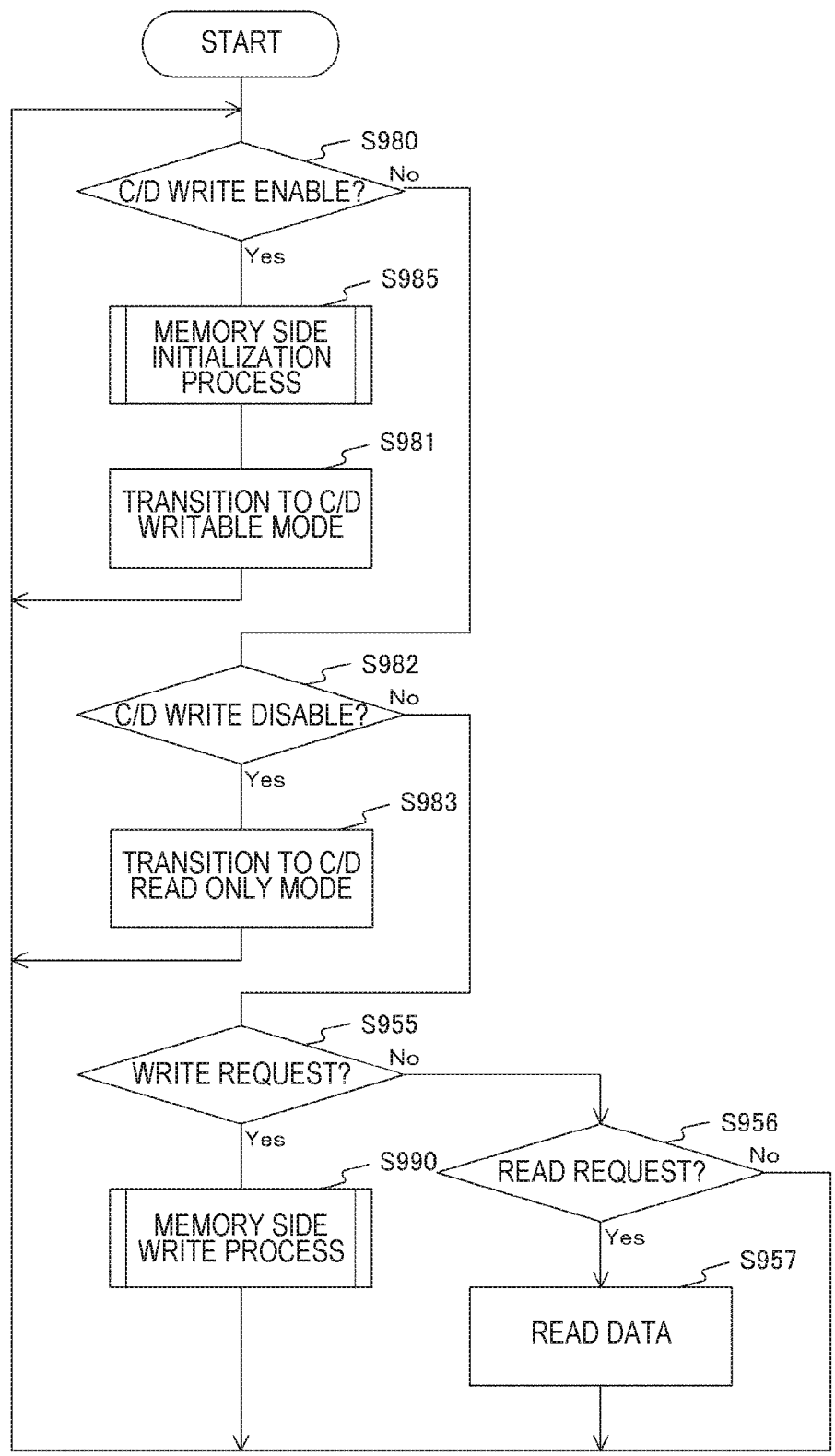
FIG. 40 is a flowchart illustrating an example of an operation of a non-volatile memory in the second embodiment of the present technology.

FIG. 40 is a flowchart illustrating an example of an operation of the non-volatile memory 400 in the second embodiment.

The non-volatile memory 400 determines whether or not the C/D write enable request is received from the memory controller 300 (step S980). In a case in which the C/D write enable request is received (Yes in step S980), the non-volatile memory 400 executes the memory side initialization process for the initialization (step S985) and transitions to the C/D writable mode (step S981).

On the other hand, in a case in which the write C/D enable request is not received (No in step S980), the non-volatile memory 400 determines whether or not the C/D write disable request is received (step S982). In a case in which the C/D write disable request is received (Yes in step S982), the non-volatile memory 400 transitions to the C/D read only mode (step S983).

Further, in a case in which the C/D write disable request is not received (No in step S982), the non-volatile memory 400 determines whether or not the write request is received (step S955). In a case in which the write request is received (Yes in step S955), the non-volatile memory 400 executes the memory side write process for writing data (step S990).

In a case in which the write request is not received (No in step S955), the non-volatile memory 400 executes the step S956 and the subsequent steps.

Figure 41:
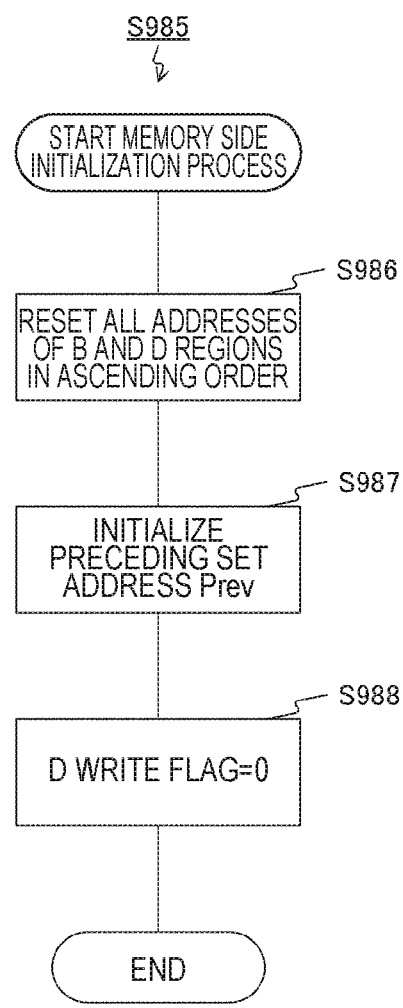
FIG. 41 is a flowchart illustrating an example of a memory side initialization process in the second embodiment of the present technology.

FIG. 41 is a flowchart illustrating an example of the memory side initialization process in the second embodiment. The non-volatile memory 400 selects the addresses of the B and D regions in the ascending order and resets all the addresses (step S986). Then, the non-volatile memory 400 initializes the preceding address Prev (step S987) and sets "0" in the D write flag (step S988). The D write flag is a flag indicating whether or not writing to the D region has been performed. After step S988, the non-volatile memory 400 ends the memory side initialization process.

Figure 42:
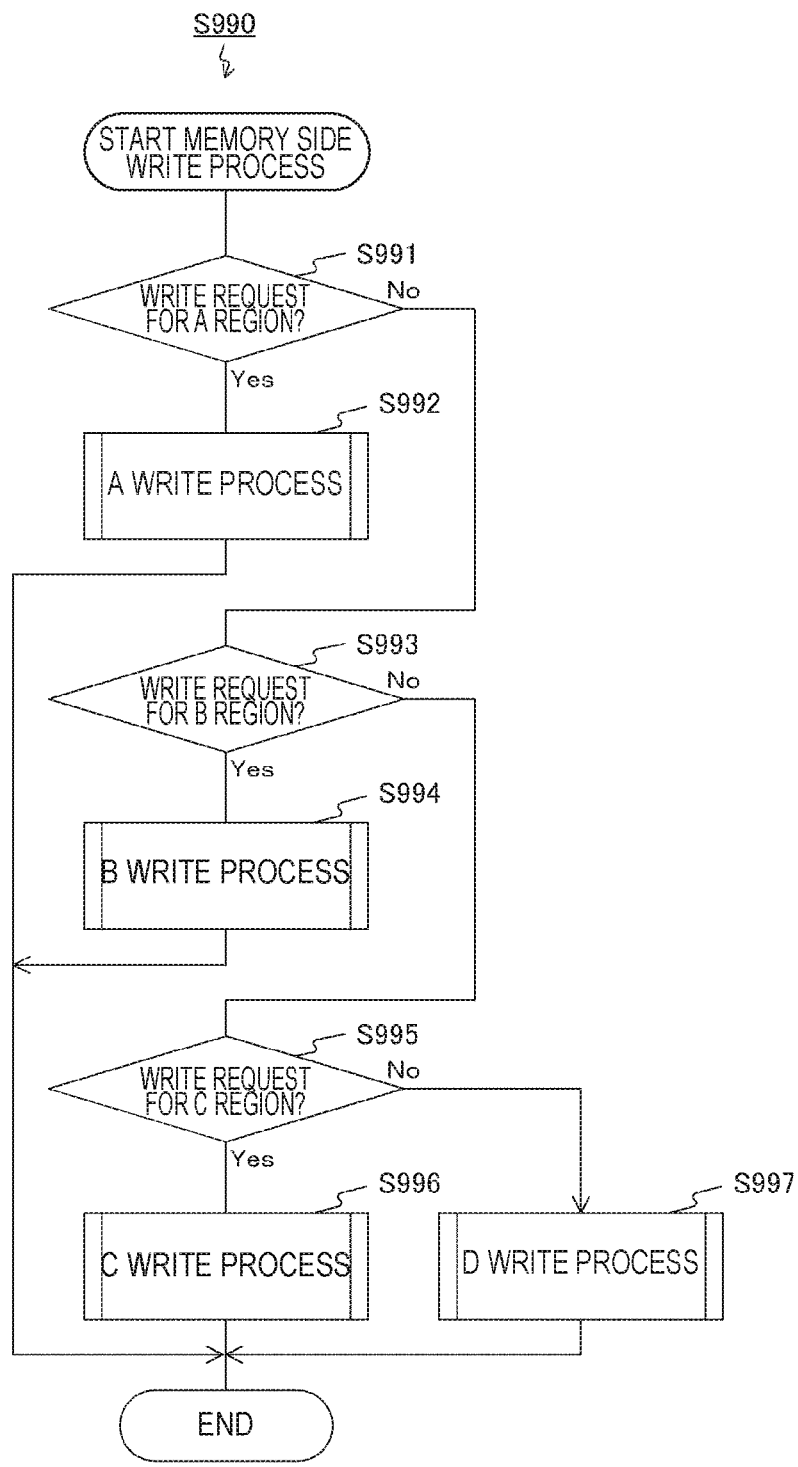
FIG. 42 is a flowchart illustrating an example of a memory side write process in the second embodiment of the present technology.

FIG. 42 is a flowchart illustrating an example of the memory side write process in the second embodiment. The non-volatile memory 400 determines whether or not it is the write request for the A region (step S991). In a case in which it is the write request for the A region (Yes in step S991), the non-volatile memory 400 executes an A write process (step S992).

On the other hand, in a case in which it is not the write request for the A region (No in step S991), the non-volatile memory 400 determines whether or not it is the write request for the B region (step S993). In a case in which it is the write request for the B region (Yes in step S993), the non-volatile memory 400 executes a B write process (step S994).

On the other hand, in a case in which it is not the write request for the B region (No in step S993), the non-volatile memory 400 determines whether or not it is the write request for the C region (step S995). In a case in which it is the write request for the C region (Yes in step S995), the non-volatile memory 400 executes a C write process (step S996).

On the other hand, in a case in which it is not the write request for the C region (No in step S995), the non-volatile memory 400 executes a D write process (step S997). After step S992, S994, S996, or S997, the non-volatile memory 400 ends the memory side write process.

Figure 43:
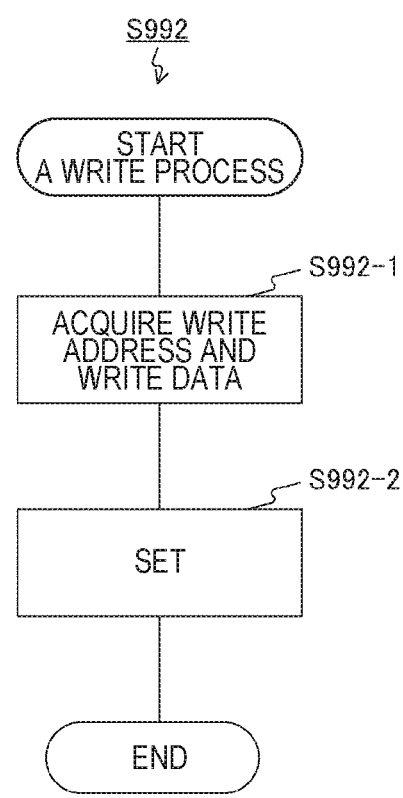
FIG. 43 is a flowchart illustrating an example of an A write process in the second embodiment of the present technology.

FIG. 43 is a flowchart illustrating an example of the A write process in the second embodiment. The non-volatile memory 400 acquires the write address and the write data (step S992-1), and sets the memory cells corresponding to the write data to the LRS (step S992-2). After step S992-2, the non-volatile memory 400 ends the A write process.

Figure 44:
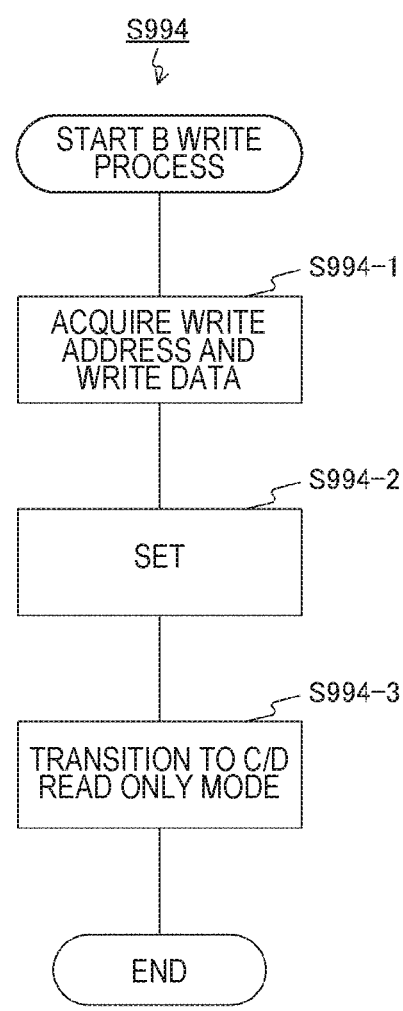
FIG. 44 is a flowchart illustrating an example of a B write process in the second embodiment of the present technology.

FIG. 44 is a flowchart illustrating an example of the B write process in the second embodiment. The non-volatile memory 400 acquires the write address and the write data (step S994-1), and sets the memory cells corresponding to the write data to the LRS (step S994-2). Then, the non-volatile memory 400 transitions to the C/D read only mode (step S994-3) and ends the B write process.

Figure 45:
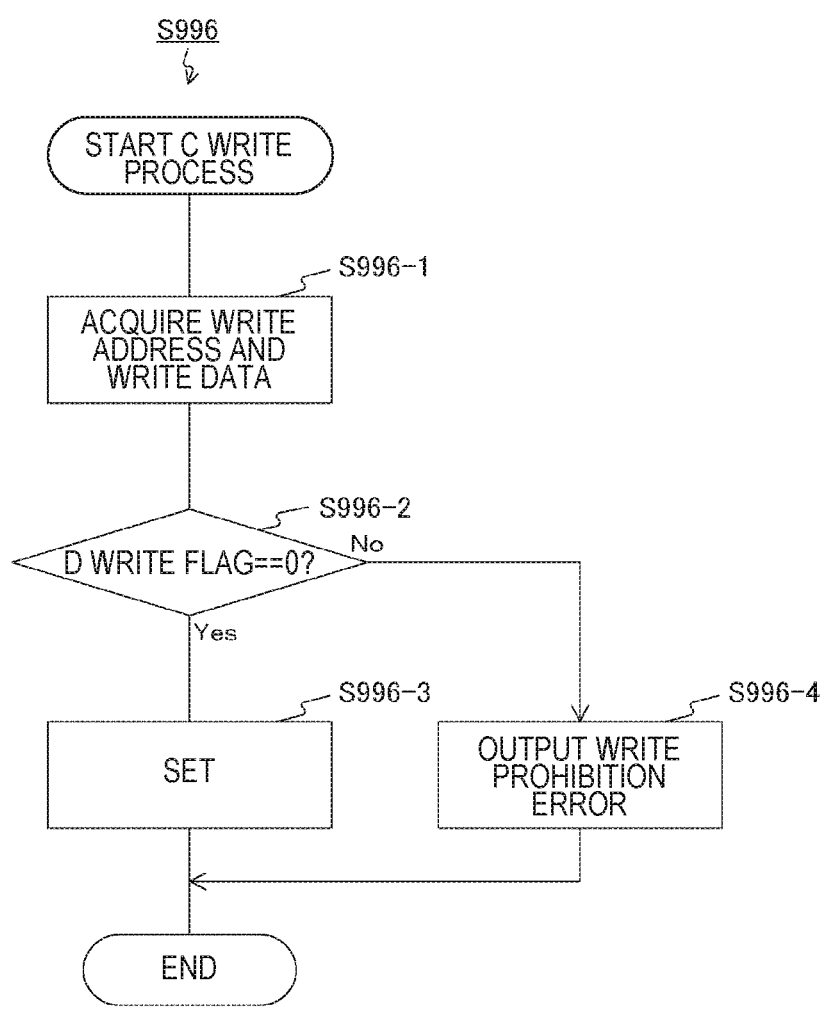
FIG. 45 is a flowchart illustrating an example of a C write process in the second embodiment of the present technology.

FIG. 45 is a flowchart illustrating an example of the C write process in the second embodiment. The non-volatile memory 400 acquires the write address and the write data (step S996-1), and determines whether or not the D write flag is "0" (step S996-2).

In a case in which the D write flag is "0" (Yes in step S996-2), the non-volatile memory 400 sets the memory cells corresponding to the write data to the LRS (step S996-3). On the other hand, in a case in which the D write flag is "1" (No in step S996-2), the non-volatile memory 400 generates the access prohibition error (step S996-4). After step S996-3 or S996-4, the non-volatile memory 400 ends the C write process.

Figure 46:
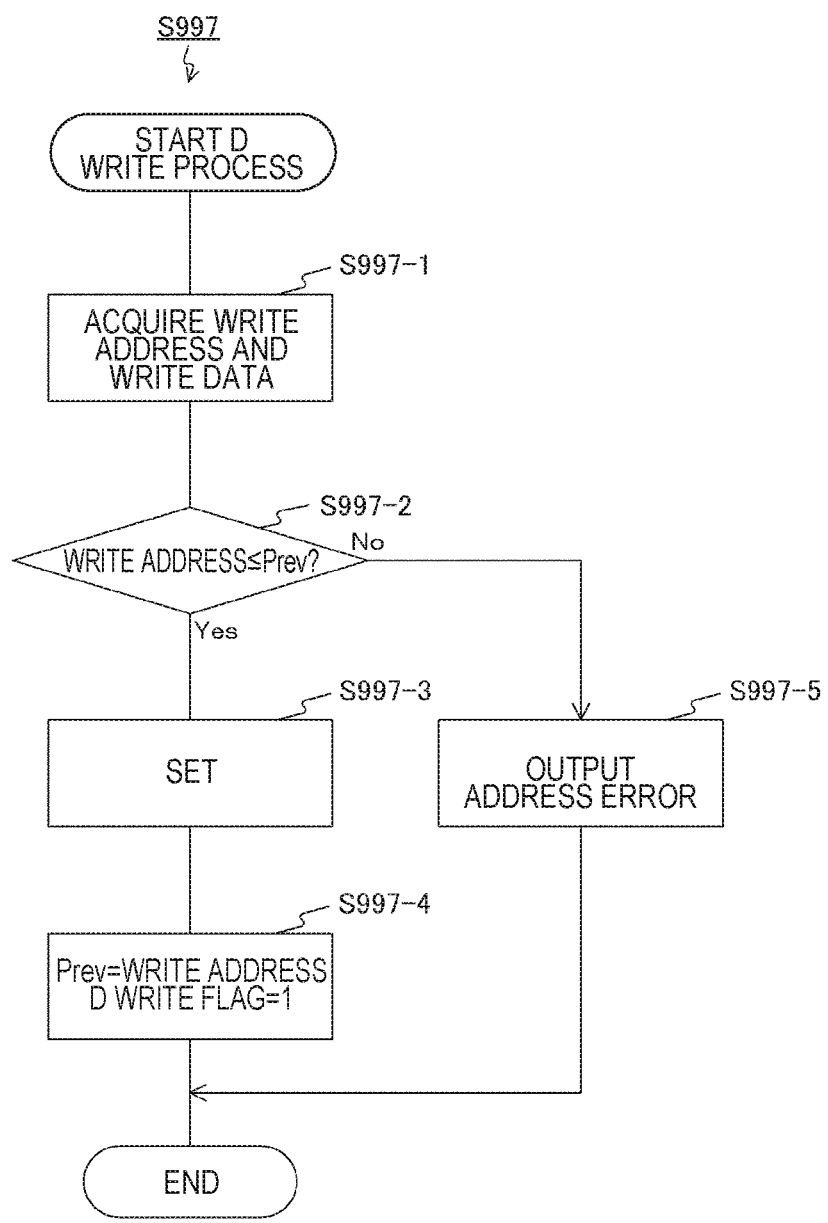
FIG. 46 is a flowchart illustrating an example of a D write process in the second embodiment of the present technology.

FIG. 46 is a flowchart illustrating an example of the D write process in the second embodiment. The non-volatile memory 400 acquires the write address and the write data from the memory controller 300 (step S997-1). Then, the non-volatile memory 400 determines whether or not the write address is equal to or less than the preceding address Prev (step S997-2). In a case in which the write address is equal to or less than the preceding address Prev (Yes in step S997-2), the non-volatile memory 400 sets the memory cell 540 corresponding to the write address (step S997-3). Then, the non-volatile memory 400 updates the preceding address Prev with the write address and set "1" in the D write flag (step S997-4).

On the other hand, in a case in which the write address is larger than the preceding address Prev (No in step S972), the non-volatile memory 400 generates the address error and transmits the address error to the memory controller 300 (step S975). After step S974 or step S975, the non-volatile memory 400 ends the memory side write process.

As described above, according to the second embodiment of the present technology, if the C and D regions are initialized, it transitions to the writable mode, and if the write process to those regions is completed, it transitions to the read only mode, and thus it is possible to minimize the leakage current through the initialization. Accordingly, it is possible to suppress the fluctuation of the IR drop in the write process. Further, since the regions to be initialized are only the C and D regions, the number of memory cells to be initialized can be reduced as compared with the case in which all the A to D regions are initialized.

3. Third Embodiment

In the first embodiment described above, only the non-volatile memory 400 is disposed in the memory module 200, but the access speed of the non-volatile memory 400 is generally slower than that of a volatile memory. Therefore, if the non-volatile memory 400 is used as a main memory, there is a problem that a processing speed is delayed as compared with a case in which a volatile memory is used. In order to improve the processing speed, for example, it is preferable to further mount a volatile memory, use the volatile memory as a main memory, and use the non-volatile memory 400 as a save region at the time of power interruption. A memory module of the third embodiment differs from the first embodiment in that a volatile memory is further disposed, and the access speed of the memory module is improved.

Figure 47:
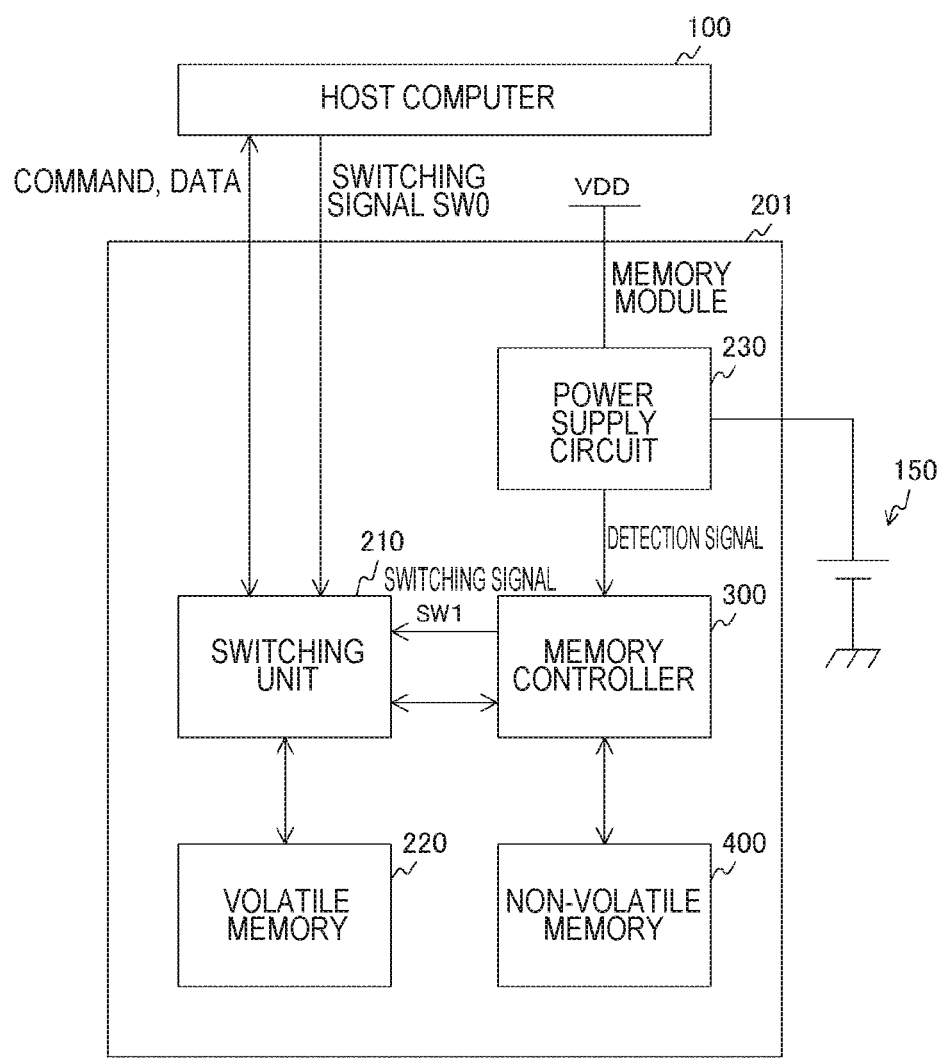
FIG. 47 is an overall view illustrating a configuration example of a memory system in a third embodiment of the present technology.

FIG. 47 is an overall view illustrating a configuration example of a memory system in the third embodiment. The memory system of the third embodiment differs from the first embodiment in that a memory module 201 is disposed instead of the memory module 200, and a battery 150 is further disposed.

The memory module 201 includes a switching unit 210, a volatile memory 220, a power supply circuit 230, a memory controller 300, and a non-volatile memory 400.

The switching unit 210 switches connection destinations of the volatile memory 220, the memory controller 300, and the host computer 100 in accordance with switching signals SW0 and SW1.

The switching signal SW0 is a signal designating one of the volatile memory 220 and the non-volatile memory 400 as the access destination of the host computer 100. If the volatile memory 220 is designated in accordance with the switching signal SW0, the switching unit 210 connects the host computer 100 with the volatile memory 220. On the other hand, if the non-volatile memory 400 is designated by the switching signal SW0, the switching unit 210 connects the host computer 100 with the memory controller 300.

In addition, the switching signal SW1 is a signal designating one of the volatile memory 220 and the host computer 100 as the access destination of the memory controller 300. If the volatile memory 220 is designated in accordance with the switching signal SW1, the switching unit 210 connects the memory controller 300 with the volatile memory 220. On the other hand, if the host computer 100 is designated by the switching signal SW1, the switching unit 210 connects the host computer 100 with the memory controller 300.

The volatile memory 220 holds data in accordance with a command or a request from the host computer 100 or the memory controller 300. As the volatile memory 220, for example, a dynamic random access memory (DRAM) is used.

The host computer 100 of the third embodiment performs various kinds of processes using the volatile memory 220 as a main memory.

The battery 150 is a battery connected to the memory module 201 and used as a standby power source when a main power source VDD undergoes power interruption.

Further, the battery 150 is disposed outside the memory module 201, but the battery 150 may be installed in the memory module 201.

The power supply circuit 230 manages a power supply of the memory module 201. The power supply circuit 230 supplies electric power to respective circuits in the memory module 201 using the main power source VDD in an initial state. Further, the power supply circuit 230 monitors the main power source VDD and detects power interruption thereof. The power supply circuit 230 supplies a detection signal indicating whether or not power interruption occurs to the memory controller 300. Further, if the power interruption of the main power source VDD is detected, the power supply circuit 230 performs switching from the main power source to the standby power source (battery 150) and continues the power supply.

In the initial state, the memory controller 300 is connected to the host computer 100. Then, if the power interruption is detected, the memory controller 300 switches the access destination to the volatile memory 220 in accordance with the switching signal SW1 and initializes the non-volatile memory 400 to transition to the writable mode. Then, the memory controller 300 reads data from the volatile memory 220 and writes (that is, saves) the data in the non-volatile memory 400. Further, when returning from the power interruption, the memory controller 300 reads the saved data from the non-volatile memory 400 and writes (that, recovers) the data in the volatile memory 220.

Further, the memory controller 300 initializes the non-volatile memory 400 when the data erasing command is supplied from the host computer 100 in addition to when the power interruption occurs.

Figure 48:
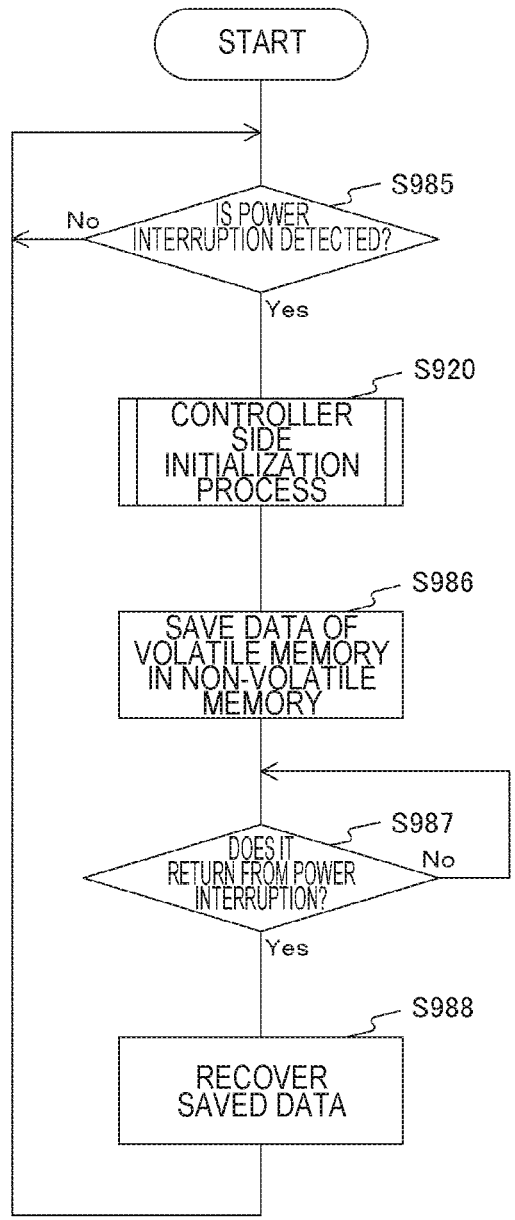
FIG. 48 is a flowchart illustrating an example of an operation of a memory controller in the third embodiment of the present technology.

FIG. 48 is a flowchart illustrating an example of an operation of the memory controller 300 in the third embodiment. The memory controller 300 determines whether or not the power interruption is detected (step S985). In a case in which the power interruption is detected (Yes in step S985), the memory controller 300 executes the controller side initialization process (step S920) and saves the data of the volatile memory 220 in the non-volatile memory 400 (step S986). Then, the memory controller 300 determines whether or not it is recovered from the power interruption (step S987). In a case in which it is not recovered from the power interruption (No in step S987), the memory controller 300 repeats step S987. Further, in FIG. 48, the operation of performing the initialization through the memory controller 300 in accordance with the data erasing command is omitted.

In a case in which it returns from the power interruption (Yes in step S987), the memory controller 300 writes back the saved data (step S988). In a case in which the power interruption is not detected (No in step S985) or after step S988, the memory controller 300 repeats step S985 and subsequent steps.

As described above, according to the third embodiment of the present technology, since the memory controller 300 saves the data of the volatile memory 220 in the non-volatile memory 400 at the time of power interruption, it is possible to prevent data loss at the time of power interruption. Further, since the host computer 100 can use the volatile memory 220 as the main memory, the processing speed can be improved.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a CD (Compact Disc), an MD (MiniDisc), and a DVD (Digital Versatile Disc), a memory card, and a Blu-ray disc (registered trademark) can be used.

Note that the effects described here are not necessarily limited, and any effect described in the present disclosure may be exhibited.

Additionally, the present technology may also be configured as below.

(1)

A memory controller, including:

an initialization control unit configured to cause a resistance value of a variable resistive element in an access restriction region to be changed to an initial value larger than a predetermined value in a read only mode among the read only mode in which writing to the access restriction region in a memory cell array in which the variable resistive elements are arranged is prohibited and a writable mode in which the writing to the access restriction region is permitted, and configured to transition to the writable mode; and a write control unit configured to cause a resistance value of an element corresponding to write data among the variable resistive elements in the access restriction region to be changed to a value smaller than the initial value in the writable mode, and configured to transition to the read only mode.

(2)

The memory controller according to (1), in which the access restriction region is a part of a region of the memory cell array.

(3)

The memory controller according to (2), in which the memory cell array has the access restriction region and an unrestricted region in which the writing is permitted in the read only mode, the access restriction region has a first access restriction region and a second access restriction region farther from a driver than the first access restriction region, the unrestricted region has a first unrestricted region and a second unrestricted region farther from the driver than the first unrestricted region, and the initialization control unit causes resistance values of the variable resistive elements in the second unrestricted region and the second access restriction region to be changed to the initial value and transitions to the writable mode.

(4)

The memory controller according to (3), in which, in a case in which the resistance values of the variable resistive elements in the second unrestricted region and the second access restriction region are the initial value, the write control unit causes the resistance value of the element corresponding to the write data among the variable resistive elements in the first access restriction region to be changed to a value smaller than the initial value.

(5)

The memory controller according to (3) or (4), in which, in a case in which the resistance values of the variable resistive elements in the second unrestricted region are the initial value, the write control unit causes the resistance value of the element corresponding to the write data among the variable resistive elements in the second access restriction region to be changed to a value smaller than the initial value.

(6)

The memory controller according to any of (3) to (5), in which the write control unit transitions to the read only mode in a case in which the resistance value of the element corresponding to the write data among the variable resistive elements in any of the second unrestricted region, the first access restriction region, and the second access restriction region in the writable mode is changed to a value smaller than the initial value.

(7)

The memory controller according to any of (1) to (6), in which the initialization control unit causes a resistance value of a variable resistive element closer to a driver than the variable resistive element corresponding to one of a maximum value and a minimum value of a write address to be changed to the initial value.

(8)

The memory controller according to any of (1) to (6), in which if a predetermined range of at least a part of the access restriction region is designated as an access range, the initialization control unit causes resistance values of the variable resistive element in the access range and the variable resistive element having a shorter wiring distance than the access range to be changed to a value smaller than the initial value.

(9)

The memory controller according to (1), in which the initialization control unit causes the resistance values of all the variable resistive elements in the access restriction region to be changed to the initial value.

(10)

The memory controller according to (1), in which the initialization control unit causes the resistance values of a part of the variable resistive elements in the access restriction region to be changed to the initial value.

(11)

The memory controller according to any of (1) to (10), in which the initialization control unit causes the resistance values to be changed to the initial value in order from the variable resistive element having a shorter wiring distance to a driver.

(12)

The memory controller according to (11), in which an address of a number corresponding to the wiring distance is allocated to each of the variable resistive elements, and the initialization control unit selects the addresses in a predetermined order and causes the resistance values of the variable resistive elements corresponding to the selected addresses to be changed to the initial value.

(13)

The memory controller according to (11) or (12), in which the write control unit causes the resistance values to be changed to values smaller than the initial value in order from the variable resistive element having a longer wiring distance to the driver.

(14)

The memory controller according to (13), in which the write control unit selects the addresses in order opposite to the predetermined order and causes the resistance values of the variable resistive elements corresponding to the selected addresses to be changed to a value smaller than the initial value.

(15)

A memory system, including:

a memory cell array in which variable resistive elements are arranged;

a driver configured to drive the memory cell array;

an initialization control unit configured to cause a resistance value of a variable resistive element in an access restriction region to be changed to an initial value larger than a predetermined value under the control of the driver in a read only mode among the read only mode in which writing to the access restriction region in the memory cell array is prohibited and a writable mode in which the writing to the access restriction region is permitted, and configured to transition to the writable mode; and a write control unit configured to cause a resistance value of an element corresponding to write data among the variable resistive elements in the access restriction region to be changed to a value smaller than the initial value under the control of the driver in the writable mode, and configured to transition to the read only mode.

(16)

The memory system according to (15), in which the initialization control unit causes the resistance value of the variable resistive element in the access restriction region to be changed to the initial value in accordance with a command for instructing to perform initialization.

(17)

The memory system according to (15), further including a power supply circuit configured to detect power interruption of a main power source and perform switching from the main power source to a standby power source, in which the initialization control unit causes the resistance value of the variable resistive element in the access restriction region to be changed to the initial value if the power interruption is detected.

(18)

The memory system according to any of (15) to (17), in which the driver includes a row driver configured to drive a row including the variable resistive elements arranged in a predetermined direction in the memory cell array, and a column driver configured to drive a column including the variable resistive elements arranged in a direction perpendicular to the predetermined direction in the memory cell, an address of a number corresponding to a distance from the row driver and the column driver to each of the variable resistive element is allocated to each of the variable resistive elements, the initialization control unit selects the addresses in a predetermined order, and causes the resistance values of the variable resistive elements corresponding to the selected addresses to be changed to values smaller than the initial value, and the write control unit selects the addresses in order opposite to the predetermined order and causes the resistance values of the variable resistive elements corresponding to the selected addresses to be changed to values smaller than the initial value.

(19)
The memory system according to (18),
in which the row driver includes
an odd-numbered row driver configured to drive odd-numbered rows, and
an even-numbered row driver configured to drive even-numbered rows, and the column driver includes
an odd-numbered column driver configured to drive odd-numbered columns, and
an even numbered column driver configured to drive even-numbered columns.

(20)
A method of controlling a memory controller, the method including:
an initialization control procedure of causing a resistance value of a variable resistive element in an access restriction region to be changed to an initial value larger than a predetermined value in a read only mode among the read only mode in which writing to the access restriction region in a memory cell array in which the variable resistive elements are arranged is prohibited and a writable mode in which the writing to the access restriction region is permitted, and transitioning to the writable mode; and
a write control procedure of causing a resistance value of an element corresponding to write data among the variable resistive elements in the access restriction region to be changed to a value smaller than the initial value in the writable mode, and transitioning to the read only mode.

REFERENCE SIGNS LIST 100 host computer
110 input/output interface
120 weight data generating unit
130 data analyzing unit
150 battery
200, 201 memory module
210 switching unit
220 non-volatile memory
230 power supply circuit
300 memory controller
301 host interface
302 RAM
303 CPU
304 ECC processing unit
305 ROM
306, 440 bus
307 memory interface
310 initialization control unit
320 write control unit
330 status generating unit
340 read control unit
400 non-volatile memory
410, 610 data buffer
420 MAU array unit
430, 630 address decoder
450 control interface
460 memory control unit
461 request decoder
462 write processing unit
463 read processing unit
464 initialization processing unit
500, 620 memory array unit
510 column driver
520 row driver
530 memory cell array
540 memory cell
541 bidirectional diode
542 variable resistive element
550 left row driver
560 upper column driver
570 lower column driver
580 right row driver
600 memory unit

The invention claimed is:

1. A memory controller, comprising:
an initialization control unit configured to:
cause, in a read only mode of a memory module, a resistance value of a first variable resistive element to change to an initial value, wherein
the first variable resistive element is in an access restriction region of a memory cell array,
the initial value is larger than a first value,
a write operation to the access restriction region is restricted in the read only mode, and
the memory cell array includes a plurality of variable resistive elements including the first variable resistive element; and
control transition of the memory module from the read only mode to a writable mode of the memory module based on the change,
wherein the write operation is permitted in the writable mode; and
a write control unit configured to:
cause, in the writable mode, a resistance value of a second variable resistive element of the plurality of variable resistive elements to change to a second value, wherein
the second variable resistive element corresponds to write data, and
the second value is smaller than the initial value; and
control transition of the memory module from the writable mode to the read only mode based on the change of the resistance value of the second variable resistive element.

2. The memory controller according to claim 1, wherein the access restriction region is a part of a specific region of the memory cell array.

3. The memory controller according to claim 2, wherein the memory cell array includes an unrestricted region in which the write operation is permitted in the read only mode,
the access restriction region includes:
a first access restriction region; and
a second access restriction region farther from a driver of the memory module than the first access restriction region,
the unrestricted region includes:
a first unrestricted region; and
a second unrestricted region farther from the driver than the first unrestricted region, and
the initialization control unit is further configured to:
cause a resistance value, of each of a first set of variable resistive elements in the second unrestricted region and each of a second set of variable resistive elements in the second access restriction region, to change to the initial value, wherein the plurality of variable resistive elements includes the first set of variable resistive elements and the second set of variable resistive elements; and
control transition of the memory module to the writable mode based on the change of the resistance value of the each of the first set of variable resistive elements and the second set of variable resistive elements.

4. The memory controller according to claim 3, wherein
the write control unit is further configured to cause a resistance value of a third variable resistive element, in the first access restriction region, to change to a third value smaller than the initial value,
the plurality of variable resistive elements includes the third variable resistive element,
the third variable resistive element corresponds to the write data, and
the resistance value of the third variable resistive element is changed based on each of the first set of variable resistive elements having the initial value and the second set of variable resistive elements having the initial value.

5. The memory controller according to claim 3, wherein
the write control unit is further configured to cause a resistance value of a third variable resistive element, among the second set of variable resistive elements, to change to a third value smaller than the initial value,
the third variable resistive element corresponds to the write data, and
the resistance value of the third variable resistive element is changed based on the first set of variable resistive elements having the initial value.

6. The memory controller according to claim 3, wherein the write control unit is further configured to:
cause, in the writable mode, a resistance value of a specific variable resistive element of one of the first set of variable resistive elements, the second set of variable resistive elements, or a third set of variable resistive elements, to change to a third value smaller than the initial value, wherein
the third set of variable resistive elements is in the first access restriction region,
the plurality of variable resistive elements includes the third set of variable resistive elements, and
the specific variable resistive element corresponds to the write data; and
control transition of the memory module to the read only mode based on the change in the resistance value of the specific variable resistive element.

7. The memory controller according to claim 1, wherein
the initialization control unit is further configured to cause a resistance value of a third variable resistive element of the plurality of variable resistive elements to change to the initial value,
the third variable resistive element is closer to a driver of the memory module than a fourth variable resistive element of the plurality of variable resistive elements, and
the fourth variable resistive element corresponds to one of a maximum value or a minimum value of a write address of the memory cell array.

8. The memory controller according to claim 1, wherein the initialization control unit is further configured to
cause a resistance value of each of a third variable resistive element and a fourth variable resistive element to change to a third value smaller than the initial value, wherein
the third variable resistive element is in an access range of the access restriction region,
a wiring distance of the fourth variable resistive element from a driver of the memory module is shorter than a wiring distance of the third variable resistive element from the driver, and
the plurality of variable resistive elements includes the third variable resistive element and the fourth variable resistive element.

9. The memory controller according to claim 1, wherein
the initialization control unit is further configured to cause a resistance value of each of a set of variable resistive elements in the access restriction region to change to the initial value, and
the plurality of variable resistive elements includes the set of variable resistive elements.

10. The memory controller according to claim 1, wherein
the initialization control unit is further configured to cause a resistance value of at least a part of a set of variable resistive elements in the access restriction region to change to the initial value, and
the plurality of variable resistive elements includes the set of variable resistive elements.

11. The memory controller according to claim 1, wherein
the initialization control unit is further configured to cause a resistance value, of each variable resistive element of the plurality of variable resistive elements, to change to the initial value, and
the resistance value of the each variable resistive element is changed based on an ascending order of a wiring distance of the each variable resistive element from a driver of the memory module.

12. The memory controller according to claim 11, wherein
an address of the each variable resistive element corresponds to a respective wiring distance of the each variable resistive element from the driver, and
the initialization control unit is further configured to:
select the address of the each variable resistive element in a first order; and
cause, based on the selection, the resistance value of the each variable resistive element to change to the initial value.

13. The memory controller according to claim 11, wherein
the write control unit is further configured to cause the resistance value of the each variable resistive element to change to a third value smaller than the initial value, and
the resistance value of the each variable resistive element is changed to the third value based on a descending order of the wiring distance of the each variable resistive element from the driver.

14. The memory controller according to claim 12, wherein the write control unit is further configured to:
select the address of the each variable resistive element in a second order opposite to the first order; and
cause the resistance value of the each variable resistive element to change to a third value smaller than the initial value, wherein the resistance value of the each variable resistive element is changed to the third value based on the selection of the address of the each variable resistive element in the second order.

15. A memory system, comprising:
a memory cell array including a plurality of variable resistive elements;
a driver configured to drive the memory cell array;
an initialization control unit configured to:
cause, in a read only mode of a memory module, a resistance value of a first variable resistive element of the plurality of variable resistive elements to change to an initial value, wherein
the first variable resistive element is in an access restriction region of the memory cell array,
the initial value is larger than a first value, and a write operation to the access restriction region is restricted in the read only mode; and control transition of the memory module from the read only mode to a writable mode of the memory module based on the change, wherein the write operation is permitted in the writable mode; and a write control unit configured to:

cause, in the writable mode, a resistance value of a second variable resistive element of the plurality of variable resistive elements to change to a second value, wherein the second variable resistive element corresponds to write data, and the second value is smaller than the initial value; and control transition of the memory module from the writable mode to the read only mode based on the change of the resistance value of the second variable resistive element.

16. The memory system according to claim 15, wherein the initialization control unit is further configured to cause, based on an instruction for execution of an initialization process, the resistance value of the first variable resistive element to change to the initial value.

17. The memory system according to claim 15, further comprising a power supply circuit configured to:

detect power interruption of a main power source; and switch from the main power source to a standby power source based on the detection of the power interruption, wherein the initialization control unit is further configured to cause, based on the detection of the power interruption, the resistance value of the first variable resistive element to change to the initial value.

18. The memory system according to claim 15, wherein the driver includes:

a row driver configured to drive a row including a first set of variable resistive elements of the plurality of variable resistive elements, wherein the first set of variable resistive elements is in a first direction in the memory cell array; and a column driver configured to drive a column including a second set of variable resistive elements of the plurality of variable resistive elements, wherein the second set of variable resistive elements is in a second direction perpendicular to the first direction in the memory cell array, an address of each variable resistive element of the plurality of variable resistive elements corresponds to:

a respective distance of the each variable resistive element from the row driver, and a respective distance of the each variable resistive element from the column driver, the initialization control unit is further configured to:

select the address of the each variable resistive element in a first order; and cause, based on the selection, a resistance value of the each variable resistive element of the plurality of variable resistive elements to change to the initial value, and the write control unit is further configured to:

select the address of the each variable resistive element in a second order opposite to the first order; and cause the resistance value of the each variable resistive element to change to a third value smaller than the initial value, wherein the resistance value of the each variable resistive element is changed to the third value based on the selection of the address of the each variable resistive element in the second order.

19. The memory system according to claim 18, wherein the row driver includes:

an odd-numbered row driver configured to drive a plurality of odd-numbered rows; and an even-numbered row driver configured to drive a plurality of even-numbered rows, and the column driver includes:

an odd-numbered column driver configured to drive a plurality of odd-numbered columns, and an even-numbered column driver configured to drive a plurality of even-numbered columns.

20. A method of controlling a memory controller, the method comprising:

causing, in a read only mode of a memory module, a resistance value of a first variable resistive element to change to an initial value, wherein the first variable resistive element is in an access restriction region of a memory cell array, the initial value is larger than a first value, a write operation to the access restriction region is restricted in the read only mode, and the memory cell array includes a plurality of variable resistive elements including the first variable resistive element;

controlling transition of the memory module from the read only mode to a writable mode of the memory module based on the change, wherein the write operation is permitted in the writable mode;

causing, in the writable mode, a resistance value of a second variable resistive element of the plurality of variable resistive elements to change to a second value, wherein the second variable resistive element corresponds to write data, and the second value is smaller than the initial value; and controlling transition of the memory module from the writable mode to the read only mode based on the change of the resistance value of the second variable resistive element.

* * * * *